United States Patent
Ferguson et al.

(10) Patent No.: US 9,354,319 B2
(45) Date of Patent: May 31, 2016

(54) AMBIGUITY WINDOWING IN COMMUNICATIONS AMONG GLOBAL NAVIGATION SYSTEM SATELLITE RECEIVERS

(71) Applicant: Trimble Navigation Limited, Sunnyvale, CA (US)

(72) Inventors: Kendall Ferguson, Stafford, VA (US); Benjamin W. Remondi, Dickerson, MD (US); Michael Albright, Manassas, VA (US)

(73) Assignee: Trimble Navigation Limited, Sunnyvale, CA (US)

(*) Notice: Subject to any disclaimer, the term of this patent is extended or adjusted under 35 U.S.C. 154(b) by 624 days.

(21) Appl. No.: 13/784,547

(22) Filed: Mar. 4, 2013

(65) Prior Publication Data

US 2014/0062776 A1  Mar. 6, 2014

Related U.S. Application Data

(63) Continuation-in-part of application No. 12/389,677, filed on Feb. 20, 2009, now Pat. No. 8,456,359.

(51) Int. Cl.
| | |
|---|---|
| *G01S 19/04* | (2010.01) |
| *G01S 19/03* | (2010.01) |
| *G01S 19/05* | (2010.01) |
| *G01S 19/07* | (2010.01) |
| *G01S 19/41* | (2010.01) |
| *G01S 19/43* | (2010.01) |
| *H03M 7/30* | (2006.01) |
| *H03M 13/09* | (2006.01) |

(52) U.S. Cl.
CPC ............ *G01S 19/03* (2013.01); *G01S 19/04* (2013.01); *G01S 19/05* (2013.01); *G01S 19/07* (2013.01); *G01S 19/41* (2013.01); *G01S 19/43* (2013.01); *H03M 7/30* (2013.01); *H03M 13/09* (2013.01)

(58) Field of Classification Search
CPC ......... G01S 19/03; G01S 19/04; G01S 19/05; G01S 19/07; G01S 19/41; G01S 19/43; H03M 7/30; H03M 13/09
USPC ...................................... 342/357.41
See application file for complete search history.

(56) References Cited

U.S. PATENT DOCUMENTS

| | | | |
|---|---|---|---|
| 5,034,965 A | * | 7/1991 | Kato ............... H03M 7/3055 341/76 |
| 5,323,322 A | | 6/1994 | Mueller et al. |

(Continued)

OTHER PUBLICATIONS

Non-Final Office Action of Jul. 11, 2011 for U.S. Appl. No. 12/389,677, 9 pages.

(Continued)

*Primary Examiner* — Frank J McGue
(74) *Attorney, Agent, or Firm* — Kilpatrick Townsend & Stockton LLP

(57) ABSTRACT

A method of communicating corrections for information related to satellite signals among global navigation satellite system (GNSS) receivers is described. The method includes at a first GNSS device determining a component of position of a satellite. The component is then divided by a first value to thereby obtain an integer value and a remainder value, and the only the remainder value is transmitted from the first GNSS device to the second GNSS device. Knowing the first value, the second GNSS device calculates the component of position.

21 Claims, 14 Drawing Sheets

(56) References Cited

U.S. PATENT DOCUMENTS

| | | | |
|---|---|---|---|
| 5,392,037 A * | 2/1995 | Kato | H03M 13/00 341/67 |
| 5,877,725 A | 3/1999 | Kalafus | |
| 6,122,671 A | 9/2000 | Farrar et al. | |
| 6,415,229 B1 * | 7/2002 | Diekhans | G01S 19/41 342/357.24 |
| 6,429,808 B1 | 8/2002 | King et al. | |
| 6,429,811 B1 | 8/2002 | Zhao et al. | |
| 6,434,165 B1 * | 8/2002 | Sherer | H04L 1/0061 370/465 |
| 6,826,476 B2 | 11/2004 | Ahlbrecht et al. | |
| 7,020,555 B1 | 3/2006 | Janky et al. | |
| 7,089,113 B1 | 8/2006 | Janky et al. | |
| 7,158,885 B1 | 1/2007 | Janky et al. | |
| 7,580,794 B2 | 8/2009 | Janky et al. | |
| 7,623,067 B2 | 11/2009 | Raman et al. | |
| 7,782,254 B2 | 8/2010 | Pitt et al. | |
| 7,825,855 B1 | 11/2010 | Nicholson | |
| 2002/0145545 A1 * | 10/2002 | Brown | H03M 7/40 341/50 |
| 2005/0001763 A1 | 1/2005 | Hans et al. | |
| 2005/0146461 A1 | 7/2005 | Pande et al. | |
| 2006/0068700 A1 | 3/2006 | Habaguchi et al. | |
| 2008/0036655 A1 | 2/2008 | Pitt et al. | |
| 2009/0179792 A1 * | 7/2009 | Remondi | G01S 19/05 342/357.42 |
| 2009/0179793 A1 * | 7/2009 | Remondi | G01S 19/41 342/357.24 |
| 2009/0195446 A1 | 8/2009 | Liao et al. | |
| 2010/0085253 A1 | 4/2010 | Ferguson et al. | |
| 2010/0231448 A1 | 9/2010 | Harper | |

OTHER PUBLICATIONS

Final Office Action of Oct. 6, 2011 for U.S. Appl. No. 12/389,677, 10 pages.
Non-Final Office Action of Mar. 6, 2012 for U.S. Appl. No. 12/389,677, 12 pages.
Final Office Action of Oct. 5, 2012 for U.S. Appl. No. 12/389,677, 10 pages.
Notice of Allowance of Feb. 1, 2013 for U.S. Appl. No. 12/389,677, 8 pages.

* cited by examiner

Bits: 0 1 2 3 4 5 6 7 8 9 10 11 12 13 14 15 16 17 18 19 20 21 22 23 24 25 26 27 28 29 30 31
| Byte #0 | Byte #1 | Byte #2 | Byte #3 |
Figure 4. Bit/Byte Ordering
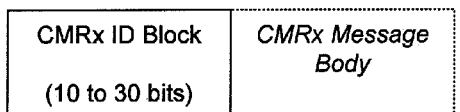
Figure 5. CMRx Message General Form
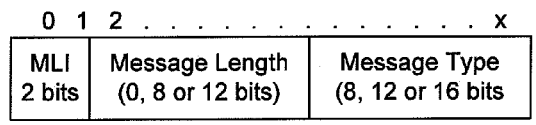
Figure 6. CMRx Message ID Block
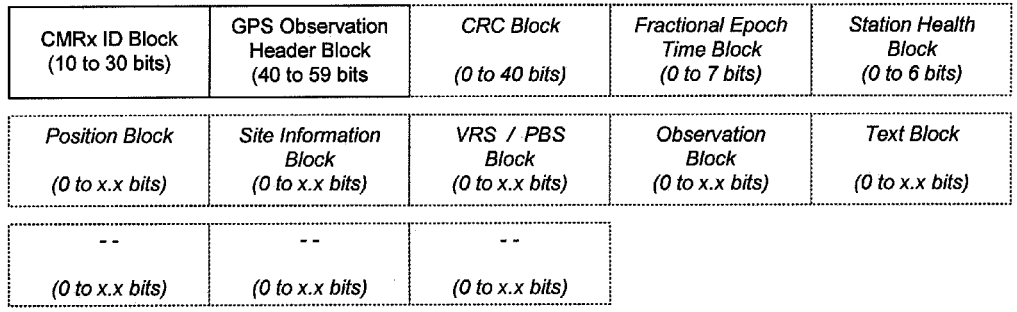
Figure 7. CMRx GPS Observation Data Block

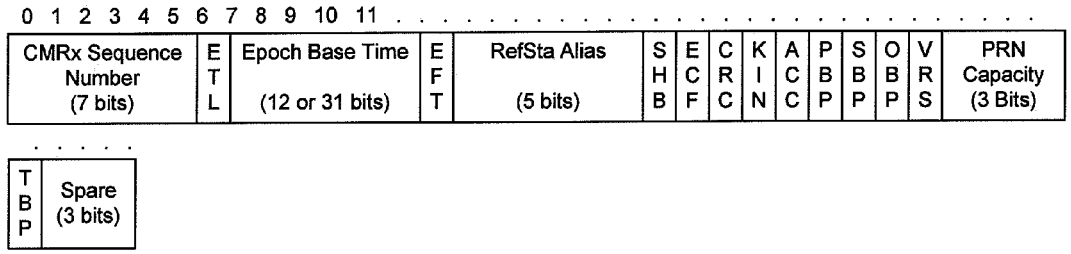
Figure 8. CMRx GPS Observation Header Block
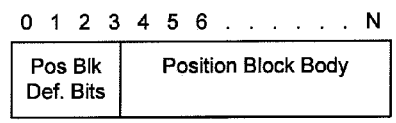
Figure 9. Position Block
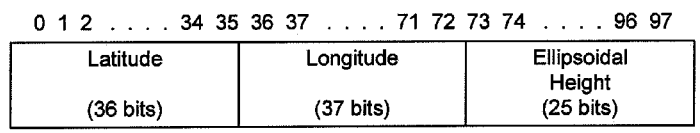
Figure 10. Unsegmented Position Construct
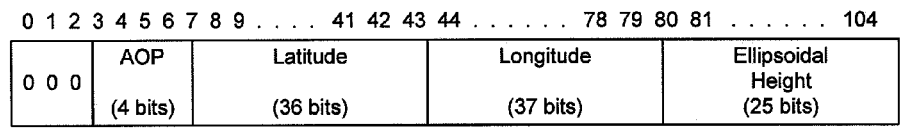
Figure 11. Full Position Message

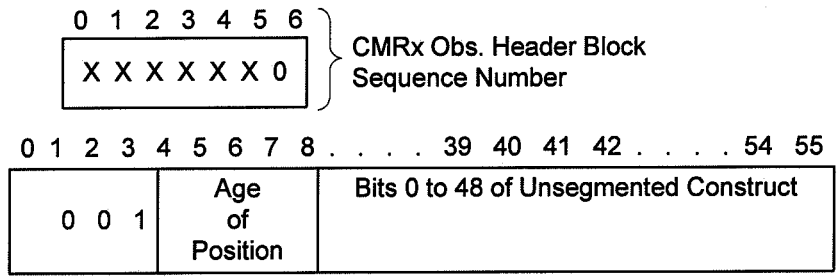
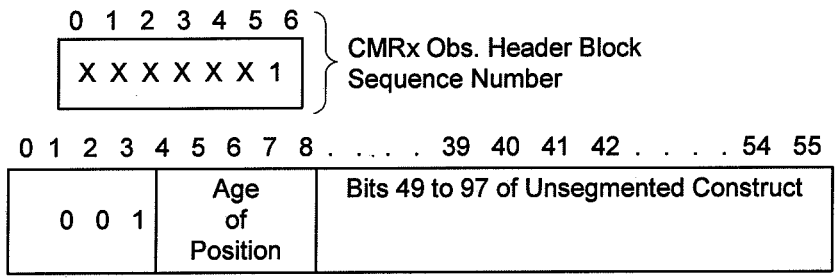
Figure 12. Position Message Sent Over 2 Epochs
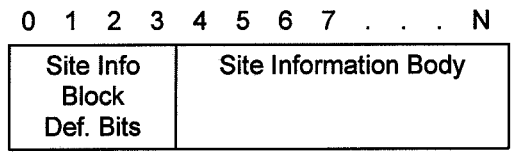
Figure 13. Site Information Block
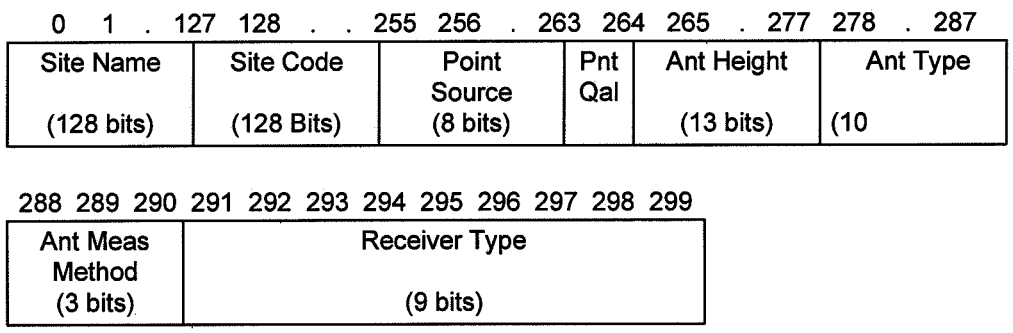
Figure 14. Unsegmented Site Information Construct

| 0 1 2 | 3 4 5 6 | 7 8 . 134 | 135 . . 262 | 263 . 270 | 271 | 272 . 284 | 285 . 294 |
|---|---|---|---|---|---|---|---|
| 0 0 0 | Age of Site Information (4 bits) | Site Name (128 bits) | Site Code (128 Bits) | Point Source (8 bits) | Pnt Qal | Ant Height (13 bits) | Ant Type (10 |

| 295 296 297 | 298 299 300 301 302 303 304 305 306 |
|---|---|
| Ant Meas Method (3 bits) | Receiver Type (9 bits) |

Figure 15. Site Information Per Message

Segment #0: (Site Information Block is 82 bits in message)

```
0 1 2 3 4 5 6
X X X X X 0 0    } CMRx Obs. Header Block
                   Sequence Number
```

| 0 1 2 | 3 4 5 6 7 . . . . . . . . . . . . 80 81 |
|---|---|
| 0 1 0 | Age of Site Info | Bits 0 to 74 of Unsegmented Construct |

Figure 16. One Segment of the Site Information Trickled over Four Epochs

| 0 | 1 | . . . . . . . . . . . . . . . . N |
|---|---|---|
| PBS Prs bit | VRS Prs bit | PBS Block (0 to x.x bits) | VRS Network Residuals Block (0 to x.x bits) |

Figure 17. VRS/PBS Block

| 0 1 2 3 4 5 6 | . . . . 39 40 41 | 42 . . . . 76 77 78 | 79 . . . 101 102 |
|---|---|---|---|
| PBS Alias (5 bits) | Latitude (36 bits) | Longitude (37 bits) | Ellipsoidal Height (25 bits) |

Figure 18. Unsegmented PBS Construct

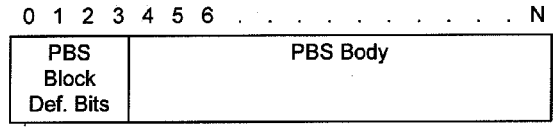
Figure 19. PBS Block
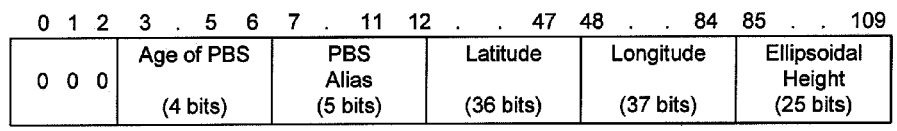
Figure 20. Full PBS Position per Message
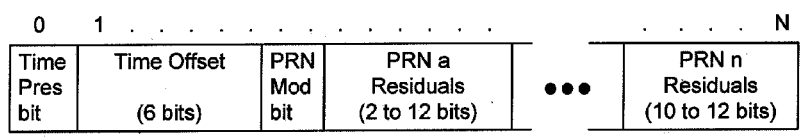
Figure 21. VRS Network Residuals Block
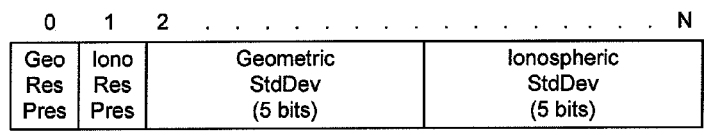
Figure 22. Per Satellite VRS Network Residuals
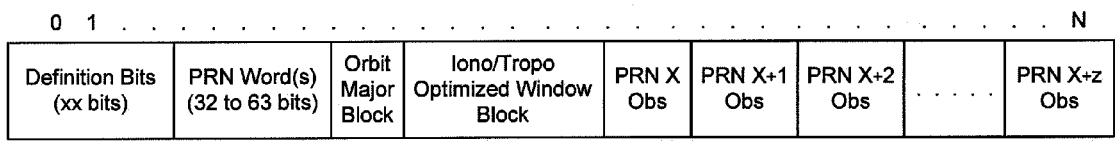
Figure 23. Observation Block

```
0  1  2  3  4  5  6  7  8  9  10 . . . . . . . . . . . . . . . .
```

| Compress Level | | Ext Cmpr Mode | Observation Suite | | | | | | | | Supp. Obs. Tracking Information |
|---|---|---|---|---|---|---|---|---|---|---|---|
| Code (3 bits) | Carrier (3 bits) | | Ref Code | R P | L1 CA | L2 e | L1 e | L2c | L5 | L1c | |

```
. . . . . . . . . . . . . . . . . N
```

| C N R | O R B | Sv Cnt 2-bit | SVPRN (5 to 7 bits) | C T C | Master CTC (0 or 6 bits) |
|---|---|---|---|---|---|

Figure 24. Observation Block Definition Bits

| 0 | 1 | . . . . . . . . . . . . . . . . . . . . . . . . . . . . . . . . . . . . . . . . . . . . N |
|---|---|---|

| XYZ Prs bit | CLK Prs bit | XYZ Ambiguity Window (4 bits) | XYZs Precision (4 bits) | CLK Src flg | CLK Ambiguity (4 bits) | CLK Precision (4 bits) |
|---|---|---|---|---|---|---|

Figure 26. Orbits Major Data

| Iono/Tropo Optimized Window Block | PRN X Data | PRN X+1 Data | PRN X+2 Data | . . . . . . . . . . | PRN X+z Data |
|---|---|---|---|---|---|

Figure 27. Satellite Observation Data

| SV Orbit Minor Data | Minor Obs Present | Slip Bit | Ref Mnr CTC | Ref CNR Data | Ref Code Obs | Ref Carr Obs | X1 Mnr CTC | X1 CNR Data | X1 Code Obs | X1 Carr Obs | ••• |
|---|---|---|---|---|---|---|---|---|---|---|---|

| ••• | Xn Mnr CTC | Xn CNR Data | Xn Code Obs | Xn Carr Obs |
|---|---|---|---|---|

Figure 28. Single Satellite Observation Data

| 0 | 1 | . . . . . . . . . . . . . . . . . . . . . . . . . . . . . . . |
|---|---|---|

| Val flg bit | God Sv bit | BP bit | XYZ Quality (3 bits) | XYZ Values (variable) | Clk Quality (3 bits) | Clock Error (Variable) | Wide-Lane Bias (7 bits) | Iono-Free Bias (6 bits) |
|---|---|---|---|---|---|---|---|---|

| . . . . . . . . . N | |
|---|---|
| CLK Jmp Flg | Seconds Since Jump (6 bits) |

Figure 29. Iono/Tropo Optimized Window Block

| Vertical Ionosphere Index | Ref Code Index | Ref Carr Index | X1 Code Index | X1 Carr Index | ••• | Xn Code Index | Xn Carr Index |
|---|---|---|---|---|---|---|---|

Figure 30. Iono/Tropo Optimized Window Block

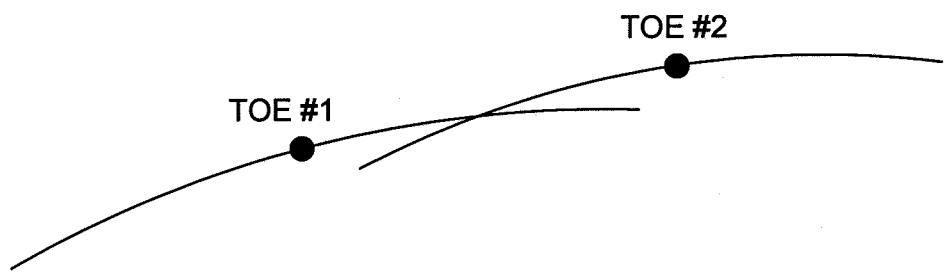
Figure 31. Time of Ephemeris
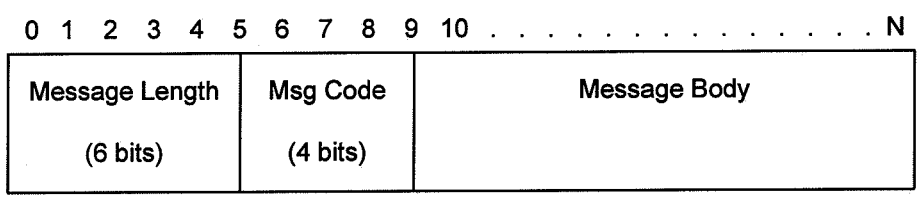
Figure 32. Text Message Block

AMBIGUITY WINDOWING IN COMMUNICATIONS AMONG GLOBAL NAVIGATION SYSTEM SATELLITE RECEIVERS

REFERENCE TO RELATED APPLICATION

This application is a continuation-in-part of earlier filed U.S. patent application Ser. No. 12/389,677, filed Feb. 20, 2009, and entitled: "Continuous Tracking Counter for Enabling Cycle-Slip Free Messages in a Network of Global Navigation System Satellite Receivers."

BACKGROUND OF THE INVENTION

This invention relates to communication of data among global navigation satellite system ("GNSS") receivers, virtual reference stations, data processing centers, rovers, and other apparatus, and in particular to techniques for transmitting that data in a format which conserves use of bandwidth available for the transmission of the data. Herein we describe the invention in terms of use with the US global positioning satellite system ("GPS"), but we use the terms GNSS and GPS interchangeably to refer to any global navigation satellite system, whether based on satellites provided by the United States, or by other countries, e.g. GLONASS (Russia), Galileo (European Union), GAGAN (India) etc. As will be apparent, the technology described herein can be applied to use with any GNSS system, including GPS.

A technique known as real time kinematic (RTK) positioning is now commonly used to determine the position of a roving GNSS receiver relative to a known reference point. This method requires that data from a reference receiver, or from a reference station network, be transmitted to the roving GNSS receiver in real time. The RTK technique is routinely used for surveying, mapping, and precise positioning applications in mining, construction, and many other industries. In RTK positioning, a set of GNSS receivers track GNSS signals from a constellation of satellites. In a typical application, a reference (or base) station is established at a known location such as a previously surveyed location, a benchmark, or other desired position. That reference station then provides GNSS measurements to a rover (or remote) station to enable the rover station to calculate its precise location relative to a previously determined reference point. The rover station, often carried by a person as a backpack or mounted on a moving machine, is then able to move about an area and use signals from the reference station to precisely locate desired positions within the area. Communication between the reference station and the rover is provided over a data link, for example, using private licensed radio, unlicensed radio, satellite, cellular, or other communication technology. At the rover the data is received and used for processing and/or display to the user of the system.

Allocation of radio, cellular, or other wireless frequency bands is commonly performed by a government organization. In the United States, the Federal Communications Commission determines appropriate allocation of the frequency spectrum, and similar organizations perform that service in other countries. Increasing demands for frequency allocation for new radio, cellular, and satellite applications, however, have made available bandwidth scarce. At the same time, the amount of data to be communicated among GNSS receivers continues to increase. It has therefore become more and more desirable to communicate that data using as little bandwidth as possible.

One prior art technique for communicating data among GNSS receivers was developed by the assignee of this invention, Trimble Navigation, and is commonly known as the "Compact Measurement Record" (CMR). A description of that technique can be found in N. Talbot, "Compact Data Transmission Standard for High-Precision GPS," Proceedings of ION-GPS-96, Kansas City, Mo., 861-871 (1996). Although this format is now in widespread use, the format still requires a minimum data rate that will increase as more satellites are included in the available constellation of satellites desirable for use. To provide the service needed in real time means that more bandwidth will be required, and that bandwidth may not be available via the current crop of communications services. Most communications services have a fixed bandwidth available that cannot be exceeded. Accordingly, the present invention is directed to a technique for further reducing the amount of information required to be sent among GNSS receivers when bandwidth is at a premium, cannot be expanded, or in situations such as satellite transponders where expanded bandwidth is available only at higher cost.

SUMMARY OF THE INVENTION

We have developed a technique for communicating data among GNSS processing entities or other global positioning satellite equipment. We describe that technique in terms of the U.S. GPS system. In communicating such data, for example, a user of a GPS system may have a reference station situated at a known location which is to receive data from or transmit data to a "rover." A rover may consist of a movable station, for example, as used by a surveyor, or other similar use. Herein we use reference station and base station interchangeably, and we use remote station and rover interchangeably.

The communications technique is referred to herein as a "Compressed Measurement Record-Extended" (often herein "CMRx"). CMRx provides numerous benefits, including high compression of raw GPS observation data. By sending what we term "ambiguous observation data" rather than complete data from an observation, the amount of data required to be sent is reduced, allowing for more data to be sent for a given data rate, thereby permitting service growth in bandwidth constrained data services environments. The "ambiguous" form, however, is known well enough by the recipient as to allow full reconstruction of the observation data. CMRx does not compress data as the word "compress" is normally understood, e.g. in the context of a "zip" file sent to a computer. Rather the compression, or reduction in amount of data, is achieved by sending only that GPS data which the recipient "needs." (Of course that data may itself be further compressed in the mathematical sense, e.g., by being placed into a .zip file.) At the sender a deconstruction of GPS code and carrier observations using knowledge of the signal structure and constellation geometry, together with simplifications of atmospheric models, allows removal from the observation data of that information which can be implicitly understood or recreated by the recipient. This enables only the necessary information to be packed for transmission to the recipient.

Knowledge common to the sender and recipient include: knowledge that the observed orbits of the satellites will be nearly the same, an algorithm for removing and reconstructing most of the signal delay caused by the ionosphere to reduce the range of observation sizes, an algorithm for removing and reconstructing most of the signal delay caused by the troposphere with a simplified model requiring minimal calculation, truncation of code with a windowing scheme, truncation of carrier using a windowing scheme based on the reconstructed code value, variable window sizing for code and carrier, and a two-level counter to signal periods with no cycle slip. For example, two GPS receivers communicating with each other will know that the data being exchanged between them is data from GPS satellites and that the recipient will already have information about the satellites, their orbits, approximate distances, etc.

The main objective of CMRx is to reduce the number of bits required to carry GNSS observation data and information. In addition CMRx provides the recipient with a compressed message containing enough information so as to allow it to be decompressed to determine the content of the original source observation data.

A further benefit is homogeneous use of available bandwidth. Many targeted applications of CMRx utilize communication media which is tightly constrained as to bandwidth. Many GNSS systems support formats publicly available have largely varying messages and message sizes. Some formats for example, may support a reduced observation format, but require a large extraneous message, for example, as with broadcast orbits or reference position/frame information. When such information is sent, a surge in the amount of data is necessary, either requiring more time to transmit, or more bandwidth to get the data thru in a specified time period, or the observation data is not sent at the same time. CMRx balances the bandwidth utilization by "trickling" this extraneous information in small short groups of bits, spread over a longer time period, and thus utilizing the bandwidth more consistently.

The CMRx data also avoids time dependencies where possible. To reduce time dependencies, CMRx messages allow the recipient to fully reconstruct the raw observation data without temporal dependencies. For example, CMRx observation data do not contain rates, nor values that are dependent upon previous or later CMRx epoch data.

A further advantage of the invention is that CMRx includes reference station position and coordinate frame information. This information can also be "trickled" over several CMRx messages to smooth bandwidth utilization over time.

CMRx supports moving platform data senders, for example, moving reference stations and rovers transmitting raw observations to other processing sites. The CMRx messaging system also includes optional orbital information, to guarantee that the recipient of CMRx messages has access to satellite orbital information. When integrity processes are involved, end users use of CMRx sent orbital data ensures use of integrity monitored data, or precise orbital information.

The size of CMRx messages is further reduced by removing and/or sending atmospheric data, for example, data about the ionosphere, but also in an ambiguous, abbreviated format. Additionally, the CMRx message format is capable of extension to other satellite observation types, e.g. GLONASS satellites, and can support other models such as the NOAA Troposphere model. CMRx allows one to tailor the format of the data to needs of the system designers and integrators, enabling them to select the configurations that impact the sizes of the elements and the options to enable compression that best meet the needs of their system. Because the format is self-describing, the recipients of CMRx messages can understand the entire content of the messages being sent.

BRIEF DESCRIPTION OF THE DRAWINGS

FIG. 4 is a diagram illustrating Bit/Byte Ordering;

FIG. 5 depicts the format of the CMRx Message;

FIG. 6 depicts the format of the CMRx Message ID Block;

FIG. 7 depicts the format of the CMRx GPS Observation Data Block;

FIG. 8 depicts the format of the CMRx GPS Observation Header Block;

FIG. 9 depicts the format of the Position Block;

FIG. 10 depicts the format of the Unsegmented Position Construct;

FIG. 11 depicts the format of the Full Position Message;

FIG. 12 depicts the format of the Position Message Sent Over 2 Epochs;

FIG. 13 depicts the format of the Site Information Block;

FIG. 14 depicts the format of the Unsegmented Site Information Construct;

FIG. 15 depicts the format of the Site Information Per Epoch;

FIG. 16 depicts the format of the One Segment of the Site Information Trickled over Four Epochs;

FIG. 17 depicts the format of the VRS/PBS Block;

FIG. 18 depicts the format of the Unsegmented PBS Construct;

FIG. 19 depicts the format of the PBS Block;

FIG. 20 depicts the format of the Full PBS Per Epoch;

FIG. 21 depicts the format of the VRS Network Residuals Block

FIG. 22 depicts the format of the Per Satellite VRS Network Residuals

FIG. 23 depicts the format of the Observation Block;

FIG. 24 depicts the format of the Observation Block Definition Bits;

FIG. 26 depicts the format of the Orbits Major Data;

FIG. 27 depicts the format of the Satellite Observation Data;

FIG. 28 depicts the format of a Single Satellite Observation Data;

FIG. 29 depicts the format of the Orbits Minor Data;

FIG. 30 depicts the format of an Iono/Tropo Window Block;

FIG. 31 depicts the Time of Ephemeris;

FIG. 32 depicts the format of a Text Message Block;

DETAILED DESCRIPTION OF THE PREFERRED EMBODIMENTS

Introduction

This invention relates to global navigation satellite systems, and in particular to the transmission of information among global navigation satellite system processing apparatus such as receivers, virtual reference stations, data processing centers, and rovers. The recipients of positioning information from satellites may wish to communicate that information to other stations to provide information about the relative positions of the stations.

A typical application where a preferred embodiment of the invention may be employed is at an airport. A GPS base station can be situated at an airport. Incoming aircraft to the airport can use conventional GPS technology to fly to that known location. That location data, however, typically is not sufficiently accurate to position an aircraft in the center of a runway for an approach and landing. Differential GPS technology includes communication between a remote station on the aircraft and the fixed station at the airport. The data communicated can enable the remote station on the aircraft to know the aircraft position with regard to the centerline of a runway with sufficient accuracy to enable the aircraft to position itself on that centerline for a landing. Perhaps not surprisingly, there are similar applications in many other industries. For example at a construction site a base station can be situated at a known location, for example, at a benchmark. A remote station in the backpack of a surveyor on the site provides the surveyor with position information, enabling staking out desired locations on the site with high accuracy.

Figure 1:
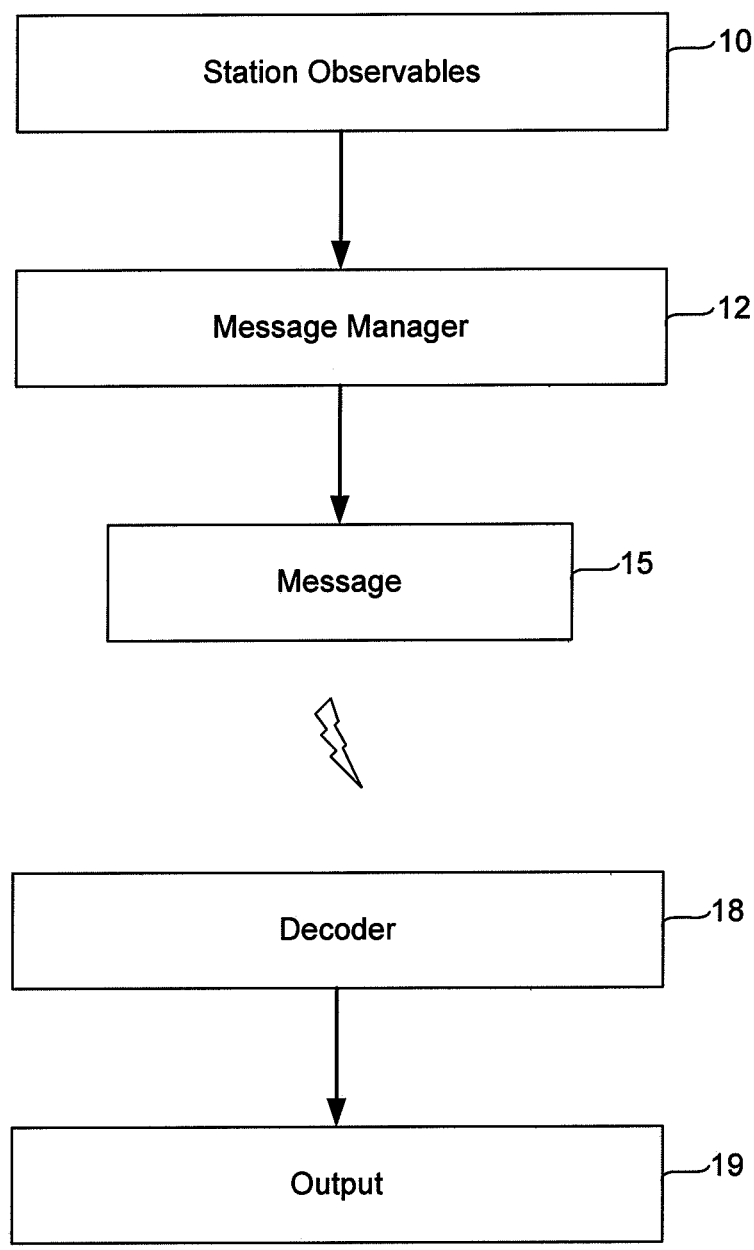
FIG. 1 illustrates a block diagram of one implementation of the invention.

FIG. 1 is a flow diagram illustrating typical operation of a system implementing a preferred embodiment of the invention. As depicted, GPS data received at a GPS station, herein "observables," are collected. The data typically includes both code phase and carrier phase information.

A GPS receiver determines the travel time of a signal from a satellite by comparing the "pseudo random code" the receiver generates with code transmitted in the signal from the satellite. The receiver compares its own generated code with the code from the satellite, shifting its code later and later in time until it matches the code from the satellite. The travel time corresponds to the time difference between the satellite and the ground location. Thus the travel time of the signal from one satellite locates the receiving station on a set of points equidistant from the satellite. By using signals from at least four satellites, an X, Y, and Z position can be determined, along with the error in the local receiver clock. These coordinates can be transformed into latitude, longitude, and altitude.

The time period of the pseudo random code, however, is sufficiently long that the location of the receiver can only be determined with a precision of many meters. More advanced GPS receivers start with the pseudo random code, but then use additional measurements based on the carrier frequency for that code. This carrier frequency is higher, making its wavelength shorter, and therefore enabling more accurate determination of position. The receiver, however, can only measure the relative phase of a single wavelength. Assuming there is no cycle slip, the receiver thus can measure the change in range. (A cycle slip is a discontinuity of an integer number of cycles in the measured carrier phase resulting from a temporary loss-of-lock in the carrier tracking loop of a GPS receiver. A cycle slip corrupts the carrier phase measurement, causing the unknown ambiguity value to be different after the cycle slip compared with its value before the slip. The cycle slip is "repaired" (the unknown number of "missing" cycles determined and the carrier observation subsequent to the cycle slip all corrected by this amount) before the phase data is processed as observables data for use by the GPS receiver.) Each successive measurement then is missing the same initial ambiguity since tracking began. To make use of carrier phase measurements, the receiver must estimate the number of wavelengths between its antenna and the satellite. The total path length thus consists of an integer number of wavelengths, plus the fractional wavelength determined by the GNSS/GPS receiver. The unknown here is referred to as the "integer ambiguity," or more generally, the "ambiguity."

In a preferred embodiment of this invention, as shown by FIG. 1, the code phase information and the carrier phase information (if available) are considered to be the station observables 10. As mentioned above, typically the station will be a GPS reference station, however, other stations may also be used. This data, as well as other information known to the receiver, are provided to a message manager 12. The message manager 12 processes the data to eliminate information already known between the sender and receiver, and then compresses the resulting data. The processing and compression are described in greater detail below. In essence, however, the data is processed to eliminate information which is commonly known to the sender and the recipient of the data. For example, both the sender and the recipient will be aware that the data being sent is GNSS-related data, in other words, that its content is based on signals from satellites having known orbits, whose satellite signals are available at both the reference station and the rover. For example, in a networked group of stations, one station will know, at least approximately, the location of the reference station and therefore will know the orbits of the satellites observed by the sending station. Once the data is processed and packed, it is then formatted into a message 15 for transmission to a remote location, typically a roving GNSS receiver station mounted on a backpack or a piece of movable equipment. Not sending the unnecessary information makes the messages smaller, thereby taking less time, which enables the available bandwidth to be used for additional data transmission.

The message manager 12 is also responsible for deciding what "trickle levels" and position output rates are required. Trickled messages are messages where data is segmented into shorter pieces which are sent sequentially ("trickled") over a longer time period than would be needed were they sent in an uninterrupted manner. A "trickled" message will span more than one epoch of RTK information from the reference receiver, CMRx sending device, or network. A complete suite of data is trickled over several epochs, and typically consists of information that is repeated or less essential to real-time functioning. For example, reference station position is information that is essential to RTK start-up. Assuming a static base station, once the position is received, the same position is used for processing from that point forward. Thus the position does not have to be received as often. The format enables the trickling of such position information over several epochs. It does this in a manner which allows a recipient with almanac information to know whether the recipient needs to receive the full suite of trickled information before it can perform a quick start with an almanac position. The manager 12 also will alter the encoding options as needed to utilize available bandwidth, and/or limit utilization. The manager 12 will limit any data that are to be encoded. For example, if limiting the message size is achieved by limiting the number of satellites, the manager provides the encoding process with epoch data containing only those satellites to be packed. It may also, depending upon the specific application needs, change configuration options to adjust compression modes and/or levels so as to alter the sizes of elements packed into the message. Because CMRx is self-describing, the CMRx decoder is able to understand the change immediately (on-the-fly).

If the reference or base station is fixed, then a further reduction in the amount of information transmitted from it can be achieved. Because the station is fixed, once the rover or remote station knows the position of the base station, it is unnecessary for that information to be retransmitted until the station is moved. This knowledge allows a reduction in the data to be transmitted using a variety of techniques. In one approach an original message from the base station adds a bit to the message to designate that the station is fixed. If the station is later moved, the bit changes state, or a flag is used to designate the change. In an alternative approach, a mailbox is established which includes the base station location. The remote station then receives information from the base station indicating if it should now again check the mailbox to obtain the base station location information. All of this information can be trickled to the remote station in the manner described below.

The concept of the ambiguity window discussed herein can also be applied to coordinate changes in location in moving a GNSS base station with regard to a remote station. In this circumstance the remote station needs to know the current position of the base station, as the base station is moved. One possible approach is to send the difference in position from the position at the previous transmission. This approach, however, is vulnerable to a loss of signal. For example, assume that a first message transmits the difference in location between an original location and the location at the time of the first message, and assume that a second message transmits the difference in location between the location at the time of the first message and the location at the time of the second message. If for some reason the first message is never received, the remote station will have the wrong information about the new position of the base station.

We overcome this disadvantage by sending the change in position with regard to an earlier message which has been sent within an earlier specified time interval. For example, assume the earlier specified time interval is 60 seconds. If the remote station has received any messages from the base station in the last 60 seconds, it knows that the present message is providing the change in position with regard to that previous message. Therefore the remote station knows the difference in position it just received can be relied upon as accurately reflecting the change in position of the base station. On the other hand, if the remote session has not received any messages from the base station in the last 60 seconds, then it knows that a message has been missed, and that it should not rely upon the received information as to a change in position.

Returning to FIG. 1, at the remote location, a decoder 18 receives the information and decodes it, ultimately providing it as output information 19 for use by a computer, GPS station, or other desired apparatus. Decoder 18 does not perform frame recognition, i.e. it does not identify the bits and bytes that make up a CMRx message. The CMRx messages are wrapped within other protocols, e.g. TrimComm available from Trimble Navigation (assignee of this invention), further enabling keeping the message size small.

Decoder 18, however, can recognize the end of an epoch. The manager 12 is responsible for any timeouts used to establish the end of a wait period for receiving a complete epoch and signals the end of an epoch via an API call to the CMRx Decoder 18. When an end of an epoch is signaled either through the automatic methods or by outside manager call, decoder 18 returns what it knows about the epoch at that moment.

Figure 2:
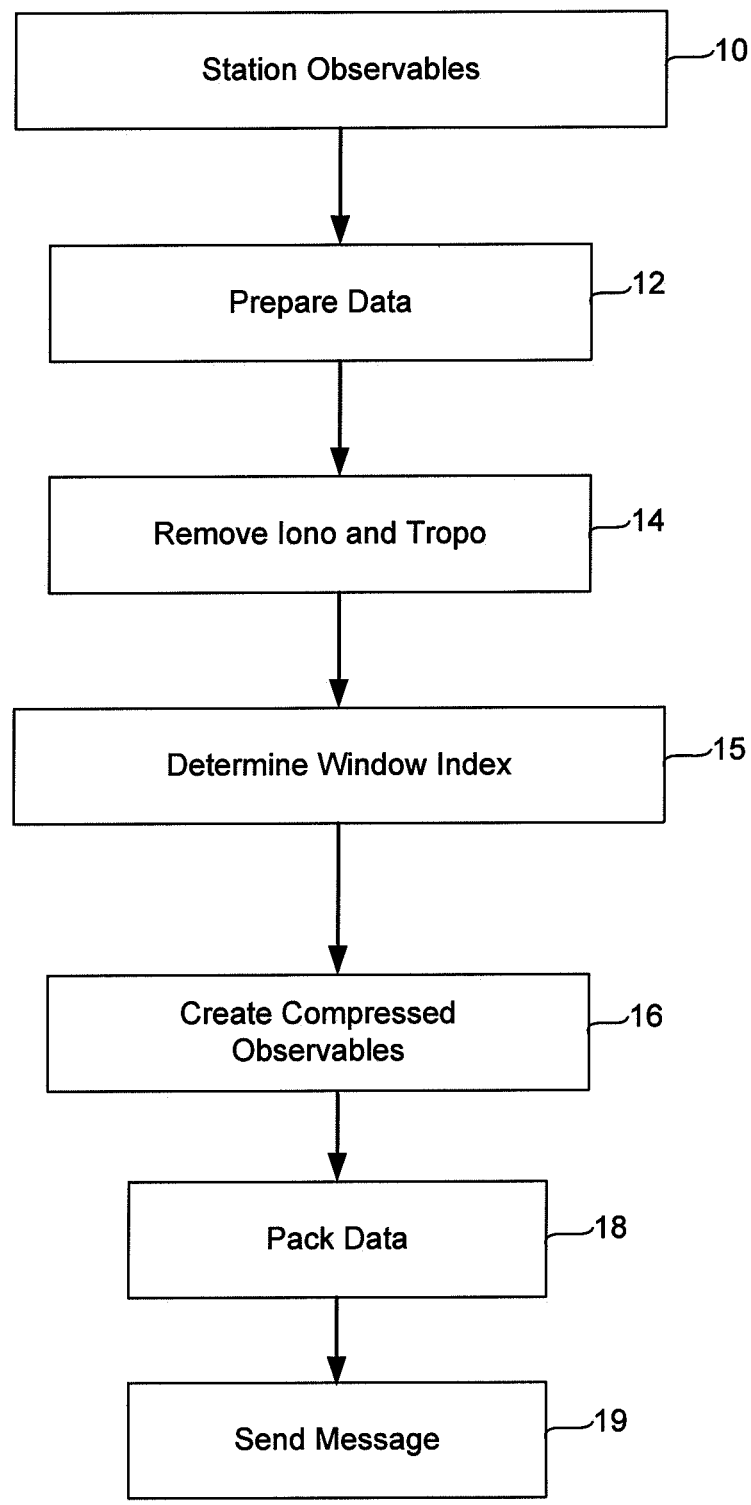
FIG. 2 is a flow diagram of the operation of the message manager.

FIG. 2 is a more detailed diagram of the operation of the message manager 12. As shown there, the reference station observables 10 are first analyzed to prepare the data at step 12. In this preparation step, incomplete or bad data is discarded, resulting in a range measurement between a ground station and a satellite. That range measurement, and if appropriate the carrier data, is then corrected for ionosphere and troposphere effects, as shown by step 14. Next, at step 15, a window index, as will be explained in more detail below (See FIG. 3) is determined. The window index allows additional compression of data. At step 16 the encoded observables are created using the window index, the corrected range measurements, and, if appropriate the carrier data. The data are then packed at step 18 and a message sent at step 19.

Figure 3:
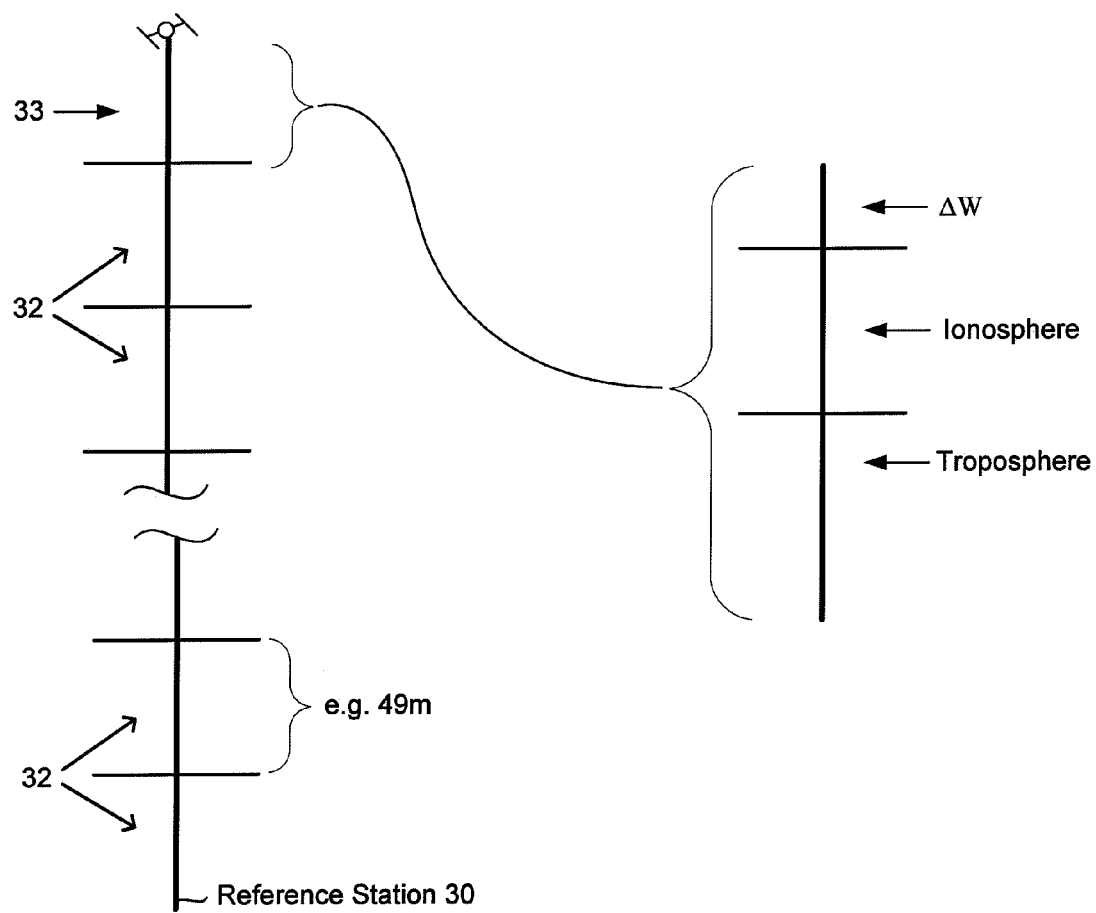
FIG. 3 is a diagram illustrating windowing.

FIG. 3 conceptually illustrates the window index as employed in CMRx. "Windowing" allows the range between the station 30 and the satellite 38 to be divided into an integral number of length segments called windows 32, for example, of 49 meter size, together with a remaining fractional window 33. The fractional window, in effect, represents the remainder of the range divided by the number of whole windows. The window size is chosen based upon the residuals and other factors, such as known maximum shifts in orbits.

Use of the window index allows the station sending the information to send just the integer number of windows and the remainder $\Delta W$, rather than the range in meters, centimeters, or other format, which would consume more bandwidth. Thus, it is only the "remainder" which requires high precision for sending to the receiving station. As shown on the right-hand side of FIG. 3, the fractional window 33 includes a distance factor "$\Delta W$" which reflects the division, together with an ionosphere correction and a troposphere correction. The manner in which these corrections are computed and transmitted, together with a more detailed explanation of the windowing approach, are each discussed below.

Bit Ordering

In the figures of this description, bit numbers are depicted with the low number as the left-most and the high bit number as the right-most. The bits on the right-side are the least-significant digits of numbers, while those to the left are the most-significant digits. Thus, CMRx messages are a bit-level compression that specifies the particular order of bits. FIG. 4 shows a contiguous ordering of both bits and bytes. These represent the storage order in CMRx messages. Numbers stored in this compressed format are stored with the most-significant bits to the left. As an example, the number 3637 stored in 13 bits, begins with a series of bits ("do not care" bits), followed by the bit pattern 0111000110101 to represent 3637.

All quantities in the CMRx format are integers. Floating point numbers are converted to an integer by scaling the floating point number and rounding to the nearest integer. When that integer number is extracted by the CMRx decoding processes, the scale factor is applied to obtain the original quantity, less some rounding amount induced by the scaling/rounding process.

Assumptions

There are assumptions made in the preferred embodiment for implementation of CMRx. These assumptions are conventional, but other assumptions may be used for implementation in any desired system. In particular, here the implementation assumes that observation data have been adjusted to a Null antenna model. The CMRx format also assumes that the data provided to it for compression is adjusted to a Null antenna model. The actual antenna used is documented in the Site Information Block described below.

CMRx also assumes that the satellite observation data provided to it for compression is adjusted to the Antenna Phase Center (APC). These APC coordinates are given in the Position Block described below. The height above the mark is contained in the Site Information Block.

The receiver clock offset is not stored as part of the CMRx Observation Data messages. This is important with respect to higher compression levels with CMRx Observation Data messages where the reference station position (to better than 50 meters) and clock offset (to better than approximately 150 ns) must be known to correctly unpack the observation data. While it is possible to add bits to the message for storage of the receiver clock offset information, we do not do so in this implementation to save bandwidth. Thus, all data provided to the CMRx Encoder is assumed to be steered to a zero receiver clock offset.

Also important is the handling of the millisecond clock jumps that occur in the satellite observation data from some GNSS receivers. CMRx encoding assumes that should a clock jump occur, that the delta code minus delta carrier remains consistent. That is, one computes a delta code by subtracting the pseudo-range (i.e., the code) for a given satellite at the previous epoch from the pseudo-range for the same satellite at the current epoch. The delta carrier phase is computed by subtracting the carrier phase for a given satellite at the previous epoch from the carrier phase for the same satellite at the current epoch. Assuming that there are no cycle-slips, the difference between the delta carrier and delta code should remain small. Some receiver's code phase observables will be affected each time a millisecond jump occurs in receiver's clock. These observables will exhibit a corresponding jump in their code phase, but not the corresponding carrier phase data (or vice versa). Hence the delta code minus the delta carrier will exhibit a jump equal in magnitude to the clock jump. This compression algorithm assumes that one "repairs" the data passed to the compression in such a way so as to keep this "delta code minus carrier" consistent: i.e., not showing these millisecond-level jumps. (The above statements are made in the case that an implementation so elects to include the extra clock offset bits, thus not requiring the observables to be zero clock steered.)

The CMRx Decoder is not a frame recognizer, although those of skill in the art will appreciate such a feature could be readily added. In the preferred implementation, the CMRx Decoder expects to be handed full messages extracted from streams or files by some other process. The CMRx Decoder then decodes those messages.

A further assumption is that all data for an epoch are transmitted before the next epoch is sent. An Epoch Continuation Flag (ECF) signals more in the same epoch to come. The CMRx Decoder declares the end of an epoch, thereby closing out any received messages which have their ECF flag set to zero upon receipt of a later epoch time. Anything received with an older epoch time is ignored.

Terminology

To assist in the understanding of the technology described herein, unless otherwise indicated, we use the terms below in the manner described below.

Encoder, Sender or Compression/Decoder, Recipient or Decompression

The terms encoder, sender or compression (and/or decoder, recipient or decompression) are often used interchangeably herein. We use the terms encoding and compression (or decoding and decompression) interchangeably. In the CMRx context, messages are created (i.e., encoded or compressed) by a sender. These messages are then sent via some medium (over some communication link, by files, or other such approaches) to a recipient which decodes or decompresses the messages. The sender can be a reference station, a rover, a network processing station such as a VRS provider, or other apparatus, while a recipient can be a reference station, a rover, other apparatus, or another processing system, e.g. a central processing center.

Frequency/Track-Types

Frequency/track-types is used to describe the various observable combinations as output from a receiver. For example, for GPS receivers that track and report L1, L2, and L5 observations, there are three independent Frequency/track-types. Many receivers are capable of tracking more than one code type on a single frequency and have carrier tracking/reporting associated with each code tracking Future L1 capable GPS receivers may be able to track L1 C/A, L1c, and L1E simultaneously. Each of these L1 signals is considered an independent frequency/track-type. A GPS receiver capable of tracking and reporting L1 C/A, L1c, L1E, L2c, L2E, and L5, is said to have 6 independent Frequency/track-types.

Major and Minor

Some elements within CMRx messages are described using the terms Major and Minor. These are used to describe elements or other data within the message that may be blocks of information, sets of bits, or a single bit. Within CMRx messages there are elements that contain information that refers to, or is applied toward, a collective suite of information. For example, if GPS Observations contain L1 C/A data, one flag can be used to indicate that there is L1 C/A data present for every GPS satellite. Such a flag is an example of Major data. Some information may expand on Major data by providing more detail on an individual basis. For example, Major bits may indicate that L2C data is present in an epoch and that it will be indicated on an individual satellite basis. Then with the data of each GPS satellite there is a Minor bit which indicates whether or not that data is present for that satellite.

Nominal Worst Case

We use "worst case" to refer to the most extreme conditions to which a system may be subjected. We use nominal worst case to refer to those extreme conditions which we expect the system must handle. For example, under true worst case conditions of ionosphere it is expected that GNSS receivers will not be able to even track satellites. CMRx is intended to handle data collected under nominal worst case ionospheric conditions, which in this case, means that the GNSS receiver likely will experience many tracking losses, yet be able to track some satellites.

Packet Loss, Message Corruption, Message Loss and Communications Outages

These terms are used almost interchangeably. They are intended to convey the notion that data communicated over a transmission medium may not reach the destination, or if it does reach the destination likely will be corrupted. If a message is lost it will not be decoded. If a frame recognizer receives a CMRx message and the frame recognizer message quality check mechanisms detect a corrupted message, it will not be provided to the CMRx decoder.

Roll, Rolled, or Rolling (Connoting Satellite Data)

Certain information, in certain modes, is considered to be "rolled" through successive CMRx Messages. For example, there exist carrier-to-noise (CNR) inclusion modes where 1, 4, or 8 satellites will have CNR data per message. An epoch of data may have more than these numbers of satellites. When this occurs, the CMRx Encoder has mechanisms to identify the first satellite, and count of satellites that are included in the message. For later epochs, successive satellite data will be included. In this way, the data are said to be "rolled" with successive CMRx Messages.

Trickling

As mentioned above, some pieces of information stored in CMRx messages are said to be segmented to allow "trickling of data over several messages", and often over several epochs of data. This enables communicating information that may be less essential than observation data. For example, it can be useful to provide reference station position information to aid rovers in RTK processing of GNSS data. Often such information must be sent continuously to allow rovers connecting with the message broadcast, at a later time after the sender started, to get the necessary information. A CMRx Encoder takes the entire suite of this information and breaks it up into a set of segments. One segment is then sent with each one of different messages, e.g. one segment per epoch. When this occurs, we say the information was "trickled." Trickling facilitates more consistent use of the available bandwidth. In nearly all cases, the segmentation is optional. Under one implementation of CMRx, segmentation and trickling is not permitted for GNSS code and carrier observation data. Trickling can be used, for example, when sending position data, site information, and VRS/PBS information. We call the set of messages required to trickle all of the segments a "segment suite." The period required to send the segment suite is referred to as a "segment suite cycle."

CMRx Messages

CMRx messages have the general form shown in FIG. 5. CMRx groups information into blocks. Many of these blocks are optional and are present only when indicated by flags in higher-level blocks (or blocks that precede the block of interest). Some flags within blocks are used to describe data elements that may or may not be in that data block. As an example, in the GPS Observation Data message there is a flag in the Header Block of that message. This flag indicates whether GPS Satellite Observations are present in the message (i.e., whether or not the Observation Data Block is present). Within the Observation Data Block, however, there are flags indicating if, for example, frequency L5 observables are within that observation data block.

In FIG. 5 and other figures herein, a dotted border and italicized text denotes optional elements. As shown in FIG. 5, the message format does not describe any form of message preamble, i.e., a pattern that can be used by a message frame recognizer algorithm to discern the beginning of a message or a checksum or cyclic redundancy check (CRC). The use of CRCs is optional within CMRx. Thus with the Message ID, using the optional message length, and the optional message CRC, would provide a "frame" that could be recognized by a frame recognizer Message ID Block The CMRx Message ID Block is common to all CMRx messages and identifies the message type and message length information. In the preferred embodiment this block consists of three elements: Message Length Indicator (MLI), Message Length (if MLI indicates such), and Message Type. The Message Length information is optional, as indicated by the MLI, so as to allow the message length to be removed when the message is inserted into another protocol.

FIG. 6 depicts the general form of the CMRx Message ID Block. Within the CMRx Message ID Block there are three fields:

a. Message Length Indicator (MLI) (2 Bits)

Two bits provide information about the message length content within the message header:

Value Description

0 No length information in the CMRx message.
1 An 8 bit Message Length value immediately follows these two MLI bits. These 8 bits indicate how many 8-bit bytes are in the CMRx message, with the message length being the total length of the message, including the CMRx Message ID Block itself
2 A 12 bit Message Length value immediately follows these two MLI bits. These 12 bits indicate how many 8-bit bytes are in the CMRx message.

b. Message Length (0, 8 or 12 bits, optional)

When the value of the MLI is 1, the Message Length is 8 bits in length and describes the total number of 8-bit bytes in the entire message (inclusive of the CMRx Message ID Block itself). When the value of the MLI is 2, the Message Length is 12 bits in length and describes the total number of 8-bit bytes in the entire message. Note that the CMRx message is left-aligned in the sense that all bits of significance are encoded as a string of bits from left to right. As a result the end of actual message content may not fall on a whole byte boundary. When this occurs bits up to the whole byte boundary will be filled with "0".

c. Message Type (8, 12 or 16 Bits)

The Message Type of a CMRx message specifies the type of message. The left-most bit indicates if there are extension bits used to increase the possible number of message types (i.e., 7 bits are useful, yielding 128 possible message types). When the left-most bit is set to a 1, four bits are added (described below). Such an increase yields a total of 10 possible message types, or 1024 message type possibilities. When the left-most bit of the new 4 bits is set to one, then another 4 bits are added. Such an increase yields a total of 14 possible message types (packed in 16 bits), or 16384 message type possibilities. The message handle may indicate any desired information, for example, the constellation of satellites, such as GPS, WAAS, EGNOS, QZSS, Compass, etc.

GPS Observation Data Message

FIG. 7 illustrates the format of a GPS observation data message, that is, a CMRx message specific to carrying GPS observation information. The information content blocks are described first. The CMRx Message ID Block and the GPS Observation Header Block are the only required blocks. The GPS Observation Header defines whether or not the optional blocks are present in the message. The presence of the optional blocks is indicated by a single bit in the message header. Because each block may have different formats and content, the first few bits of the optional blocks are used to define the format/content of that block.

a. GPS Observation Header Block

FIG. 8 illustrates the GPS Observation Header Block. The size of the header varies depending upon the size of the Epoch Base Time (as indicated by the Epoch Base Time Length, or ETL, flag).

The CMRx Sequence Number (7 bits) is a rolling counter which increments with each GPS epoch. Thus each CMRx message type has its own sequence number and is associated with an epoch of data (or a set of data for non-observable type messages). For example, if GPS observations for a single epoch are sent over several messages, they all have the same sequence number.

The ETL Bit (Epoch Base Time Length bit) (1 bit) indicates the size of the Epoch Base Time:

| Value | Description |
| --- | --- |
| 0 | The Epoch Base Time is 12-bits. |
| 1 | The Epoch Base Time is 31-bits. |

The Epoch Base Time is an expression of whole seconds. For cases where rates faster than 1 Hz. are needed, the Epoch Fractional Time flag will indicate further information regarding the fraction of the second. Thus, the Epoch Base Time is an expression of the whole number of seconds. No fractional seconds are needed for data rates occurring on whole second boundaries. The number of bits used by the Epoch Base Time (as indicated by the Epoch Base Time Length) indicates its ambiguity. When this parameter is 12-bits in length, the value stored is the seconds of the hour and has a value between 0 and 3599 seconds. When this parameter is 31 bits in length, the stored value represents the number of seconds since Jan. 6, 1980 (coincident with the start of GPS time). In both cases, the value is expressed in the GPS time system.

For clarity, the fractional seconds of the epoch are stored separately. The Fractional part is present in the CMRx message only when the "EFT" bit of the header indicates that the Epoch Fractional Seconds Block is present. The EFT (Epoch Fractional Time block bit) (1 bit) indicates if the Epoch Base Time along with a fractional time component must be combined to determine the full receiver epoch time.

The Epoch Base Time, when stored, is truncated. It does not follow the general rounding rule for floating point data because any fractional epoch time is intended to be in the Epoch Fraction Time Block.

Regarding the implementation with respect to the aforementioned 12-bit and 32-bit time ambiguity forms, there are facilities within the decoder implementation enabling a "seed" time to resolve the initial ambiguity. With the CMRx the time ambiguity will be resolved without the need of a seed time until the year 2048. Providing a "seed" time to the decoder that is within about 33 years of the first message ensures time ambiguity resolution beyond 2048. If CMRx modes are used where the 12-bit time is the only form present in messages to be created, then the CMRx Decoder is seeded within about 10 minutes of the time associated with the first received message, or whenever there is a gap in the data of over 10 minutes.

Preferably the CMRx Encoder creates at least one constellation data message per set of data with the full 31-bit time tag and uses the 12-bit time tags in the messages for other constellations. This enables time ambiguity resolution within the decoder, and enables reduced bandwidth utilization, while still allowing the messages of different constellations to be properly time-associated.

The Epoch Fractional Seconds Block is used when subsecond epoch intervals are used. The meaning of this bit is:

| Value | Description |
| --- | --- |
| 0 | No Epoch Fractional Seconds Block present in the message. |
| 1 | The Epoch Fractional Seconds Block is present in the message. |

The RefSta Alias (5 bits) stores a value from 0 to 31 as an alias for the reference station to identify data from multiple reference stations delivered over a single logical channel.

The SHB (Station Health Block present bit) (1 bits) indicates if the Station Health Block is present in the message. The meaning of this bit is:

| Value | Description |
| --- | --- |
| 0 | No Station Health Block present in the message. |
| 1 | The Station Health Block is present in the message. |

The Epoch Continuation Flag (ECF) is used to indicate if there are more CMRx Observation Data messages (for all constellation messages) to follow with the same epoch time tag. A value of 1 means that there are more to follow and a value of 0 indicates the end of epoch. Thus, in the decoder processing, the Epoch Continuation Flag is used to detect the end of an epoch.

The Epoch Continuation Flag is used primarily in the decompression process to detect the end of an epoch. If the ECF flag is zero, the end of the epoch has been received. Because messages can be corrupted and/or lost, the CMRx Decoder also can have additional means of detecting the end of an epoch. For example, the end of an epoch can be determined by receipt of a new message with a different epoch time. Alternatively a timeout value can be used. That is, the frame recognizer, or the CMRx decompression manager may include a timer used to detect when the final packet of an epoch is expected, declare the completion of an epoch when that timeout expires. Any data received after that declaration belonging to an earlier epoch would then be ignored.

In one embodiment, the CMRx Decoder allows configuring the decoder to ignore the ECF flag. This allows the individual message ordering, within an epoch, to be handled by an outside protocol, for example, as needed to send data using certain radio protocols. In this mode, the CMRx Encoder depends upon higher level elements to call a "Force Epoch Completion" method to declare that all messages for an epoch have arrived (or that there are no more expected, in the case where some messages of an epoch may have been lost/corrupted in communications). In this case the CMRx Decoder and will declare an end of epoch when it has processed some messages for an epoch with one time tag and receives a message with a different time tag.

The CRC Present (1 bit) bit indicates if a cyclic redundancy check (CRC) block is present in the message. The meaning of this bit is:

| Value | Description |
| --- | --- |
| 0 | No CRC Block present in the message. |
| 1 | The CRC Block is present in the message. |

The CRC block within CMRx messages are optional and set by bits in the CMRx message. When employed, the bits that define the presence and type of CRC in the message may be corrupted over the communication medium. Because the wrapping protocol may not be reliable in detecting this, or may not be present at all, the decoder can be fooled as the extracted message bits may indicate no CRC is present in the message. To overcome this possibility, the CMRx Decoder can be configured to expect a minimum level of CRC. Thus, if a message arrives that does not have that minimum CRC type, the decoder will reject the message.

The KIN (RefSta Motion) bit (1 bit) indicates whether the observation data are from a static or moving CMRx Encoder. In dynamic mode, more frequent position updates and higher bandwidths, depending upon compression modes, may be required. Thus, some of the blocks of the CMRx message may change size or character depending upon the setting of this mode.

| Value | Description |
| --- | --- |
| 0 | No static data source (or CMRx Encoder is static). |
| 1 | Data source is moving (or CMRx Encoder is dynamic). |

The ACC (Access Control) bit (1 bit) indicates if Access Control has been enabled for the message. The meaning of this bit is defined as follows:

| Value | Description |
| --- | --- |
| 0 | Access Control is disabled (i.e., the message is open to all recipients) |
| 1 | Access Control is enabled (i.e., the message is targeted to a restricted set of recipients). |

Access control is intended to prevent recipients of data from using data not targeted for them. To implement this, a single bit is added to the header of all CMRx messages. This single bit, when set, means that some level of access control is activated. An unset bit implies that the message is open for all recipients.

This is an optional feature that may be utilized if desired. If the bit is set to "1" and the optional feature has not been implemented, the CMRx Decoder will stop decoding the message and report a decoder error condition. This assures that should access control be implemented, decoders, which have no knowledge of how access control is implemented, will ignore any messages that are not considered open to all recipients.

Preferably, if enabled, access control has two (or more) levels—Division Access Control and User Access Control. Division Access Control is a protection to prevent user equipment of one group (e.g., a Agricultural GNSS receiver) from receiving and using CMRx messages sent from equipment of another group (e.g., a Survey/Construction GNSS receiver). For User Access Control, the current thinking is that customers will enter passwords (or codes) into their CMRx sender equipment and recipient equipment will need that same password (or code) to use that data. User Access Control can further limit communications among equipment commonly situated which might otherwise cause data errors.

The PBP (Position Block Present) (1 bit) bit indicates if the Position Block is present in the message. The meaning of this bit is:

| Value | Description |
|---|---|
| 0 | No Position Block present in the message. |
| 1 | The Position Block is present in the message. |

The SBP (Site information Block Preset) (1 bit) indicates if the Site Information Block is present in the message. The meaning of this bit is:

| Value | Description |
|---|---|
| 0 | No Site Information Block present in the message. |
| 1 | The Site Information Block is present in the message. |

The OBP (Observation Block Present) (1 bit) indicates if the GPS Observation Block is present in the message. The meaning of this bit is:

| Value | Description |
|---|---|
| 0 | No GPS Observation Block present in the message. |
| 1 | The GPS Observation is present in the message. |

The VRS (VRS Mode) (1 bit) indicates if the source of the observable data within the message is a Virtual Reference Station (VRS). When this bit is set, it indicates that the observation data pertains to a VRS site and that a VRS/PBS Block exists in the message. The meaning of this bit is defined as follows:

| Value | Description |
|---|---|
| 0 | The observation data present in the message pertains to an actual receiver (i.e., not a VRS point), and no VRS/PBS block will be found in the message. |
| 1 | The observation data present in the message pertains to a VRS point, a VRS Block is present in the message, and any Site Information within the message belongs to a Physical Base Station. |

The PRN (pseudo-random noise) Capacity (3 bits) bits are used to describe the maximum PRN number packed. The meaning of these bits is:

| Value | Description |
|---|---|
| 0 | The maximum PRN number is 32. |
| 1 | The maximum PRN number is 37. |
| 2 | The maximum PRN number is 42. |
| 3 | The maximum PRN number is 47. |
| 4 | The maximum PRN number is 52. |
| 5 | The maximum PRN number is 57. |
| 6 | The maximum PRN number is 62. |
| 7 | The maximum PRN number is 63. |

The value of these bits establishes the size of the PRNs Present Block (described below). For example, when the PRN Capacity is set to 0, the PRNs Present Block will consist of 32 bits, each bit representing the presence (or absence) of data for PRNs 1 to 32. The CMRx Encoder automatically sets the PRN capacity based upon the epoch data it is provided for creating messages. Therefore, the application employing the CMRx compression determines whether or not PRN IDs from 33 to 63, inclusive, are appropriate and pre-filters data accordingly.

The TBP (Text Block Present) (1 bit) indicates if the Text Message Block is present in the message. The meaning of this bit is:

| Value | Description |
|---|---|
| 0 | No Text Message Block present in the message. |
| 1 | The Text Message is present in the message. |

Some bits are not assigned. These spare bits can be used to extend the definition of the GPS messages as necessary.

The CRC Block exists in the message when the CRC bit of the CMRx GPS Observation Header Block indicates the presence of a CRC. When the CMRx message is to contain a CRC, the computed CRC will be placed into the message on a byte aligned boundary, as described below. The CRC block is divided into sections:

1) Definition Bit (Labeled Def).

The CRC Definition Bit indicates the type of CRC in the message.

| Value | Description |
|---|---|
| 0 | 16-bit CRC (using the 0x1021 polynomial) |
| 1 | 32-bit CRC (using the 0xEDB88320 polynomial) |

2) Fill Bits.

Most CRC computation algorithms work with collections of bytes (not bits) and are efficient because they compute based upon a sequence of bytes. This is true with the CRC value of CMRx messages. As such, the CRC is computed using a sequence of bytes skipping the bytes that are used to store the computed CRC value. This means that the computed CRC value must fall on a byte boundary. The Fill Bits of the CRC block are used to align the location of the computed CRC so that it is stored aligned on a byte boundary.

3) Computed CRC

The "Computed CRC" value contains the CRC for the message. This value will include all elements of the message from the CMRx Message ID block through the end of the last block stored in the CMRx message. The CMRx computation algorithm will assume that the entire message ends on a byte boundary and, therefore, the encode process must add fill (or zero bits) to the end of the message so that the message, for CRC computation purposes, ends on a byte boundary.

Fractional Epoch Time Block

The epoch time consists of (1) a Base Epoch Time which is the whole number of seconds since Jan. 6, 1980, and an optional fractional epoch time. When the fractional portion is not contained in the CMRx message, the receiver samples data only on whole second boundaries. With faster than 1 Hz. epoch output rates, or when the receiver does not sample on whole second boundaries, the Fractional Epoch Time Block is used. The 7 bits of the Fractional Epoch Time Block enable information of up to about 100 Hz epoch rates.

Station Health Block

The SHB bit of the CMRx GPS Observation Header Block indicates if the Station Health Block is present in the CMRx message. The Station Health Block provides the recipient with information regarding the health of the sender site. The meanings of these bits are:

| Value | Description |
|---|---|
| 0 | Monitored and Healthy/Acceptable |
| 1 | Do Not Use. This bit is set when the site is experimental, newly on-line but still under test, etc. |
| 2 | Unmonitored Sender Station |
| 3 | Monitored but Unhealthy condition, e.g., a carrier phase position tolerance violation). |
| 4-50 | Reserved for future unhealthy conditions |
| 51-63 | Reserved for future monitored/healthy conditions. |

Position Block

The Position Block Present (PBP) bit of the CMRx GPS Observation Header Block indicates whether a Position Block is present in the message. When the PBP is set to 1, the Position Block is present. The Position block contains only the positional information for the sender (or creator) of the CMRx GPS Observation Message. This block provides the coordinates of the phase center (ITRF-Current, also sometimes called ITRF True of Date Geodetic Coordinates) to which all observables are translated (i.e., the null antenna absolute phase center). The Position Block of a message may contain the entire positional information content, or when reducing bandwidth utilization, it may contain a piece of the positional information. These pieces of the positional information are called segments. In this way, the positional information content can be trickled over several messages, sending one segment per message. This approach is used by other blocks of the CMRx messages and makes the use of the bandwidth more consistent from epoch to epoch. This segmentation approach is described further below.

Within the Position Block are Latitude, Longitude and Height coordinates expressed, by convention in one embodiment, in the base coordinate frame of the GPS constellation, and an Age of Position (AOP). The AOP has two primary utilities. First, a recipient of a CMRx message knows that new coordinates are arriving when the AOP for a particular Reference Station Alias has changed. Second, when segmented data are transmitted over multiple epochs, messages can be lost or corrupted during communication. When this occurs, the recipient sees a hole(s) in the segmented information. Segmented data, however, are most often continuously output by a CMRx source in a repeating cycle. When the missing segment(s) arrives again, the hole(s) in the segment is filled. Once an entire suite of segments arrives, the recipient can then unpack the contents of that suite.

When present, the Position Block consists of two primary parts: (1) definition bits; and (2) Position Block body bits, as shown in FIG. 9. The size of the body is not fixed. The definition bits describe both the content and size of the Position Block body. The list below describes the format of these blocks while the subsections that follow detail the format of each.

| | Position Block Definition |
|---|---|
| 0 | The Position Block Body contains the entire Latitude, Longitude, Height, and Age of Position (i.e., 98 bits for Lat, Lon. And Ht. and 4 bits for Age of Position). |
| 1 | Latitude, Longitude and Height trickled over 2 epochs |
| 2 | Latitude, Longitude and Height trickled over 4 epochs |
| 3 | Latitude, Longitude and Height trickled over 8 epochs |
| 4 | Latitude, Longitude and Height trickled over 16 epochs |
| 5 | Latitude, Longitude and Height trickled over 32 epochs |
| 6 | Latitude, Longitude and Height trickled over 64 epochs |
| 7 | Latitude, Longitude and Height trickled over 128 epochs |

In the above list, the AOP is included in each message. Definitions 1-7 span several epochs. The segment number of each transmitted portion is identified using the appropriate bits of the CMRx Sequence Number found in the Header Block of the message. For example, if the value 2 is specified, the positional information is completely transmitted in 4 messages. In this case, the 2 least significant bits of the CMRx Sequence Number describe which segment of the positional information is being included at that epoch.

There is a relationship between Segments, Segment IDs, CMRx Sequence Numbers and Message Types. An epoch of data may contain multi-constellation data: e.g., an epoch of data may contain GPS, GLONASS, etc. information. A CMRx message, however, contains data from only one constellation. The CMRx Message sequence numbers increment on a per message type basis. For observation data, the CMRx Sequence Number only increases with each epoch processed. Thus there is a CMRx sequence number for each constellation and the sequence number increases on the completion of processing each epoch.

Data for a single constellation can be sent in one or more messages of the same type. If so, the CMRx Sequence Number remains constant with each message for that constellation for that epoch. For example, if there are 9 GPS satellites tracked and it is decided to send out 3 per CMRx message, then the epoch will contain at least 3 GPS Satellite Observation Data messages, each sharing the same sequence number.

Age of Position

The Age of Position (AOP) is used to enable a recipient to know when the position, within the position block, has changed. Essentially a recipient keeps track of when a new set of coordinates has arrived for a RefSta Alias and therefore can detect when they have changed. Of course they are considered "changed" when the recipient has no historical position information.

The AOP has two main functions: (1) It helps detect that the position information has changed (e.g., when the current AOP value is smaller than the previous value); and (2) it aids in faster start-up times when a recipient has, at some recent time in the past, received data from a CMRx sender.

For the latter case, a typical recipient will keep an almanac of coordinates (i.e., a table, often stored in some non-volatile memory or file, containing the RefSta Alias, its coordinates, a timestamp associated with the AOP, and other information) between operating sessions. At the start of a new session and upon receipt of the first epoch of data, even when the position data is being trickled, the recipient can determine if the coordinates for the sender are already stored in the almanac and whether or not they have changed since the previous session. The Age of Position is used just for this purpose. Clearly, if the recipient has no existing almanac entry for the RefSta Alias, or the time information within the almanac for a RefSta Alias does not fit the AOP contained within the CMRx message, then the recipient must assume that it does not know the position; it must then wait for all segments to arrive before declaring the position known (unless the recipient Decoder was "seeded" with coordinates through some other source). The AOP provides useful information in this case as well.

The 4-bit AOP is interpreted as follows:
AOP Value [base 2] Meaning

| 0000 | | Position changed within less than 90 seconds | |
|---|---|---|---|
| 0001 | 90 sec <= | Position Change time < | 3 min |
| 0010 | 3 min <= | Position Change time < | 6 min |
| 0011 | 6 min <= | Position Change time < | 12 min |
| 0100 | 12 min <= | Position Change time < | 24 min |
| 0101 | 24 min <= | Position Change time < | 48 min |
| 0110 | 48 min <= | Position Change time < | 1.6 hrs |
| 0111 | 1.6 hrs <= | Position Change time < | 3.2 hrs |
| 1000 | 3.2 hrs <= | Position Change time < | 6.4 hrs |
| 1001 | 6.4 hrs <= | Position Change time < | 12.8 hrs |
| 1010 | 12.8 hrs <= | Position Change time < | 25.6 hrs |
| 1011 | 25.6 hrs <= | Position Change time < | 2.133 days |
| 1100 | 2.133 days <= | Position Change time < | 4.266 days |
| 1101 | 4.266 days <= | Position Change time < | 8.533 days |
| 1110 | 8.533 days <= | Position Change time | |
| 1111 | | Ambiguous AOP: Do Not Use Position | |

Note that each entry, other than the first and last entries, are doublings of adjacent entries. With this doubling nature, the AOP can be used to both identify when full segment suites have arrived, as well as when recipients implement historical almanacs, i.e., the recipient applications can implement almanacs, storing history of station position, time tags, and received AOP values, which can be used to speed recipient startup times when a recipient has received data in the past from a sender. Stated another way, the almanac usage of the AOP should only occur when 0001<=AOP<=1110, and all table entries are used to aid in full segment suite arrival determination. There is special handling associated with AOP values of 0000 and 1111 as will be described.

In the above table, the value of 0000 is used whenever the position information is changed. If the position is changed twice (or more) within a 90 second period, the AOP is set to the value of 1111; a value implying that the AOP is ambiguous and no position information should be used. That is, whenever the CMRx Encoder detects to position changes within a 90 second period (a rare event), it will set the AOP to the value 1111 and will keep that value for 90 seconds, after which the AOP will be set to 0001, thus following the above table after the 90 second ambiguity period.

From a cold start (i.e., when the sender does not yet know its own position), the initial setting of the position counts as one change. For example, after a firmware reset the CMRx Encoder position is changed to unknown. Once the operator enters a set of coordinates then it counts as the first change (i.e., a change from unknown to a single value). If the operator then changes the position to another value, it is considered a second change.

The CMRx Encoder will allow its transmitted AOP to change in the middle of a transmit suite cycle as long as the AOP is not transitioning to zero (or to a smaller value: these are discussed later). A transmit suite cycle is intended to mean all of the segments required for a complete segment suite, and one which starts at the first segment and ends with the last segment. This means that the AOP is allowed, within a transmit suite cycle, to transition from the value 0000 to 0001, or any transition from a non-zero AOP value to its next higher AOP value. It is not allowed, within a transmit suite cycle, to transition from a non-zero value (other than 1111) to 0000 (or from say 0010 to 0001): i.e., any such case means that the position has changed recently. When a new position enters the encoder the current position is no longer valid, and thus any remaining transmit suite would be invalid. Therefore, the encoder can "interrupt" an uncompleted transmit suite cycle and start the sequence number at zero again. In other words, whenever the decoder detects that the AOP has gone backwards, it will clear any information that it knows about received positional data.

The CMRx Decoder itself does not keep almanac information within the library. Rather, the decoder constantly passes segment information and/or any arrived positional data to an application using the CMRx Decoder. Thus, the application using the CMRx Decoder implements the position almanac information to exploit the almanac features of the AOP. With the information about segments given it from the CMRx Decoder, the application can then look-up the appropriate information in its almanac and then provide that information to both its data processing elements and the decoder library (i.e., to "seed" the decoding process with the sender's coordinates). Without such an almanac implementation by the application, and its interfacing to the CMRx decoder, the CMRx Decoder assumes at start-up that no historical position information is known and requires complete segment arrival before declaring the position known within the decoder.

A sender application that does not want to bother with storing position data with timestamps that would be passed into the CMRx Encoder for AOP computation, will call the encoder with a special indicator which will result in an initial AOP value of zero.

Once the encoder is started, it does retain position data given to it during a single instantiation via its various method calls. Providing a single encoder object instantiation with the same coordinates repeatedly, via its method calls, will not cause a change in its reference time used to generate the AOP. Furthermore, once the position is set within the encoder, it knows the time at which that position was set and can, thereafter, compute the AOP for each segment. Sub-millimeter changes in position are ignored.

Age of Position Processing

Next we explain how a recipient handles the arrival of segments and treats their AOPs given that communications outages may occur. Clearly if the data is not segmented (i.e., the entire contents of position information is sent in one epoch) then no special processing is required to determine if a full segment suite was received. If there is more than one segment, the decoder looks at the AOP and segment arrivals to determine when it has received a complete suite of segments, and then unpacks a position from that suite. In addition, an application using a CMRx Decoder can implement an almanac feature so as to allow it to know the position of the sender with receipt of only a single segment. For example, suppose at a construction site a base station remains at the same location for several days. On the first day, the CMRx Decoder within a surveyor's rover receiver must receive a full segment suite and extract the position of the sender from that suite. At the end of the day, the surveyor turns off his unit. If that receiver/application implemented an almanac saving the positional data (and other information) then when that surveyor turns the unit on the next day, the application will know if the position of the sender has changed upon receipt of the first segment. Thus he may not need to wait for a complete segment suite to begin surveying.

Determining when Full Segment Suites have Arrived

Next we discuss how to treat segment arrivals, given various communications environments that may corrupt messages, and using the AOP values within those arrived segments to determine when we have received a complete suite of segments and can unpack a position from that suite. In a general sense, trickling is accomplished by breaking a block of information up into easily identifiable segments and then sending one segment per message. Because those segments are identifiable, we can reconstruct the original block. For example, assume an original block of information broken up into four segments. The collective size of the segments is larger than the original block simply because of the overhead, such as the AOP and the Position Block Definition bits sent with each segment. These segments are then sent within successive CMRx Epoch messages. The decoder can then collect the arrived segments and reassemble the original block. The processing is straight forward if there are no possible message losses over the communication medium. Potential packet losses combined with the potential that the coordinates at the reference station may change, however, make this more complicated.

For explanation, we use the concept of segment mailboxes as employed by the decoder. The decoder creates a mailbox that will store data for each expected segment (i.e., it knows how many mailboxes are needed based upon the Position Block Definition Bits). In each mailbox it stores at least the segment content bits received, the length of the bits, the AOP value associated with segment, and a time tag associated with that segment. Thus, each mailbox within the CMRx Decoder maintains the following information:

| | |
|---|---|
| SegID. | The FullSeqNum modulo the number of expected segments. That is, the information contained in a CMRx Message with each segment is a segmentation mode. That very mode indicates the number of segments to be expected. |
| SegBitContent. | A copy of the information content within the segment: i.e., one piece of the total content. |
| SegArrTime. | The full GPS Time extracted from the Header Block of the CMRx Message. As a segment arrives, even if the information content for that segment is the same as when that segment was last received, the segment arrive time is updated. |
| AgeOfPos. | The AOP value that arrived with the segment data. |

Segment Mailbox Management

As a segment arrives, the mailbox associated with that segment is identified using the appropriate bits of the CMRx Sequence Number. In the pseudo-code below the mailbox refers to the single mailbox identified by the CMRx Sequence Number. The basic mailbox processing is as follows:

A) If the arrived segment length differs from the segment length stored in the mailbox OR the Age of Position of the current segment is less than that of the previously received segment OR the AOP=1111 [base 2].
 a.1 The entire suite of mailboxes are cleared to an initial state.
 a.2 The segment content bits are copied into the mailbox.
 a.3 The SegID is stored in the mailbox.
 a.4 The segment arrive time (within the mailbox) is set to the current time.
 a.5 The AOP associated with arrived segment (within the mailbox) is stored.

B) Else if the arrived segment content bits differ from that stored in the mailbox OR the configured maximum age of mailbox is exceeded (see note later in this section).
 b.1 The segment content bits are copied into the mailbox.
 b.2 The SegID is stored in the mailbox.
 b.3 The segment arrive time (within the mailbox) is set to the current time.
 b.4 The AOP associated with arrived segment (within the mailbox) is stored.

C) Else if the arrive segment content bits are exactly those stored in the mailbox
 c.1 The SegID is stored in the mailbox.
 c.2 The segment arrive time (within the mailbox) is set to the current time.
 c.3 The AOP associated with arrived segment (within the mailbox) is stored.

The mailboxes are then processed using a set of rules. The rules assure that the segmented data is correctly reassembled by the CMRx Decoder.

Rule 1. All mailboxes, associated with the expected segments must contain some data. Otherwise there is no possibility that the mailboxes contain a full segment suite. This rule supersedes all rules to follow in that, if all mailboxes, associated with expected segments, do not contain data then it is not possible to have a full segment suite.

Rule 2. When the position changes twice (or more) within a 90 second period, the CMRx Encoder sends an AOP=1111 for 90 seconds after the change. After the 90 second period, the AOP changes to 0001. Note that from a cold start when the sender does not yet know its own position, the initial setting of the position counts as one change. Once the operator enters a set of coordinates, it counts as the first change. If the operator then changes the position to another value, it is considered a second change.

Rule 3. Whenever the currently received AOP value is less than the previously received AOP value, or an AOP=1111 is received, the recipient clears all mailboxes by resetting them to their initial state. The decoder then assumes that it has received no coordinates. If the decoder is configured to use the coordinates in a CMRx message for CMRx unpacking purposes (and not coordinates obtained through other sources), it assumes that it knows nothing about received coordinates. This may result in an inability, until it receives a new full segment suite, to decode satellite observables within CMRx observation messages.

For definition, "Oldest segment" refers to the segment stored in a mailbox with an arrival time longest ago. "Youngest segment" refers to the segment stored in a mailbox with an arrival time closest to the current time. "AOP Coverage Time" refers to the maximum amount of time for a given AOP value where it is known the position could not have changed. For example, with an AOP of 0000, we have an AOP Coverage Time of 90 seconds.

Rule 4. Once all mailboxes contain data, a complete segment suite is declared when the delta time between the oldest and youngest segment is less than the AOP Coverage Time of the largest AOP value found in the mailboxes. Otherwise, if the suite of arrived mailboxes have a delta time between youngest and oldest equal or greater than the AOP Coverage Time of the largest AOP value, then the decoder declares that the position is not known.

Rule 5. When the suite of mailboxes contain 0000 and non-0000 AOP values, the delta time between the youngest segment having an AOP of 0000 must be less than ½ AOP Coverage Time of the youngest mailbox with the largest non-0000 AOP to declare a full segment suite arrival.

Using the AOP to Aid in Quick Start-Ups

The AOP and segmentation allow a recipient to recall information previously stored in non-volatile memory; thus allowing a faster start-up of the data processing engines and CMRx Decoding processes. Whenever a recipient receives and declares receipt of a full segment suite information is passed to the application using the CMRx Decoder. That application can store enough information so that at some later date, or after a connection break/restart, receiving a single AOP is enough information to know whether or not that previously stored information contains the needed information to start the processing.

Position Component Packing Algorithm

Many of the sections that follow contain algorithms in a C/C++ code-like format. These algorithms are intended to serve as examples of implementation of the encoding/decoding process.

For the coordinate information (i.e., Latitude, Longitude and Height), the coordinates are scaled to equivalent integer values. Latitude is stored in 36 bits using a precision of about 0.3 mm (i.e., accuracy of about 0.15 mm). Longitude is stored in 37 bits using a precision of about 0.3 mm (i.e., accuracy of about 0.15 mm). Ellipsoidal Height is stored in 25 bits using a precision of about 0.3 mm (i.e., accuracy of about 0.15 mm).

Step 1: Validate ranges of data and generate error on violation.

```
if (fabs (dLat) > 90.0)
    return (CMRxV1_ERR_POSLAT);
if ((dHt < -500.0) || (dHt > 9500.0))
    return (CMRxV1_ERR_POSHT);
```

Step 2: Convert Positional Components to Bit Representations.

```
dLat += 90.0;
while (dLon < 0.0) dLon += 360.0;
while (dLon >= 360.0) dLon -= 360.0;
dHt += 500.0;
u64Lat = RoundDoubleToInt64 (dLat * 2^36/180.0);
u64Lon = RoundDoubleToInt64 (dLon * 2^37/360.0);
u64Ht = RoundDoubleToInt64 (dHt * 2^25/10000.0);
```

Upon completing this process, one can pack the 36 least-significant bits of u64Lat, the 37 least-significant bits of u64Lon, and the 25 least-significant bits of u64Ht. Notice that the values packed for Latitude, Longitude and Height are unsigned numbers (i.e., the packed values are manipulated to keep them within the positive range).

```
PackCMRxBits (cpPosBitBuf, &iCurrPosBit, 36, I64Lat);
PackCMRxBits (cpPosBitBuf, &iCurrPosBit, 37, I64Lon);
PackCMRxBits (cpPosBitBuf, &iCurrPosBit, 25, I64Ht);
```

Unsegmented Position Construct

The Unsegmented Position Construct shown in FIG. 10 is used to describe the components of the position stored contiguously in memory. Such a construct can be used in the encoding process to hold the bits that will be placed into segments. During decoding, it can be used to store segment data as it arrives. For position data, this construct holds the 36-bits of Latitude, then the 37 bits of Longitude, and then the 25 bits of Ellipsoidal Height. The values for Latitude, Longitude and Height are first converted to an integer representation as described above.

Full Position Per Message

The Full Position option shown in FIG. 11 is used when the Position Block Definition bits contain the value 0. In this mode, 105 bits are stored in the Position Block. Of those 105 bits, 3 bits are for the Position Block Description bits (all three bits are set to zero), 4 bits store the Age of Position, and 98 bits are used to store the position (Latitude, Longitude, and Ellipsoidal Height). The values for Latitude, Longitude and Height (36 bits, 37 bits, and 25 bits, respectively) that have been converted to their integer representations.

Position Trickled in 2 Epochs

When the Position Block Definition bits hold the decimal equivalent of the value 1, the position information content will be segmented and sent over 2 epochs, while the Age of Position is sent with each segment over 2 epochs. This is illustrated in FIG. 12.

As mentioned above, portions of data are sent with each CMRx message and these portions are identified by Segment Numbers. Segment Numbers correspond with the appropriate bits of the CMRx Sequence Number. The bit value of "X" means "Don't Care". The segment data contains the values for Latitude, Longitude and Height (36 bits, 37 bits, and 25 bits, respectively). The approach to trickling the position data over more than two epochs is analogous to that shown in FIG. 11.

Site Information Block

The Site information Block Present (SBP) bit of the CMRx GPS Observation Header Block (see FIG. 8) indicates whether the Site Information Block is present in the message. When that bit is set to 1, the Site Information Block is present in the message. The Site Information Block contains the 16-Character site name, the 16-Character site code, 8 bits for Point Source, an indication of point quality (coded, 0=Normal and 1=Control), the antenna height (0.0 to 4.0955 meters, the antenna type (coded: 0 to 1023), the antenna height measurement method (coded: 0 to 7), and the GPS receiver type (coded: 0 to 511).

When present, the Site Information Block (see FIG. 13) consists of two primary parts: (1) Site Information definition bits, and (2) Site Information body bits. The site information definition bits are shown by the list below.

| | Site information Definition |
|---|---|
| 0 | The Entire Site Information Body is sent in one epoch (i.e., 300 bits) and Age of Site Information (4 bits). |
| 1 | Site Information is trickled over 2 epochs |
| 2 | Site Information is trickled over 4 epochs |
| 3 | Site Information is trickled over 8 epochs |
| 4 | Site Information is trickled over 16 epochs |
| 5 | Site Information is trickled over 32 epochs |
| 6 | Site Information is trickled over 64 epochs |
| 7 | Site Information is trickled over 128 epochs |

Before describing each of the individual formats, common elements of the Site Information Body will be described. These are Segmented Information, Age of Site Information, and the algorithm for converting the site information components to an integer representation. As described above, formats 1 to 7 span several epochs. With each CMRx Observation Data message, a portion of the entire information content will be transmitted using the segmentation and trickling techniques described above.

The Site Information Block provides the following information:
1. The 16-Character site name
2. The 16-Character site code 3. Point Source
4. Point Quality
5. Antenna Height
6. Antenna Type
7. Antenna Height Measurement Method
8. GNSS receiver type Unsegmented Site Information Construct FIG. 14 illustrates the format of the he Unsegmented Site Information Construct. The Unsegmented Site Information Construct is used to describe the components of the site information stored contiguously in memory. This can be used in the encoding process to hold the bits that will be placed into segments. During decoding, it can be used to store segment data as it arrives. Upon completion of segment arrival, the Unsegmented Site Information Construct is the block from which site information components of the Site Information Block are extracted.

Site Information Per Message

FIG. 15 illustrates the Site Information option used when the Site Information Block Definition bits contain the value 0. In this mode, the Site Information Block consists of 307 bits. Of those 307 bits, 3 bits are for the Site Information Definition bits, 4 bits are for the Age of Site Information and 300 are site information content. The values for position information components are those that that have been converted to an integer representation.

Full Site Information Trickled

When the Site Information Block Definition bit holds the value 1, the site information content will be segmented and sent over 2 epochs, while the Age of Site Information is sent with each segment over 2 epochs. Portions of data are sent with each CMRx message and these portions are identified by Segment Numbers. Segment Numbers correspond with the appropriate bits of the CMRx Sequence Number. If the Site Information Block Definition bits hold the value 2, the site information content will be segmented and sent over 4 epochs, while the Age of Site Information is sent with each segment over 4 epochs. If the Site Information Block Definition bits hold the value 3, the site information content will be segmented and sent over 8 epochs, while the Age of Site Information is sent with each segment over 8 epochs. If the Site Information Block Definition bits hold the value 4, the site information content will be segmented and sent over 16 epochs, while the Age of Site Information is sent with each segment over 16 epochs. Similarly, if the Site Information Block Definition bits hold the value 5, the site information content will be segmented and sent over 32 epochs, while the Age of Site Information is sent with each segment over 32 epochs. This same approach is used for up to 128 epochs. FIG. 16 illustrates one segment of the Site Information when trickled over four epochs.

VRS/PBS Block

When the CMRx Observation Message is carrying observation data for a Virtual Reference Station, GNSS observation processors can take advantage of network information. For this reason, additional information is often supplied for data associated with a VRS point. When CMRx is carrying VRS observations the following rules apply:

1. The Header Block of all CMRx Observation Data Messages associated with the VRS must have their VRS bit set (i.e., set to $1_2$), regardless of whether or not individual observation messages actually carry the supplemental VRS information (described below). The rule applies to all Observation Messages for all constellations for a given epoch. This ensures that, even under extreme communication losses, the recipient is fully aware that the data pertains to a VRS.

2. The Position Block provides the position associated with the data (i.e., in this case, it is the position of the Virtual Reference Station).

3. The Site Information Block found in any message of an epoch marked with the VRS mode enables, pertains to the closest Physical Base Station. That is, the Site Information Block contains information such as, site name, antenna type, and antenna height; all information that pertains to physical, and not virtual, sites.

FIG. 17 illustrates the structure of the VRS/PBS Block. The PBS and VRS present bits have meanings as below.

| Field | Bits | Description |
| --- | --- | --- |
| PBS Pres | 1 | This bit, when set indicates that the PBS Block is present as part of the VRS/PBS Block. When this bit is reset (i.e., set to 0 [base2] it implies that the PBS Block is not part of the VRS/PBS block. |
| VRS Pres | 1 | This bit, when set indicates that the VRS Network Residuals Block is present as part of the VRS/PBS Block. When not set (i.e., set to 0 [base2]) it implies that the VRS Network Residuals Block is not part of the VRS/PBS block. |

The PBS Block usually carries physical base station information. This information is used by rovers for weighting purposes and to help software generate vectors to physical site locations. The VRS Network Residuals Block contains quality information associated with each satellite observed by the network which aids in the weighting of observation data used in GNSS data processors.

The PBS and VRS Network Residuals Blocks are optional. The PBS Block is a sub-block within the VRS/PBS Block. It is present only when indicated by the "PBS Pres" bit of the VRS/PBS Block. The PBS Block contains the following information:

1. Physical Base Station Alias (5-bits).
   This information is similar to that of the "RefSta Alias" of the Observation Message Header Block. However, the RefSta Alias always pertains to the station (or point) associated with the observations (i.e., when the VRS Mode is enabled, the "RefSta Alias" refers to the virtual point associated with observations within the message). In this PBS Block, the Physical Base Station Alias (or PBS Alias) refers to the alias ID associated with the physical base station who's coordinates are being supplied within this block.
2. Latitude (36 bits).
3. Longitude (37 bits)
4. Height (25 bits)

Unsegmented PBS Construct

The Unsegmented PBS Construct shown in FIG. 18 illustrates the components of the PBS Block (see FIG. 19) stored contiguously in memory. Such a construct can be used in the encoding process to hold the bits that will be placed into segments. During decoding, it can be used to store segment data as it arrives and, upon completion of segment arrival, it will be the block from which the various components of the PBS Block can be extracted. This construct holds the PBS Alias, the 36-bits of Latitude, the 37 bits of Longitude, and the 25 bits of Ellipsoidal Height. It is assumed that the values for Latitude, Longitude and Height that have been converted to their integer representation.

When present, the PBS Block as shown in FIG. 19 consists of: 1) definition bits; and 2) PBS Block body bits. There can be an Age of PBS (AOPBS) that is sent with the PBS trickle information. This has the same meaning/intent as the Age of Position, within the Position Block, but applies to the Age of PBS information, or AOPBS.

The table below explains the meaning of the PBS Block bits.

| PBS Block Definition | Brief Description |
|---|---|
| 0 | The PBS Block Body contains the entire Latitude, Longitude, Height, and Age of PBS as shown in FIG. 20. |
| 1 | The PBS Alias, Latitude, Longitude and Height trickled over 2 epochs. |
| | Segment      Number of Bits for PBS Data |
| | 0      52 + 4 bits for Age of PBS |
| | 1      51 + 4 bits for Age of PBS |
| 2 | The PBS Alias, Latitude, Longitude and Height trickled over 4 epochs. |
| | Segment      Number of Bits for PBS Data |
| | 0-2      26 + 4 bits for Age of PBS |
| | 3      25 + 4 bits for Age of PBS |
| 3 | The PBS Alias, Latitude, Longitude and Height trickled over 8 epochs. |
| | Segment      Number of Bits for PBS Data |
| | 0-6      13 + 4 bits for Age of PBS |
| | 7      12 + 4 bits for Age of PBS |
| 4 | The PBS Alias, Latitude, Longitude and Height trickled over 16 epochs. |
| | Segment      Number of Bits for PBS Data |
| | 0-6      7 + 4 bits for Age of PBS |
| | 7-15      6 + 4 bits for Age of PBS |
| 5 | The PBS Alias, Latitude, Longitude and Height trickled over 32 epochs. |
| | Segment      Number of Bits for PBS Data |
| | 0-6      4 + 4 bits for Age of PBS |
| | 7-31      3 + 4 bits for Age of PBS |
| 6 | The PBS Alias, Latitude, Longitude and Height trickled over 64 epochs. |
| | Segment      Number of Bits for PBS Data |
| | 0-38      2 + 4 bits for Age of PBS |
| | 39-63      1 + 4 bits for Age of PBS |
| 7 | The PBS Alias, Latitude, Longitude and Height trickled over 128 epochs. |
| | Segment      Number of Bits for PBS Data |
| | 0-102      1 + 4 bits for Age of PBS |
| | 103-127      No PBS data |

VRS Information

The VRS Block is a sub-block within the VRS/PBS Block depicted in FIG. 17. The VRS block is present only when indicated by the "VRS Pres" bit of the VRS/PBS Block (see FIG. 17). The VRS Block contains the following information:
1. Number of Satellites (6 bits). This information is sent with every VRS Block (whole block and trickled block) and is used to define how many bytes remain to be unpacked for the entire VRS Network Residuals discussed below.
2. PRN Word Mode (2 bits) to provide size of PRN Word).
3. PRN Word List of Satellites for which there are Network Residuals (24 to 63 bits).
4. Time tag associated with the Network Residuals (9 bits)
5. Per Satellite Network Residuals (10 bits).
6. Geometric Standard Deviation (5 bits).
7. Ionospheric Standard Deviation (5 bits).

We have already discussed several blocks of information that can be segmented/trickled (e.g., Position Block, Site Information Block, and the PBS Block). In the descriptions of those blocks, however, it was assumed that the information content, i.e., that which was being segmented and then trickled, was of a fixed length. The VRS information, however, is not fixed in size. Its size is based upon the number of satellites for which there are network residuals. One cannot assume, however, that there are VRS Network residuals associated with each satellite in the PRN Word(s) of the Observation Message. That is, for a variety of reasons the set of satellites for which an Observation Message is carrying satellite observation data may not match the set of satellites for which there are VRS network residuals being provided. Therefore the number of satellites for the entire VRS Network Residuals Block (see FIG. 22) for a given constellation is provided with as part of the trickled data.

The VRS information is not of fixed length, and thus requires different handling if it is to be rolled. To overcome this difficulty, a VRS network processing algorithm gives the CMRx Encoder data at the correct time. A Time Pres bit combined with a Time Offset bits provides flexibility for such trickling. The "Time Pres bit" has two possible settings:

| Value | Description |
|---|---|
| 0 | Use CMRx Observation Message time as the reference time. |
| 1 | The reference time for the network residuals is a combination of the "Time Offset" bits and the CMRx Observation Message time. |

When the "Time Pres bit" is reset (i.e., holds the value 0 [base 2]), there are no "Time Offset" bits present in the block and the CMRx Observation Message time is used as the time tag associated with the network residuals found later in the VRS Network Residuals block. When the "Time Pres bit" is set (i.e., holds the value $1_2$), the "Time Offset" bits are present in the block. The "Time Offset" bits store an offset in units of seconds that should be applied, in a negative sense, to the CMRx Observation Message time to obtain the time tag associated with the network residuals found later in the VRS Network Residuals block. That is, $$VRS\_Residt = CMRtmsg - Timeoffsetmsg$$

where, CMRtmsg CMRx Observation Time (including any Fractional Epoch Time).

Timeoffsetmsg Is the value of the "Time Offset" bits converted to seconds; and

VRS_Residt Time tag associated with the VRS Residual information to follow in the block.

The "PRN Mode" defines how the list of PRNs will be provided. Basically, we provide the list of PRNs and then the VRS residuals associated with those PRNs. The reason for the "PRN Mode" is basically a way of reducing bits required when we reach a certain number of satellites to be contained in the block. Consider the following meaning of the PRN Mode:

| Value | Description |
|---|---|
| 0 | The PRN Ident portion will contain a Count of PRNs (3-bits) followed by a list of PRNs. For each PRNID stored following the Count of PRNs: |
| | a)    The value stored for each PRNID will be one less than the actual ID: e.g., if the ID to be indicated is 16 then the value 15 will be stored in the SVPRN bits. |
| | b)    The number of bits required to store each PRNID is dependent upon the maximum SVPRN ID, which is identified by the PRN Capacity bits of the Header Block of the CMRx GPS Observation Data message |

-continued

| Value | Description |
|---|---|
| 1 | The PRN Ident portion will be a PRN Word style storage. In its basic form, this PRN Word is a 32-bit number, each bit Represents one satellite PRNID; the right-most bit represents SVPRN #1 and the left-most represent SVPRN #32. The number of bits set in this PRN word indicates how many sets of satellite residuals are stored in the remainder of the block. These residuals will be stored based upon SVPRN Number and will be stored from lowest to highest in accordance with the bits set in this PRN Word. |

The "PRN Ident bits" determine the number of VRS Network Residuals, and their order as associated with specific PRNs, stored in the remainder of the VRS Network Residuals Block. The residual information for each satellite has the form shown in FIG. 22. The Geometric and/or Ionospheric residual information is optional. Their presence is indicated by the value of the "Geo Res Pres" and "Iono Res Pres" bits, respectively. A value of 1 means the associated residual information is present, while a value of 0 means that information is not present. The actual Geometric and Ionospheric standard deviation values are 5 bit encodings. With the exception of the 00000 [base 2] and 11111 [base 2], the value stored for a residual standard deviation is computed as:

$$\text{residual} = \frac{i(i+1)}{20},$$

where i is the value stored in CMRx for the residual.
A look up table provides the values.

| $i_{10}$ | I (base 2) | Geo StdDev (cm) | Iono StdDev (cm) | Residual Range (cm) |
|---|---|---|---|---|
| 0 | 00000 | No Information | No Information | No Information |
| 1 | 00001 | 0.1 | 0.1 | 0.0 <= res < 0.2 |
| 2 | 00010 | 0.3 | 0.3 | 0.2 <= res < 0.45 |
| 3 | 00011 | 0.6 | 0.6 | 0.45 <= res < 0.8 |
| 4 | 00100 | 1 | 1 | 0.8 <= res < 1.25 |
| 5 | 00101 | 1.5 | 1.5 | 1.25 <= res < 1.8 |
| 6 | 00110 | 2.1 | 2.1 | 1.8 <= res < 2.45 |
| 7 | 00111 | 2.8 | 2.8 | 2.45 <= res < 3.2 |
| 8 | 01000 | 3.6 | 3.6 | 3.2 <= res < 4.05 |
| 9 | 01001 | 4.5 | 4.5 | 4.05 <= res < 5.0 |
| 10 | 01010 | 5.5 | 5.5 | 5.0 <= res < 6.06 |
| 11 | 01011 | 6.6 | 6.6 | 6.06 <= res < 7.2 |
| 12 | 01100 | 7.8 | 7.8 | 7.2 <= res < 8.45 |
| 13 | 01101 | 9.1 | 9.1 | 8.45 <= res < 9.8 |
| 14 | 01110 | 10.5 | 10.5 | 9.8 <= res < 11.25 |
| 15 | 01111 | 12 | 12 | 11.25 <= res < 12.8 |
| 16 | 10000 | 13.6 | 13.6 | 12.8 <= res < 14.45 |
| 17 | 10001 | 15.3 | 15.3 | 14.45 <= res < 16.2 |
| 18 | 10010 | 17.1 | 17.1 | 16.2 <= res < 18.05 |
| 19 | 10011 | 19 | 19 | 18.05 <= res < 20.0 |
| 20 | 10100 | 21 | 21 | 20.0 <= res < 22.5 |
| 21 | 10101 | 23.1 | 23.1 | 22.5 <= res < 24.2 |
| 22 | 10110 | 25.3 | 25.3 | 24.2 <= res < 26.45 |
| 23 | 10111 | 27.6 | 27.6 | 26.45 <= res < 28.8 |
| 24 | 11000 | 30 | 30 | 28.8 <= res < 31.25 |
| 25 | 11001 | 32.5 | 32.5 | 31.25 <= res < 33.8 |
| 26 | 11010 | 35.1 | 35.1 | 33.8 <= res < 36.45 |
| 27 | 11011 | 37.8 | 37.8 | 36.45 <= res < 39.2 |
| 28 | 11100 | 40.6 | 40.6 | 39.2 <= res < 42.05 |
| 29 | 11101 | 43.5 | 43.5 | 42.05 <= res < 45.0 |
| 30 | 11110 | 46.5 | 46.5 | 45.0 <= res < 48.05 |
| 31 | 11111 | Do not use SV | Do not use SV | Do not use SV |

GPS Observation Block

The Observation Block Present bit (OBP) bit of the CMRx GPS Observation Header Block (FIG. 7) indicates if the receiver GPS observations are stored as part of the CMRx GPS Observation Data message body. The Observation Block has the form shown in FIG. 23.

The size of the GPS Observation Block depends primarily upon (a) the observation encoding modes and scales specified by the Definition Bits; and (b) the number and type of satellites stored in the observation block. Of course, the entire suite of observations may span more than one CMRx Observation/Modeling Data message. If so, the Epoch Continuation Flag of the CMRx GPS Observation Header Block will indicate that an epoch consists of more than one CMRx message.

GPS Observation Block Definition Bits

The format, content, and size of the GPS Observation Block depends upon the values of the first the GPS Observation Block Definition Bits. The format is illustrated in FIG. 24. Before continuing the description of the definition bits it is important to describe what is referred to herein as Major and Minor elements. These terms apply to all satellites within the CMRx message and to satellites on an individual basis. Major refers to those that apply to all satellite observations within a message, while Minor refers to those that apply on an individual satellite basis.

To illustrate the benefit, consider the phase-in approach of L2c. When L2c was first introduced into the GPS constellation, only a few satellites broadcast L2c. As new satellites were introduced into the constellation the number of satellites transmitting L2c increased. To accommodate L2c in the message, one could allocate an L2c slot for every satellite and send an indication of bad data for the L2c slot when the associated satellite does not broadcast L2c. During the early introduction period, however, it is more efficient to have L2c slots available in the message only for those satellites for which L2c data are being broadcast. For this reason, some Observation Type bits are considered as Major, as they apply to all satellites. One of the bit patterns of the Major L2c observation type indicates that one must look to the Minor L2c Observation bits to learn if L2c is present on that SV. As the number of L2c satellites increases, the CMRx format can be modified to using the L2c Major bit pattern, indicative that L2c is present on all satellites, and that therefore the Minor L2c bits are no longer present in the message. This approach gives an efficient transition from the introduction of new signals through full deployment of those signals.

Compression Level and Extended Compression Modes

The numbers of bits packed and precision of the data packed are dependent upon the types of observations stored in the message, the Compression Level, and the selection of Extended Compression Modes. There are 8 Code Compression Levels (bits 0 through 2 of the GPS Observation Block Definition Bits), 8 Carrier Compression Levels (bits 3 through 5 of the GPS Observation Block Definition Bits), and 4 Extended Compression Modes (bits 6 through 7 of the GPS Observation Block Definition Bits).

For compression levels, with each compression level increase, the number of bits required to store observations and the precision of the data stored generally decreases. A table later below describes these values and the compression levels. The compression levels serve various applications that use CMRx. They are set by the caller of the CMRx Encoder, and are dependent upon the application needs. For example, the demands on carrier resolution for general RTK purposes may be less than that needed for attitude determination. Furthermore, future GNSS receivers may be able to provide more accurate carrier measurements.

Bits 6 and 7 of the GPS Observation Block Definition Bits provide the settings of the Extended Compression modes.

When the decimal equivalent of these bits is 0, no Extended Compression Modes are enabled. When the Extended Compression Modes are enabled, the bits required and data precision storing the observations are reduced as per a table below.

The Extended Compression Modes take advantage of known physical quantities and store variations from expected values (variations due such things as multipath, orbit error, unmodeled troposphere, and unaccounted ionosphere). To reduce the number of required bits, the compression and decompression processes both are aware of satellite positions, antenna position, and receiver clock offsets for each CMRx epoch. The following provides an overview of these quantities for both the compression and decompression processes when the Extended Compression Modes are enabled.

Compression Process

Position. The position is entered by the user or selected from a table. The position within +/−50 meters is supplied to the compression process.

Clock Offset

The clock offset is known to approximately within 150 ns.

Navigation Messages

To compute the positions of the satellites, a source of navigation messages must be available. The ranges of the observable quantities stored in the CMRx message have been selected so as to make the compression and decompression processes insensitive to the IODE issues of broadcast navigation orbits. Thus, the navigation messages (broadcast or precise) used for the CMRx compression process need not be exactly the same as that used in the decompression process.

Decompression Process

Position

The decompression process obtains the position from local user entered coordinates, a table look up based upon Site ID and/or Site Name, or received as part of the CMRx message.

Clock Offset

The receiver clock offset is known by the decompression process at the same accuracy as that of the compression side.

Navigation Messages

To reconstruct the observation data, the decompression side must know the satellite positions. If the CMRx message being sent by the CMRx compression side includes orbital information, then the decompression side can use those received in the CMRx message. Alternative sources for navigation messages are from the local GPS receiver or Rapid Precise Orbits from the Internet.

When either, or both, CNR or ORB are set, the SV Cnt is present to indicate the number of SVs for which CNR or ORB data are present. The SVPRN lists the first satellite in the PRN word containing this data. Because the observations are stored sequentially within a message, when the SV Cnt indicates more than one SV, the SVPRN bits indicate the first SV for the count. The remaining SVs immediately follow in the GPS observation block. If the SV Cnt and SVPRN indicate more than one SV, for example, 4 SVs, and the PRNID indicated results in fewer than those that remain in the message to meet the SV Cnt (e.g., SVPRN indicates SV 22, and the SVs 1, 3, 5, 7, 22, 23, and 24 exist in the message, then the SV Cnt of 4 indicates that there should be 4 SVs but there are only SVs 22, 23, and 24 remaining in the message. Thus only those 3 will be contained in the message.

Troposphere/Ionosphere Corrections

For the Iono/Tropo Optimized Extended Compression Mode, further compression is obtained by removing a modeled troposphere from the observations before compression and a modeled ionosphere from each of the observations. To compute the ionospheric quantity, the receiver must be at least a dual frequency codephase receiver. In CMRx that means at least two of the bits related to L1, L2 and L5 data must be non-zero. For the troposphere, the same troposphere model should be used by the compression and decompression processes. The same troposphere and ionosphere models are used by the compression and decompression processes.

It is well known that the speed of propagation of GPS signals is slower through the lower part of the earth's atmosphere, than through a vacuum. The lower part of the atmosphere consists primarily of nitrogen, oxygen, and water vapor. Most of the water vapor is below 4 kilometers, with essentially all of it below 12 kilometers. The dry gases nitrogen and oxygen, however, occur in gradually thinning amounts as altitude increases to hundreds of kilometers. The overall effects of these atmospheric gases on a GPS signal is commonly referred to as the tropospheric effect. The result is that the satellite has an apparent range which is longer than its actual value.

In one implementation of CMRx, an approximation of the Hopfield model of the troposphere is used, with an assumed delay of 2.5 meters. The approximation is less computationally intensive, but is a close approximation when provided typical meteorological values. For the Extended Compression Mode, the troposphere model therefore provides only the difference between the assumed 2.5 meter delay and the actual troposphere delay as computed based on the elevation of the reference station.

```
//COMPUTE A NOMINAL TROPO DELAY: i.e., USING A NOMINAL
2.5 meter ZENITH DELAY - IF THE ELEVATION ANGLE IS LESS
THAN 2.5 DEGREES, THEN WE COMPUTE THE TROPO OF 2.5
DEGREES ELEVATION.//
dTropoEl = dSatElDegrees;
if (dTropoEl < 2.5) dTropoEl = 2.5;
dTemp = dPositionHeight_meters/5254.478;
dTemp = 2.31 * exp (−dTemp);
dTropoDelay = dTemp/sin (DegreesToRadians (dTropoEl))
```

Figure 25:
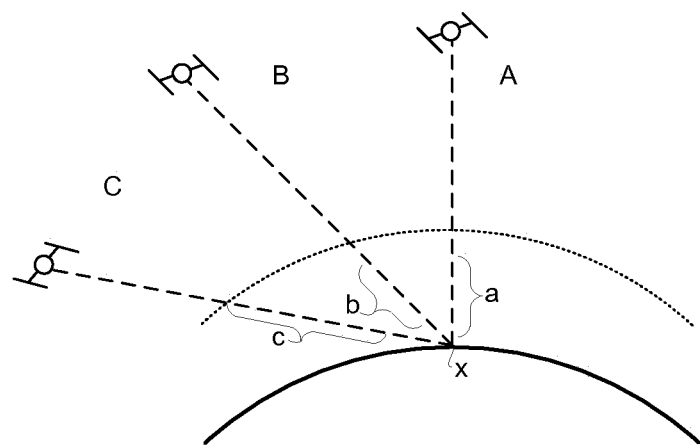
FIG. 25 is a illustrates a technique for compensating for ionosphere effects.

The ionosphere extends from about 50 km to about 1000 km above the earth. It is a region of ionized gases, caused primarily by the sun's radiation. The extent of the effect of the ionosphere on GPS signals depends on solar activity, time of day, and other factors. It is also well known that the effect of the ionosphere on GPS signals depends upon the relative orientations between the satellites and the location of the GPS receiver on the earth. This is illustrated in FIG. 25. As shown there, for a first satellite A directly overhead a point X, the GPS signals will pass through a portion of the earth's atmosphere designated "a." As also shown by the figure, as the satellite positions become closer to the horizon, the extent to which the GPS signal passes through the ionosphere increases. For example, satellite C, which is low in the sky, has a relative orientation to point X causing its signal to pass through a greater portion of the ionosphere, designated c in FIG. 25. In our system we reduce the amount of data to be sent by, with reference to FIG. 25, assuming satellite A will have no ionosphere delay, while satellite C will have a ionosphere delay of c-a, which is provided to the compression algorithm.

FIG. 25 shows the ionosphere as a thin homogeneous layer. In reality, the ionosphere is non-homogeneous (thicker at different pierce angles than at others) and varies over time. To reduce bits, CMRx treats the ionosphere as homogeneous by computing an average vertical ionosphere using the collective whole of dual-frequency (or multi-frequency) data at each epoch. This averaging is done to remove a large portion of the ionospheric effects on the signal. The remaining portion that is not removed is sent as the observation information (along with other unaccounted affects, such as troposphere and multipath) which the recipient, along with the average vertical ionosphere, then reconstructs the original observation.

To compute the ionosphere quantity, the receiver must be at least a dual frequency code-phase receiver (i.e., at least two of the bits related to L1, L2 and L5 data must be non-zero). For each satellite, the ionosphere observation is computed using the following equation (assuming L1 and L2 are used).

bGAMMASQ = (77.0/60.0)^2
dObservedIono = (dCodeObsL2 − dCodeObsL1)/(bGAMMASQ − 1.0)

These ionosphere observations are each mapped to the vertical (see satellite A in FIG. 25) so that an averaged vertical ionosphere can be computed. The following shows the algorithm used to map each observed ionosphere to the vertical:

dIonoSlntFact = 1.0 + 2.0 * pow ((96.0 − dSatElDegrees)/90.0, 3.0);
dVertObsIono = dObservedIono/dIonoSlntFact;

The compression algorithm can then average the vertically mapped ionosphere values. This vertically mapped average is then removed from the observations before the data are compressed (i.e., the averaged vertical ionosphere is then mapped back for each satellite according to its elevation and then that mapped quantity is removed from the observation). The value of this averaged vertically mapped ionosphere is sent as part of the message in the Iono/Tropo Optimized Window Block part of the Observation Block.

The following table describes the bit meanings of the extended compression modes.

| Field | Bits | Description |
|---|---|---|
| Ext. Mode | 2 | These bits designate "Extended" compression mode. |

| Value | Description |
|---|---|
| 00 | No Extended Mode (i.e., Standard Compression) |
| 01 | Extended Compression Mode |
| 10 | Iono/Tropo Optimized Extended Compression Mode |
| 11 | Reserved |

Observation Suite Bits

The Observation Suite bits of the GPS Observation Block Definition Bits (i.e., 8 through 19 of the GPS Observation Block Definition Bits—see FIG. 24) provide information about the GPS satellite observations stored in the GPS Observation Block of the message. As stated earlier, herein we use GPS and GNSS interchangeably. Each GNSS satellite constellation, however, employs different frequencies and code structures. As such, the types of observations carried for other constellations (such as GLONASS, Galileo, or Compass) differ from those of GPS. This means that Observation Blocks (which includes Observation Block Definition bits, observables stored in the message, etc.) differ among the various constellations. Nonetheless, the essential underlying bit savings/compression concepts are the same over the various CMRx messages for each GNSS constellation.

The Ref Code bits indicate the type of code phase used as the CMRx reference code. One principle of CMRx is its use of a reference code. CMRx stores a reference code per satellite and then all other observations for that satellite are stored with respect to that reference code. Reference codes are:

| Value | Description |
|---|---|
| 00 | L1 C/A is the reference code. |
| 01 | L2c is the reference code. |
| 10 | L5 is the reference code. |
| 11 | L1c is the reference code |

The RP bit indicates the Number of Ranges Present in the observation data of the GPS Observation Data Block.

| Value | Description |
|---|---|
| 0 | All Specified Codes Present (All Carriers Present) |
| 1 | Only Reference Code Present (All Carriers Present). |

The L1 C/A bit is only present if the Reference Code is not set to L1 C/A (i.e., when the reference code is L1 C/A then it is assumed that the L1 C/A data is present). This bit has the following meanings

| Value | Description |
|---|---|
| 0 | L1 C/A data present for each SV. |
| 1 | No L1 C/A data present in the observation data. |

The L2e bit indicates if L2e data is present.

| Value | Description |
|---|---|
| 0 | L2e data present for each SV. |
| 1 | No L2e data present in the observation data |

The L1e bit indicates if L1e data is present.

| Value | Description |
|---|---|
| 0 | L1e data present for each SV. |
| 1 | No L1e data present in the observation data. |

The L2c bits can be considered an L2c Major indicator. One bit combination implies that one must check the L2c Minor bit associated with each satellite in the satellite observation data. Note, however, that when L2c is selected as the reference code, these bits are not present in the definition bits. When L2c is the reference code, then all included observations preferably contain at least L2c code and carrier data.

| Value | Description |
|---|---|
| 00 | L2c data present for all SVs |
| 01 | No L2c data present |
| 10 | Individual SVs have minor header to indicate L2c |
| 11 | Reserved |

The L5 bits are the same as for the L2c, but apply to L5 data. The L1c bits are the same as those for L2c, but apply to L1c.

"Best of" Mode

The GPS "Best of" mode exploits the fact that many RTK applications process only code and/or one carrier data from a single track type for each frequency. This is particularly true during the phase-in of L2c and L1c GPS satellite capabilities. That is, even though a receiver can track and report L2E and L2c, for those SVs broadcasting both legacy L2 and modern L2c signals, the current typical RTK processing engines use only one of the two signals. Therefore, it is desired that CMRx, in these cases, provide the "Best Of" either L2E or L2c. Similarly, it is desired to send the "Best Of" L1 C/A and L1c, when GPS Satellites begin transmitting the L1c signal.

An application using the CMRx Encoder can enable or disable the "Best Of" mode as a configuration choice. When enabled, the CMRx Encoder detects, based upon the supplied epoch data, whether or not the "Best Of" mode should be used when packing the data. When used, special encoding is used by the Encoder to indicate if GPS L1 and/or L2 data are in this "Best Of" mode. The decoder knows that the mode is enabled by this special encoding.

"Unavailable" as used herein is intended to describe: (a) the epoch data supplied to the Encoder does not have a particular piece of data, either by pre-filtering or that the receiver did not track/report that data. For example, if L2c data is not present in the epoch data, then it could be that either the receiver did not track/report that data or that the data has been pre-filtered from the epoch data supplied to the CMRx Encoder, or (b) the configuration of the CMRx Encoder specifically indicates that L2c data is to be ignored. Thus for data to be considered available, both the observation data must be present in the epoch data supplied to the CMRx Encoder and the CMRx Encoder must be configured so as to allow that data.

When the CMRx Encoder is configuration to enable the L2 "Best Of" mode, it does not necessarily imply that the "Best Of" mode will be used. CMRx employs the following rules for the "Best Of" mode.

1. The L2 "Best Of" mode is disabled always when the CMRx Encoder is configured as such: i.e., the remaining rules will not apply as "Best Of" mode is disabled.
2. When the epoch data is supplied to the CMRx Encoder and there exists at least one GPS satellite where both L2E and L2c are available, the L2 "Best Of" mode is disabled for that epoch; this assessment is made by the encoder at the creation of each CMRx message.
3. If an L2 code is picked for the reference code, then either L2E or L1c will be picked. When an L2 tracking type is selected as a reference code, it is assumed that the configured reference code will be available for all GPS SVs; and the L2 "Best Of" mode will be disabled: i.e., it is disabled whenever any L2 track-type is selected as a reference code.

Similar to that of L2, a phase-in of L1c is planned for the GPS Constellation. The "Best Of" mode for L1 has similar rules, and is independent from that of L2 within the CMRx Encoder. The implementation for "L1" is the same as for "L2" but the "Best Of" mode for L1 is considered for only the L1C/A and L1c data. That is, when L1c is transmitted by a GPS satellite, the receivers can potentially track, and report, L1 C/A, L1c and L1E observables simultaneously. For receiver L1 data, L1E has a special meaning With respect to L1:

1. The L1 "Best Of" mode is disabled always when the CMRx Encoder is configured as such: i.e., the remaining rules will not apply as the "Best Of" mode is disabled.
2. If the epoch data provided to the CMRx Encoder contains any SV with L1E then the L1 "Best Of" mode will not be used.
3. When the epoch data is supplied to the CMRx Encoder and there exists at least one GPS satellite where both L1 C/A and L1c are available, the L1 "Best Of" mode is disabled for that epoch.
4. If an L1 code is picked for the reference code, then either the L1 C/A code, L1c code, or L1E code will be picked. When an L1 tracking type is selected as a reference code, it is assumed that the configured reference code will be available for all GPS SVs; and the L1 "Best Of" mode will be disabled for that epoch.

e. Supplemental Observation Tracking Information

The Supplemental Observation Tracking Information provides additional information regarding the L2c, L5, and L1c observation types, when they are present. These bits are used to indicate the type of code information being provided. The following approach is used. The values are in base 2.

| Field | Num. Bits | Value | Description |
| --- | --- | --- | --- |
| L2c | 2 | 00 | CL for L2c |
|  |  | 01 | CM for L2c |
|  |  | 10 | CM/CL for L2c |
|  |  | 11 | Reserved |
| L5 | 2 | 00 | I for L5 |
|  |  | 01 | Q for L5 |
|  |  | 10 | I + Q for L5 |
|  |  | 11 | Reserved. |
| L1c | 3 | 000 | BOC (1, 1) Pilot for L1c |
|  |  | 001 | BOC (1, 1) Data for L1c |
|  |  | 010 | BOC (1, 1) Pilot + Data for L1c |
|  |  | 011 | MBOC (1, 1) Pilot for L1c |
|  |  | 100 | MBOC (1, 1) Data for L1c |
|  |  | 101 | MBOC (1, 1) Pilot + Data for L1c |
|  |  | 110 | Reserved |
|  |  | 111 | Reserved |

In the above table, there are supplemental information bits for L2c, L5, and L1c. These are present in the GPS Observation Block Definition Bits if the bits of the Observation Suite (i.e., either the Reference Code or the bits for L2c, L5, or L1c) so indicate. For example, if the combination of the Observation Suite bits indicate that L2c and L1c are present, then there will only be associated supplemental bits for these types, and there will be no supplemental bits for L5 ).

Carrier-to-Noise Ratio Present Bit, Orbits Bit, and SVPRN

Carrier-to-Noise (or Carrier-To-Noise Ratio) and Orbit information are generally considered unassociated. To conserve space CMRx combines some elements. Carrier-to-Noise and precise orbital information are said to be rolled in CMRx. That is, there are modes where CMRx does not attempt to send the data for every SV at every epoch. Rather, the data is sent for one or several satellites, but not all, per epoch. We can then roll all satellites through as successive epochs are sent.

The meaning of the CNR bit within the Observation Block Definition Bits (base 2) is:

| Bit Pattern | CNR Meaning |
| --- | --- |
| 0 | No CNR Present. |
| 1 | CNR Data Present. |

The meaning of the ORB bits within the Observation Block Definition Bits is:

| Bit Pattern | ORB Meaning |
| --- | --- |
| 00 | No Orbits Present. |
| 01 | Reference mode Orbits and/or clock biases Present |
| 10 | Relative mode Orbits and/or clock biases Present |
| 11 | Reserved |

Because Carrier-to-Noise and orbit information are combined for this rolling, if either the CNR or ORB bits are set, then the SV Cnt bits will be present in the Observation Block Definition Bits, but the presence of SVPRN bits will depend upon the value of the Sv Cnt bits. The rolling described above requires that identification of the satellites rolled with each epoch. This is achieved with two values: Sv Cnt and SVPRN. Sv Cnt, which is coded, indicates the number of SVs being sent. Preferable base 2 values of Sv Cnt are as follows:

| Value | Description |
| --- | --- |
| 00 | Information for One SV is present |
| 01 | Information for 4 SVs Present |
| 10 | Information for 8 SVs Present |
| 11 | Information for all SVs Present |

When the Sv Cnt value indicates the ALL SVs mode (i.e., the value is $11_2$) then there is no need to have the SVPRN information. When Sv Cnt indicates one SV, then the meaning of SVPRN identifies the single satellite with the indicated Carrier-to-Noise and/or orbit information. When Sv Cnt indicates more than one SV, but not all SVs, then the SVPRN identifies the first satellite having that information. Because CMRx stores observations in increasing order as identified by the SVPRN Word(s), the IDs of the other satellites are known containing the indicated Carrier-to-Noise and/or orbit information. When the SV Cnt indicates a number that is larger than the remaining number of SVs in the message, however, the packing or unpacking of carrier-to-noise and/or orbit information is stopped once the highest ID is reached.

The CNR bit of the GPS Observation Block Definition Bits indicates whether or not CNR data (i.e., carrier to noise ratios) will be found in the Observation Data: i.e., a value of 1 indicates present and 0 indicates that no CNR data are present. Additionally, the values of Sv Cnt and SVPRN, which are also part of the definition bits, indicates which and how many SVs will have this data. For each SV containing the data, Carrier-to-Noise information will be stored as part of the data for each frequency/tracking type.

Similar to that stated in the preceding paragraph, the presence of precise orbit data is indicated by the combination of the ORB, SV Cnt, and SVPRN bits of the Observation Block Definition Bits. Unlike that of the CNR values, however, there will be only one occurrence of precise orbital information per SV that is indicated to have orbit information.

Encoder Selection of CNR and ORB Satellites

When CNR or ORB data are to be present in a message, the CMRx Encoder uses an "oldest first" approach when selecting the first satellite. This "oldest first" considers the first satellite with respect to the remaining satellites. For example, if the oldest SV is 21 in the message containing SVs 1, 2, 5, 7, 10, 12, 18, 21, 23, 24, and 26, and the Sv Cnt indicates 8 SVs, then the one picketed as the first SV will be SV 7, which will include SV 21.

The CMRx Encoder uses a priority scheme based upon the combination of ORB and CNR data that are to be present. When Orbits are to be included in the message, it determines if any Orbit data should be present for the current message. Then, if no Orbits are to be included but CNR is to be included, it picks the oldest based upon the satellite having the longest time since CNR was sent. Thus, whenever both CNR and Orbits are to be included, the "oldest" satellite based on the longest ago sent orbit information will always be selected, but CNR and Orbit data will both be present for each SV as indicated by the Sv Cnt and SVPRN bits.

Decoder Handling of Satellites with CNR and ORB

When a CMRx Decoder encounters an SV with CNR data, the extracted CNR value should be held, and then prorogated forward with each successive epoch received/decoded until either a timer expires or a new CNR value is extracted for that SV. The CMRx Decoder propagates these forward for up to 30 seconds. This is done primarily because the CNR data is used for diagnostics. If more precise or timely data is needed, then the modes of the Sv Cnt are used that result in more frequent data.

Continuous Tracking Counter Present Bits

The CTC Present Bits of the GPS Observation Block Definition Bits indicate whether or not continuous tracking counter data is in the Observation Data. A non-zero value indicates present and 0 indicates that CTCs are not preset. Even when the CTC Present bits indicate that no CTC will be present in the message, there is a per-SV cycle-slip flag present with the observation data. The cycle-slip bit indicates a slip in at least one observation type and any decoders treat that as a cycle-slip across all observations for that SV. When the CTC Present bits indicate the presence of CTC data, the Master CTC will also be present in the GPS Observation Block Definition Bits. The Master CTC is a 6-bit value that is used to express an elevation angle between 0 and 90 degrees.

An objective of CMRx is to reduce the number of bits required to carry GNSS information. In doing so CMRx provides the recipient with a compressed message containing enough information to allow the recipient to decompress and determine the content of the original source observation data.

There is the question of loss of lock counters and continuous tracking counters, which are used by recipients to learn of loss in continuity of tracking. These values are time dependent information. The reality, however, is that losses and corruptions of messages occur as they are communicated over various mediums.

An important element of lock counters and continuous tracking counters is that some message structures do not permit cases of data being flagged as cycle-slip free when the data could contain such. For example, consider a continuous tracking counter that is 3 bits long and is incremented with each epoch as long as tracking is maintained (but stops when the value reaches 7), that is it resets to zero whenever tracking is not continuous. Further, suppose an epoch interval of 1 second. Thus the counter will reach a value of 7 in 8 seconds from the first zero value. The counter then remains at 7 as long as tracking is maintained. To highlight a problem with such an approach from a messaging point of view, let us suppose that we have a radio link and the counter was 7 just before we lost communications and it was 7 when communications were reestablished 3 seconds later. In this case, there were no cycle-slips in the raw observations even though we did not receive all epochs of data. Now suppose that the communication outage was 9 seconds or more. We can make no assumptions regarding the continuity of the data. For example, the GNSS receiver could have immediately lost track and then regained it 0.5 seconds later.

The Continuous Tracking Counter (CTC) approach used within CMRx resolves the concerns raised above. Specifically, it reduces the number of overall bits while giving good information even in poor environments. The CTC provides enough information regarding continuous tracking to bridge communications outages, yet reduces the number of required bits. For those cases where continuous tracking is not clear, the decoding process must assume the worst and flag that data as having had a cycle-slip.

The size of and meaning of the CTC value depends upon the dynamics of the CMRx Encoder. The dynamics are indicated by the KIN (or kinematic) flag in the Header Block of the CMRx Observation Data Messages. Both the size of and the meaning of the CTC data depend on the state of the KIN flag.

In CMRx regardless of the static or dynamic motion indicator in the Header Block, there are two CTC indicators, assuming that the CTC Present bits of the GPS Observation Block Definition Bits indicates that CTCs are present. Next we describe the CTC implementation.

Master CTC Indicator

The master indicator (CTC) is an elevation value found in the beginning of the Observation Data Block of the message. It represents the elevation value of the lowest satellite being tracked by the base station over a specified period, e.g. over the preceding X minutes. By knowing this is the elevation value for the lowest satellite, the receiving station knows that the base station has tracked all other satellites having a higher elevation over the same time period. Due to their higher received signal power satellites with higher elevations are less likely to suffer from a loss of continuous signal tracking than satellites with lower elevations. Thus the choice of the lowest elevation maximizes the probability of identifying a largest first set of continuously tracked satellites. Thus the CMRx Decoder in the remote station can determine which satellites have been continuously tracked by the base station for at least X minutes. The value of X will be changed based upon the static or dynamic mode. (Static receivers are less likely to suffer from a loss of continuous satellite signal tracking, thereby making a higher value of X more suitable). The Master indicator (CTC) applies across all frequencies and tracking loops being reported for the suite of inclusive satellites developed using the Master CTC. This allows the CMRx Decoder at the receiving station to go out of radio coverage, or have no good messages, for X minutes and still know the first set of which satellites which have been continuously tracked over that time interval. This leads into the concept of the secondary determination of which satellites are continuously tracked by means of the Minor CTC for one or more intervals. Rather than send the elevation value of the lowest satellite, however, one could send other equivalent information, for example, the identification of the lowest satellite.

In an implementation, however, it is desirable to avoid round-off errors due to slight precision differences in CMRx Encoder device to satellite elevation computations between those computed at the base as compared with those computed at the CMRx Decoder. To avoid such complications, during the decoding process, at least 1 degree is added to the elevation computed for this purpose. In addition, the master CTC indicator is able to store the value 90. When this flag indicates 90 degrees, it indicates that there are no satellites meeting this X minutes continuous tracking requirement. During decoding this allows knowing which satellites have maintained continuous tracking for X minutes. Thus, if a communication outage exists for a period less than X minutes, the CMRx Decoder knows exactly which satellites have not had cycle slips during the outage period. On the other hand, should communications be lost for more than X minutes, the CMRx Decoder assumes loss of continuity and flags all satellites as having had loss of continuity.

Minor CTC

The Minor CTC bit(s) exist on all satellites and frequencies. This flag provides indications of continuous tracking for no, or very short, communications outages. For example, assume the Minor CTC is a one bit flag which becomes 1 once a satellite has been continuously tracked for 16 seconds. Also assume it resets to zero with each cycle-slip reported by the receiver. Thus for a short period of less than 16 seconds, there can be communications outages, and therefore it is known which satellites were tracked over that outage period. Specifically, if the outage was less than 16 seconds and the Minor CTC had a value of 1 before and after the outage, then that satellite maintained continuous tracking over that period. If the Minor CTC before or after the outage changed from 1 to 0, then assume loss of continuity. Although this does not handle gaps larger than 16 seconds, the Master CTC helps. For those corruption/outage periods that last longer than 16 seconds, the Master CTC will list those satellites that have maintained lock over that period.

Major and Minor CTC Interplay

The combination of the Major and Minor CTC values as presented above, result in a high vulnerability period of 16 seconds during startup. That is, if a CMRx Decoder receives data being reported by a CMRx Encoder when that source is initially turned on, it cannot assume any continuous tracking for the first 16 seconds. In particular the Master CTC will be set to 90 degrees and all Minor CTCs will be set to zero. The CMRx Decoder assumes that tracking has not been continuous. There is also vulnerability for communication outage periods beyond the size of the Master CTC. If the CMRx Decoder does not receive messages from the CMRx Encoder within the period of the Master CTC, then it assumes that continuous tracking was not maintained. All satellites are considered as having had a cycle-slip.

Another vulnerability occurs when the CMRx Encoder is located in an area that provides poor or partially obstructed tracking. For example, consider a northern hemisphere reference station placed in a location where there is a high elevation obstruction to the south. During certain portions of the day, the Master CTC will provide limited utility because the number of satellites above that indicated by the Master CTC may not be enough to bridge cycle-slips encountered over a communication outage. Another vulnerability occurs at startup due to the interplay of the Master and Minor CTC. For example, with a 1 bit Minor CTC meaning 16 seconds when set, and a Master CTC meaning 10 minutes, there is a period of uncertainty when there is loss of data for more than 16 seconds. In this case the CMRx Encoder has not been on long enough to reach the 10 minute Master CTC. Thus, any CMRx Decoder loosing messages during this startup for more than 16 seconds must assume cycle-slips.

Minor CTC Improvement

To reduce the vulnerabilities described above, CMRx provides a special meaning of the carrier phase observable within CMRx messages. To provide a "bad flag" the interpretation of the single-bit Minor CTC described above where a single bit Minor CTC value of 0 or 1 implies a 60 second tracking Consider the following table:

| Minor CTC Value [base 2] | Carrier Flagged (good/bad) | Meaning |
|---|---|---|
| 0 | Bad | Slip in carrier observation in last 4 seconds |
| 0 | Good | Receiver has maintained lock for at least 4 seconds |
| 1 | Good | Receiver has maintained lock for at least 60 seconds. |
| 1 | Bad | Simply a bad carrier observation: i.e., we don't care, for the purpose of cycle-slip flagging, if the carrier is good or bad. |

Improved Static 1-Bit Minor CTC

The above table only applies to those SVs not covered by the Major CTC. Thus, whenever the CMRx decoder finds the Minor CTC=0 and bad carrier flagging, it indicates a cycle slip. When the Minor CTC=0 and carrier is flagged as good, the receiver has tracked for at least 4 seconds. This means that if the decoder has a message gap of less than 4 seconds, then it clearly understands if there was a slip during the message gap. When the Minor CTC=1, it means the receiver has maintained lock for at least 60 seconds.

CTC in GPS Observation Block Definition Bits

Next the CMRx implementation of the CTC is described. The CTC Present bits within the GPS Observation Block Definition Bits serve two purposes: (1) to indicate if CTC is in use and (2) to indicate the number of bits used in the Minor CTC. Whenever the CTC is in use, there will be a Major CTC. When the two bits for CTC Present are set to $00_2$ then no CTC is present in the message. In this case, there will be a single cycle-slip flag for each SV that applies to all frequency/track-type carrier observables of that satellite.

When the CTC Present bits are non-zero, then look-up tables are used in the CMRx Encoder and Decoder to determine the number of bits used, and the meaning of the Minor CTC associated with each satellite. These look-up tables differ depending upon the value of the KIN flag (discussed below) of the GPS Observation Header Block.

Static Source

If the CMRx Encoder is a static site, the Master CTC will pertain to those satellites that have maintained lock for the past 10 minutes. The Master CTC will be a number stored in 6 bits. The least-significant bit roughly equivalent to 1.421875 degrees: i.e., $91/2^6$, with 91 in the computation to inclusively handle all angles from 0 to 90. When all bits are set to 1 (i.e., the pattern is $111111_2$) it means 90 degrees, and that no satellites have been tracked for the past 10 minutes.

The Minor CTC sizes and meaning are based upon whether the CTC Present Bits of the Observation Block definition bits are zero. When they are zero, no Major or Minor CTC bits are present in the message. Instead there is a single bit cycle-slip flag on a per satellite basis. This flag applies to carriers of all frequency/track-types for that satellite. It is set to 1 when there is a cycle-slip between an epoch and the previous one sent in CMRx. When the CTC Present Bits of the Observation Block definition bits store a non-zero value, look-up tables determine the size and meaning of each Minor CTC associated with each carrier frequency/track-type.

Static Minor CTC when CTC Present is 01

When the two bits of the CTC Present bits within the GPS Observation Block Definition bits have a value of 01 (and the KIN bit of the GPS Observation Header Block indicates a static source), then there is one Minor CTC bit with each carrier frequency/track-type, as shown below.

| Minor CTC Value [base 2] | Carrier Flagged (good/bad) | Meaning |
|---|---|---|
| 0 | Bad | Slip in carrier observation in last 4 seconds |
| 0 | Good | Receiver has maintained lock for at least 4 seconds |
| 1 | Good | Receiver has maintained lock for at least 60 seconds. |
| 1 | Bad | A bad observation |

Static Minor CTC when CTC Present is 10

When the two CTC Present bits within the GPS Observation Block Definition bits have a value of 10 (and the KIN bit of the GPS Observation Header Block indicates a static source), then there will be a 2-bit Minor CTC bit with each carrier frequency/track-type, as shown below.

| Minor CTC Value [base 2] | Carrier Flagged (good/bad) | Meaning |
|---|---|---|
| 00 | Bad | Slip in carrier observation in last 4 seconds |
| 00 | Good | Receiver maintained lock on SV for 4 seconds. |
| 01 | X | Receiver has maintained lock for at least 8 seconds (we don't care, for the purpose of cycle-slip flagging, if the carrier is good or bad). |
| 10 | X | Receiver has maintained lock for at least 16 seconds (we don't care, for the purpose of cycle-slip flagging, if the carrier is good or bad).. |
| 10 | X | Receiver has maintained lock for at least 32 seconds (we don't care, for the purpose of cycle-slip flagging, if the carrier is good or bad). |

The above bit pattern is used to describe the duration of continuous tracking on a single satellite and frequency/tracking-loop. As an example of the utility, assume that the CMRx Decoder does not receive any messages for 15 seconds. If the Minor CTC was set to 10 [base 2] on the last message just prior to the communication loss and then set to 01 when communications were reestablished, then continuous tracking was not maintained. If the Minor CTC was set to 10 when communications was reestablished, however then tracking was continuous over the communication outage.

Static Minor CTC when CTC Present is 11

When the two CTC Present bits within the GPS Observation Block Definition bits have a value of 11 (and the KIN bit of the GPS Observation Header Block indicates a static source), then there will be a 2-bit Minor CTC with each carrier frequency/track-type, as shown below.

| Minor CTC Value [base 2] | Carrier Flagged (good/bad) | Meaning |
|---|---|---|
| 00 | Bad | Slip in carrier observation in last 8 seconds |
| 00 | Good | Receiver maintained lock on SV for 8 seconds. |

-continued

| Minor CTC Value [base 2] | Carrier Flagged (good/bad) | Meaning |
|---|---|---|
| 01 | X | Receiver has maintained lock for at least 16 seconds (we don't care, for the purpose of cycle-slip flagging, if the carrier is good or bad). |
| 10 | X | Receiver has maintained lock for at least 32 seconds (we don't care, for the purpose of cycle-slip flagging, if the carrier is good or bad).. |
| 10 | X | Receiver has maintained lock for at least 64 seconds (we don't care, for the purpose of cycle-slip flagging, if the carrier is good or bad). |

Kinematic Source

If the CMRx Encoder is a dynamic (moving) site, the Master CTC will pertain to those satellites that have maintained lock for the past 10 minutes. The Minor CTC size and meaning/is primarily based upon whether or not the CTC Present Bits of the Observation Block definition bits are zero or non-zero. When they are zero, no Major or Minor CTC bits are present in the message. Instead there will be a single bit cycle-slip flag on a per satellite basis. This flag applies to carriers of all frequency/track-types for that satellite. It will be set to 1 whenever there is a cycle-slip between this epoch and the previous one sent in CMRx. When the CTC Present Bits of the Observation Block definition bits store a non-zero value, look-up tables determine the size and meaning of each Minor CTC associated with each carrier frequency/track-type. These are described in the tables which follow.

Kinematic Minor CTC when CTC Present is 01

When the two bits of the CTC Present bits within the GPS Observation Block Definition bits have a value of 01 [base 2] (and the KIN bit of the GPS Observation Header Block indicates a kinematic source), then there will be a 3-bit Minor CTC bit with each carrier frequency/track-type as shown below.

| Minor CTC Value [base 2] | Carrier Flagged (good/bad) | Meaning |
|---|---|---|
| 000 | Bad | Slip in carrier observation in last 1 second. |
| 000 | Good | Receiver has maintained lock for at least 1 second. |
| 001 | X | Receiver has maintained lock for at least 2 seconds |
| 010 | X | Receiver has maintained lock for at least 4 seconds |
| 011 | X | Receiver has maintained lock for at least 8 seconds |
| 100 | X | Receiver has maintained lock for at least 16 seconds |
| 101 | X | Receiver has maintained lock for at least 32 seconds |
| 110 | X | Receiver has maintained lock for at least 64 seconds |
| 111 | X | Receiver has maintained lock for at least 128 seconds |

Kinematic Minor CTC when CTC Present is 10

When the two bits of the CTC Present bits within the GPS Observation Block Definition bits have a value of 10 [base 2] (and the KIN bit of the GPS Observation Header Block indicates a kinematic source), then there will be a 2-bit Minor CTC bit with each carrier frequency/track-type as shown below.

| Minor CTC Value [base 2] | Carrier Flagged (good/bad) | Meaning |
|---|---|---|
| 00 | Bad | Slip in carrier observation in last 4 seconds |
| 00 | Good | Receiver maintained lock on SV for 4 seconds. |
| 01 | X | Receiver has maintained lock for at least 8 seconds |
| 10 | X | Receiver has maintained lock for at least 16 seconds |
| 10 | X | Receiver has maintained lock for at least 32 seconds |

Kinematic Minor CTC when CTC Present is 11

When the two bits of the CTC Present bits within the GPS Observation Block Definition bits have a value of 11 [base 2] (and the KIN bit of the GPS Observation Header Block indicates a kinematic source), then there will be a 3-bit Minor CTC bit with each carrier frequency/track-type as shown below.

| Minor CTC Value [base 2] | Carrier Flagged (good/bad) | Meaning |
|---|---|---|
| 000 | Bad | Slip in carrier observation in last 0.5 seconds. |
| 000 | Good | Receiver maintained lock on SV for 0.5 seconds. |
| 001 | X | Receiver has maintained lock for at least 1 second |
| 010 | X | Receiver has maintained lock for at least 2 seconds |
| 011 | X | Receiver has maintained lock for at least 4 seconds |
| 100 | X | Receiver has maintained lock for at least 8 seconds |
| 101 | X | Receiver has maintained lock for at least 16 seconds |
| 110 | X | Receiver has maintained lock for at least 32 seconds |
| 111 | X | Receiver has maintained lock for at least 64 seconds |

Orbits Major Block

CMRx Orbits have two major modes and two key elements. The two major modes are loosely called "Reference mode" and "Relative mode." The two key elements carried as part of the orbit data are: (a) Satellite Positions and (b) Satellite Clock data (as pertaining to satellite clock errors). The mix of what elements are provided in a single message is optional and based upon the application needs. Furthermore, between CMRx messages, the orbit mode can change. For example, one might choose to send Reference mode orbits and clocks every 15 seconds and Relative mode clocks every 5 seconds.

Before describing each mode, some discussion regarding the general concepts of Reference mode as opposed to Relative mode is appropriate. We also will describe message time tags as they relate to orbit/clock data. Furthermore, terms describing ambiguous data also need to be introduced.

Reference mode is a mode in which more complete data is sent. It is more complete in that it does not depend on other data being transmitted. In this mode there can be only slow clock, only slow satellite positions, or both. In both Reference mode and Relative mode, data is sent as to precise orbits. The difference is merely in the size of the ambiguity and resolution. There is higher resolution in Relative mode to reduce the compounding quantization effects. For Relative mode fewer bits are used, and normally higher resolution is used.

When considering orbits and satellite clock errors, there is a need to know a reference time of that data. In CMRx Observation messages, the time tag in the header reflects the epoch time. For the satellite observation data within the message, this time means time of receipt. The orbit data contained in that same Observation Message, however, is computed so that the satellite positions and clocks are at the time indicated in the header. For CMRx satellite clocks, relativistic corrections are considered as applied. No Sagnac correction is needed as the frame of CMRx orbit positions are with respect to the satellites, ignoring earth's rotation.

The terms nudged orbits, nudged clocks, or nudged orbits/clocks refer to and are described by Dr. Benjamin Remondi in "Conveying Orbit Information via Ambiguous Position Information," U.S. Pat. No. 7,737,888, and "Nudged Broadcast Orbit Drift Correction," U.S. Pat. No. 7,737,887, the contents of both of which are incorporated by reference. Those patents describe a process where adjustment of a broadcast orbit and/or its clock data is made to fit ephemeral elements. For example, by receiving a precise orbit X, Y, and Z ephemeral position, one can adjust a broadcast orbit to better fit the precise orbit at the time of the ephemeral X, Y, and Z data. By receiving two such ephemeral points (preferably separated in time by, often up to 30 seconds, drifts can be accounted for in this nudging process. This approach allows one to use a nudged orbit for a minute without seeing much separation between the actual precise orbit and the satellite position computed using the nudged orbit. This same process can be applied to the clocks.

Single-nudged is used to describe the broadcast orbit nudged based upon the receipt of just one precise ephemeral message, or too much time between receipt of two. Double-nudged is used to describe the broadcast orbit nudged based upon the receipt if at least two precise ephemeral messages. Reference mode is normally required for the very first precise ephemeral message, and is used to generate a single-nudged orbit and/or single-nudged clock. Reference mode or Relative mode can be then used to generate the double-nudged data.

There is a concept of ambiguous data. Consider just the X component of satellite position in Reference mode. The CMRx Encoder can "fmod" the precise orbit X value by, for example, 1000 meters and hold the remainder Rx (the ambiguous value) in the message. In other words, the position is the remainder of the precise orbit X value when divided by 1000. The decoder does not have the precise orbits, but does have the broadcast orbits. Clearly broadcast orbits are better than 1000 meters, so the decoder computes the position of the satellite from the broadcast orbits and then truncates that value to a 1000 meters (i.e., BaseX=floor (X/1000.0)* 1000.0). Stated simplistically, the decoder then obtains the reconstructed value as BaseX+Rx.

The actual algorithm for reconstruction, however, takes into consideration differences that may exist between computations at encoder and those at the decoder (such as broadcast IODE differences between the encoder and decoder). As such, the decoder actually implements a for-loop, adjusting BaseX by 1000.0 meters in each iteration, being sure to encompass 1000.0 multiples above and below the initial value of BaseX through exercising the for-loop, stopping when BaseX+Rx is within 500.0 meters of the broadcast orbit computed value.

For Relative mode orbits and clocks, the encoder assumes that the decoder has at least a single-nudged orbit. In the example, 1000.0 meters base value was used to form this ambiguous value. In CMRx, however, the base value can be chosen differently is referred to as an "Ambiguity Window". Furthermore, because we assume that in the Relative mode ambiguity resolution process by the decoder will have access to at least single-nudged orbits and/or single-nudged clocks, the ambiguity size of Relative mode will be smaller (i.e., reducing the number of bits required to send Relative mode data).

Selecting Oldest-First Satellite

We described the selection of "oldest first" when referring to SVs being considered for CNR and Orbit data inclusion in the CMRx message. Orbit data has priority over CNR data because the orbit data is considered more vital than CNR data. The CMRx Encoder is configured with a Reference mode rate, a Relative mode rate, and the number of desired SVs per message/epoch.

The Reference mode rate is typically less frequent than that of Relative mode. For example, one can configure the Reference mode rate at 12 seconds and the Relative mode at 6 seconds. Given that 12 is a multiple of 6, the Relative mode data appears to conflict with the Reference mode data. When such a conflict occurs, the CMRx encoder will pick the Reference mode over Relative mode. The Reference mode and Relative mode data do not coexist in the same message. Thus, the CMRx Encoder first looks to find the oldest time of previously sent Reference mode data, with respect to the current time. If it finds this oldest data as equaling or exceeding the specified Reference mode rate, then it selects that SV as the "oldest" and indicates Reference mode data will be used. It then does the same process for Relative mode. If at the end, it finds no "oldest" satellites to report for either Reference or Relative mode, it reports to the "oldest" satellite selection process that it has none for the orbit data. That satellite selection process may then, if the CNR output mode is selected, find the oldest CNR data).

Orbits Major Data

As described, there are "Major" and "Minor" orbit/clock data elements. Those elements in the Orbits Major Block pertain to all SVs having orbit/clock data within the message. The SV Minor Orbit Data is information that pertains to specific SVs within the Observation Data Block of the message. Within this section, the Major Orbit data for both Reference mode and Relative mode orbit/clock information present in the message is described. That is the information that is applicable to all SVs having orbit data within the message is described.

The Orbits Major Data indicates which elements are to be provided (i.e., orbit XYZ and/or clocks), as well as their size and precision levels for all satellites having orbit data. As explained above, the Sv Cnt and SVPRN bits of the Observation Block Definition Bits describe which satellites will have these orbital elements in the Minor Orbit Data. Which elements are provided, precision levels, and sizes are all specified by the application using the CMRx Encoder. The "which elements are provided" and "precision levels" are application dependent. For example, the precision of PPP orbits/clocks is generally higher than that needed for an RTK type application: i.e., differential orbital accuracy needs are much less than would be needed in a PPP case. Thus, the CMRx Encoder allows the user to set these configurations. The "Ambiguity Window size" is also settable as part of the configuration.

For example, assume that a network of GNSS receivers is in place to compute and determine the Precise Orbits that it wants to broadcast to a user(s). Further, suppose this network has been in place for a year. That network could determine the maximum difference between any broadcast orbit and the precise orbits (considering overlaps at IODE changes). To start the process, however, one might consider setting the initial Ambiguity size to a large value. It could then adjust the Ambiguity Window Size on-the-fly accordingly (something like 2 times the size of the maximum delta observed). In this way, the network can constantly adjust the Ambiguity Window sizes so as to optimally use the bandwidth, while being protected at start-up. The orbits Major data uses the format shown in FIG. 26.

The general meaning/interpretation the bits for the Reference mode and Relative mode Major orbit data are generally the same. The discussion of each can be found in the subsections that follow.

Reference Mode Orbits Major Data

The table below describes the elements of the Orbit Major Block for Reference mode.

| Item | Bits | Description |
| --- | --- | --- |
| XYZs Present | 1 | When set to 1, there will be satellite positions (XYZs) present in the SV Minor Orbit Data for each designated satellite. A value of 0 means that there will be no satellite positions in the SV Minor Orbit Data. |
| Clock Present | 1 | When set to 1, there will be satellite clock data present in the SV Minor Orbit Data for each designated satellite. A value of 0 means that there will be no satellite clock data in the SV Minor Orbit Data. |
| XYZs Ambiguity Window | 4 | Ambiguity Window = $2^{N+4}$ (millimeters), where N is the integer value of the 4 bits. N = 0 to 15 provides a range of the ambiguity window of 16 to 524288 mm. These bits are only present if the XYZs Present bit indicates that satellite positions are present. When they are present, these bits describe the Ambiguity Window Size for the position XYZ values. When combined with the XYZs Precision indication this provides the size of each X, Y and Z component stored. |
| XYZs Precision | 4 | XYZ Precision = $2^M$ (millimeters), where M is the integer value of the 4 bits. Thus, N = 0 ... 15, giving a range of the precision of XYZ values of 1 ... 32768 mm: i.e., the precision of the LSB. These bits are only present if the XYZs Present bit indicates that satellite positions are present. This value provides the precision of the XYZ orbit data. |
| Clock Source Flag | 1 | This flag is only present if the Clock Present bit indicates that satellite clocks are present. The flag indicates the source of the clock information contained within the minor data. The values of the flag and their meanings are:<br>Value Meaning<br>0 Clocks are Standard satellite clock errors<br>1 Clocks are phase derived |
| Clock Ambiguity Window | 4 | These bits are only present if the Clock Present bit indicates that satellite clocks are present. The expansion is the same as that for the XYZs Ambiguity Window. |
| Clock Precision | 4 | These bits are only present if the Clock Present bit indicates that satellite clocks are present. The expansion is the same as that for the XYZs Precision. |

Relative Orbits Major Data

The table below describes the elements of the Orbit Major Block for Relative mode.

| Item | Bits | Description |
| --- | --- | --- |
| XYZs Present | 1 | When set to 1, there are satellite positions (XYZs) present in the SV Minor Orbit Data for each designated satellite. A value of 0 means that there is no satellite positions in the SV Minor Orbit Data. |
| Clock Present | 1 | When set to 1, there are satellite clock data present in the SV Minor Orbit Data for each designated satellite. A value of 0 means that there is no satellite clock data in the SV Minor Orbit Data. |
| XYZs Ambiguity Window | 4 | Ambiguity Window = $2^{N+4}$ (millimeters), where N is the integer value of the 4 bits. Thus, N = 0 to 15, gives a range of the ambiguity window of 16 to 524288 mm. These bits are only present if the XYZs Present bit indicates that satellite positions are present. |
| XYZs Precision | 4 | XYZ Precision = $2^M$ (millimeters), where M is the integer value of the 4 bits. Thus, N = 0 to 15, gives a range of the precision of XYZ values of 1 to 32768 mm: i.e., the precision of the LSB. These bits are only present if the XYZs Present bit indicates that satellite positions are present |
| Clock Source Flag | 1 | This flag is only present if the Clock Present bit (described earlier in this table) indicates that satellite clocks are present. The flag indicates the source of the clock information contained within the minor data. The values of the flag and their meanings are as follows:<br>Value Meaning<br>0 Clocks are Standard satellite clock errors.<br>1 Clocks are phase derived. |
| Clock Ambiguity Window | 4 | These bits are only present if the Clock Present bit indicates that satellite clocks are present. The expansion is the same as for the XYZs Ambiguity Window, but applies to the clock. |
| Clock Precision | 4 | These bits are only present if the Clock Present bit indicates that satellite clocks are present. The expansion is the same as that for the XYZs Precision, but applies to the clock. |

PRN Observations

As stated earlier, the number of bits required for each satellite depends upon the options set in the Observation Block Definition Bits (FIG. 24). The number of satellites, and the order in which those satellites are stored, is indicated by the PRN Word, in order of increasing PRN ID. The general form of satellite observation data within CMRx is shown in FIG. 27, and the general form of the information compressed on a per satellite basis is depicted in FIG. 28. Information regarding the observations for the reference frequency/tracking type (i.e., Ref Mnr CTC, Ref CNR Data, Ref Code Obs, and Ref Carr Obs) are stored before the observations from other frequency/tracking types.

In the FIGS. 27 and 28, only the code and carrier data for the reference observation type is required. The GPS Observation Block Definition (FIG. 24) describes which frequency/tracking type is used as the reference for the GPS Observations. The data associated with that reference frequency/track type are stored as the first observation data for that SV. For all other observables, the values with respect to the code-phase of that reference observation are the values compressed. For the other non-reference code-phase observables, including the carrier for the reference frequency/tracking type, encoding is used to indicate whether or not those observations are bad. The value packed for a "bad" observation is zero, i.e., all bits of the observation are set to zero.

The table below provides more explanation of the elements of FIGS. 27 and 28.

| Item | Bits | Description |
|---|---|---|
| SV Orbit Minor Data | Variable | Described below |
| Iono/Tropo Optimized Window Block | Variable | Described below |
| Minor Obs Present | Variable | There will be a Minor Lx bit present for each of L2c, L5, and L1c for each case where the associate Major Present Bits indicate the need to flag presence of data on an individual satellite basis. The meaning of the Minor Present bit changes depending upon whether or not "Best Of" mode is enabled. |
| Slip Bit | 1 | The Slip Bit is present only when the Observation Block Definition Bits indicate that the CTC is not present in the message. It is used to indicate that a cycle-slip has occurred on the satellite carrier data. A value 0 means no slip and a value 1 means slip has occurred with respect to the previous epoch of data. |
| Ref Mnr CTC | Variable | This is present only when the Observation Block Definition Bits indicate that the CTC is present in the message. When the CTC is present in the message, there will CTC bits (the number dependent upon the CTC mode indicated in the Observation Block Definition Bits) for each frequency/tracking type. In this case, this is the Minor CTC value for the carrier from the tracking loop pertaining to the reference code. |
| Ref CNR Data | 6 | These bits are only present when the Observation Block Definition Bits so indicate. These bits, when present, hold the Carrier-to-Noise value of the carrier from the tracking loop pertaining to the reference code (LSB = 1 DbHz: i.e., from 0 to 63). |
| Ref Code Obs | Variable | Reference Code observation data |
| Ref Carr Obs | Variable | Reference Code observation data |
| Xf Mnr CTC | Variable | "f" means data from tracking loops not associated with the reference code. These bits refer to the CTC for the non-reference frequency tracking type data contained in the observation data. It is present when the Observation Block Definition bits indicate that the CTCs are present in the message. For each frequency/track type, this and the next three elements are repeated for all of the observation types for the satellite. |
| Xf CNR Data | Variable | "f" means data from tracking loops not associated with the reference code. The Carrier to noise value for the carrier of the tracking loops from a non-reference code. It is present if the Observation Block Definition bits so indicate. |
| Rf Code Obs | Variable | Here, "f" means data from tracking loops not associated with the reference code. Non-Reference Code observation data. |
| Xf Carr Obs | Variable | Here, "f" means data from tracking loops not associated with the reference code. Non-Reference Code observation data. |

SV Orbits Minor Data

There are Orbits Major Data which applies to all satellites in the message and Orbits Minor Data which applies to each satellite on an individual basis. The presence of both is indicated by the ORB bits of the GPS Observation Block Definition Bits. The ORB bits indicate whether or not the message includes Reference mode or Relative mode orbits. The Orbits Major Block describes what elements, and the sizes of each, that will be found in the Orbits Minor Block. FIG. 29 provides a general depiction of the Orbits Minor Data block for each of the reference and relative modes.

Reference and Relative Mode SV Orbits Minor Data

The table below describes the SV Minor Orbit Data, i.e., data that is provided for each satellite indicated to have orbit data present in the Observation Data Block.

| Item | Bits | Description |
|---|---|---|
| Valid Flag | 1 | When this bit is 0, only the "Good Sv Flag" is present in the message: i.e., none of the other remaining items in this table are stored for the SV. When this bit is set to 1, the remaining items are stored. |
| Good Sv Flag | 1 | When set to 1, the satellite is considered usable (broadcast or precise orbits). When set to 0, the satellite is considered as non-usable. The value of this flag has no bearing on whether or not the remaining elements of this block are present. |
| A/B Mode Flag | 1 | Reference and Relative mode orbit data can be mixed in the CMRx GPS Orbit/Clock Message, however, a single mode exists for each individual satellite. In particular, one mode may be used for a set of satellites and another mode for another set of satellites, even within the same message. When this "A/B Mod bit" is present, it has the following meaning:<br>Value   Description<br>0   Reference mode data for this satellite.<br>1   Relative mode data for this satellite. |
| WL BP Flag | 1 | This bit is present only when Orbit/Clock Major Data indicates that clock data is present, i.e., when the "Clock Present" bit of the Orbit/Clock Major Data is set to 1. This bit indicates whether or not the "Wide-Lane Bias" bits are present within this per-satellite minor data. When thisbit is set to 1, the Wide-Lane Bias is present, and when this bit is set to 0, the Wide-Lane Bias is not present. |
| CLK BP Flag | 1 | This bit is present only when Orbit/Clock Major Data indicates that clock data is present. When this bit is set to 1, the Clock Bias is present and when this bit is set to 0, the Clock Bias is not present. |
| Clock Jump Flag | 1 | When the Orbits Major Block indicates that satellite clock data are phase derived, then this bit is present. When present, this bit has the following meaning:<br>Value   Meaning<br>0   No jump in clock has occurred.<br>1   Jump in phase derived clock has occurred. |
| XYZ Quality | 3 | These bits are present only when Orbit/Clock Major Data indicates that orbit data is present. These bits provide the quality of the X, Y, and Z elements of the orbits. These values are passed as provided, without interpretation. At the CMRx Decoder, these bits are extracted from the message and passed to the nudged orbit/clock manager. |
| X, Y, and Z Position Components | Var | These bits are present only when Orbit/Clock Major Data indicates that orbit data is present. When present the bits represent a triple of ambiguous satellite antenna phase center positions (x, y, z). Both the number of bits required and the meaning of each bit are defined by the XYZ Ambiguity Window and XYZ Precision elements of the Orbit/Clock Major Block. |
| Clock Quality | 3 | These bits are present only when Orbit/Clock Major Data indicates that clock data is present. When present, these bits provide the quality of the orbit clock error. These values are passed as provided without interpretation. The CMRx Decoder extracts these bits from the message and passes them to the nudged orbit/clock manager. |
| Clock Error | Var | These bits are present only when Orbit/Clock Major Data indicates that clock data is present. When present, an ambiguous form of the satellite clock error, preferably in meters, is in the message. Both the number of bits required and the meaning of each bit are |

-continued

| Item | Bits | Description |
|---|---|---|
| Wide-Lane Bias | 7 | defined by the "Clock Ambiguity Window" and "Clock Precision" elements of the Orbit Major Block. These bits are only present if the "Wide-Lane Bias Present" bit is set to 1. The fundamental units of this value, in unpacked form, are Wide-Lane cycles, that is, the wide-lane combination of L1 and L2 carrier. The meaning is:<br>Value    Meaning<br>$7F_{16}$    Error condition - Do not use this SV<br>$7E_{16}$    No information available for this bias<br>$00_{16}$ to $7D_{16}$    −1.0 to 1.0 cycles (LSB ~0.0159 cycles) |
| Clock Bias | 7 | These bits are only present if the "Clock Bias Present" bit is set to 1. The fundamental units of this value are meters. The parameter is stored with a range of −2.0 to +2.0 meters in 7 bits. The meaning is:<br>Value    Meaning<br>$7F_{16}$    Error condition - Do not use this SV<br>7E16    No information available for this bias<br>00016 to 7D16    −2.0 to 2.0 meters (LSB ~0.0317 meters) |
| Clock Jump | 6 | These bits are only present if the "Clock Jump Flag" bit is set to 1 When present, the bits indicate that there has been a jump in the phase derived clock. When the "Clock Jump Flag" is set to zero, then there has not been a recent jump in the clock. This field indicates how long ago, with respect to the reference time of the clock information, that the phase derived clock experienced a jump. The least significant bit of the field represents 5 seconds and is offset by 5 seconds, meaning that if the value is $000000_2$. The value of is $000001_2$ means that a clock jump has occurred within the past 10 seconds. The largest value, i.e., $111111_2$ is reserved for future use. The CMRx Encoder accepts the value provided and packs it without modification or scaling. The CMRx Decoder unpacks this value and reports unpacked value to the application. |

Iono/Tropo Optimized Window Block

When the Iono/Tropo Optimized Extended Compression mode is enabled, ionosphere and troposphere data are removed from the raw observations, thereby reducing the number of bits required to store the observation data. To accomplish this, other information about what was done to the data is supplied in the CMRx message so that CMRx Decoders can reconstitute the original data.

Under the Iono/Tropo Optimized Extended Compression mode, ionosphere and troposphere values are removed from the observations before they are compressed. Because ionosphere and troposphere components have been removed from the observations, the residual part of the observation is reduced. This allows CMRx to send carrier and code observations in an ambiguous form because the CMRx recipient can re-compute the ambiguous part. As stated a satellite elevation based troposphere model is used by both the compression and decompression algorithms to compute the troposphere removed from the data. For the ionosphere, the average vertical ionosphere, based upon all good/valid satellites, is computed by the compression process. For each observation, the vertical ionosphere is mapped to the appropriate elevation angle for each satellite and that mapped value is removed from the observation data. When the Iono/Tropo Optimized Extended Compression mode is enabled, this average vertical ionosphere is sent with each CMRx message. In this manner, a CMRx recipient can compute the same value removed from the data before compression and add that value back to reconstruct the original observation.

During the compression process, the compression algorithm reduces the number of bits required for each observation by removing the ionosphere and troposphere values. The compression process then determines the number of bits required to store the remaining information. On a per observation type basis for all satellites of the epoch, the compression process determines the number of bits required based upon residuals. For each observation type there are four possible "windows." Each window specifies the minimum and maximum value to be sent, as well as the number of bits required for that window. Carrier "Windows" are independent of code window. Thus, stored in Iono/Tropo Optimized Windows Block are the average vertical ionosphere, and the index of the window for each observation type packed:

1) Averaged Vertical Ionosphere Index (5 bits)
2) Reference Code Ambiguity Window Index (2 bits)
3) Carrier (of the reference tracking type) Ambiguity Window Index (2 bits)
4) Ra Ambiguity Window Index (2 bits)
5) La Ambiguity Window Index (2-bits)
    to
r) Rx Ambiguity Window Index (2 bits)
s) Lx Ambiguity Window Index (2-bits)
    where the 'a' and 'x' values (in Ra, La, Rx, and Lx) represent data from the non-reference code's frequency/track-type, and 'a' . . . 'x' are frequency/track-types.

The presence of windowing information for the non-reference code type data within the block depends upon how the RP bit of the Observation Suite Bits is set. If RP indicates all, then there will be windowing information for all code types tracked. If the RP indicates only the reference code observation will be stored, then only the reference code type will have windowing information stored. The general form of the Iono/Tropo Optimized Window Block is shown in FIG. 30.

As mentioned above, the Vertical Ionosphere Index is the averaged vertical ionosphere, stored in units of meters using 5 bits, with a LSB of 2 meters. The vertical index is then followed by the Code and Carrier Ionosphere windowing indexes. In the Iono/Tropo Optimized Extended Compression mode, ionosphere and troposphere values are removed from the observations before they are compressed. Thus, the residual part of the observation is reduced.

For the ionosphere, the average vertical ionosphere, based upon all good/valid satellites, is computed by the compression process. For each observation, the vertical ionosphere is mapped to the appropriate elevation angle for each satellite and that mapped value is removed from the observation data. This average vertical ionosphere is sent with each CMRx message. The CMRx recipient then can compute the same value removed from the data before compression, and add that value back to reconstruct the original observation.

The Observation Suite Bits of the Observation Block identify the reference code type and the other observations that are present in the observation data. Thus, the Iono/Tropo Optimized Window only contains data for those observation types indicated by the Observation Suite Bits. The ordering of the information regarding tracking type and frequency is the same as those in the Observation Suite Bits, but the windowing related to the reference frequency/tracking type is first. For each frequency/tracking type, the order is code ambiguity window index followed by the carrier.

When the L2c bits Observation Suite Bits indicate that the L2c type data will be present, either by indicating all or selected SVs, the Iono/Tropo Optimized Window Block will contain windowing information for the carrier data. The presence of windowing information for the non-reference code type data in the block depends upon how the RP bit of the Observation Suite Bits is set. If RP indicates all, then there will be windowing information for all code types tracked. If RP indicates only the reference code observation will be stored, then only the reference code type will have windowing information stored. The same concepts and compression processes are for the L5 and L1c bits of the Observation Suite Bits.

In the preceding discussion reference is made to use of the vertical ionosphere index as a means of reducing the amount of data which needs to be conveyed from one GNSS station to another. In an alternate approach a computation of the ionosphere correction can be made for satellite at a 45° angle from the horizon, and that data used to reduce the amount of information to be sent from the base station to the remote station. In other words, assume that the base station sends an ionospheric correction which is only the difference between the measured correction and the correction for a 45° angle from the horizon, and that the remote station is aware that the data will arrive in this format. This allows a reduced number of bits to be transmitted from one station to another, yet provides all the information that the remote station requires.

Alternatively, the base station can transmit an average value of the ionospheric correction for a series of satellites. In this approach, for example, a set of satellites can have the ionospheric correction mapped to a desired angle, for example vertically, and the average correction computed for that set of satellites. The data transmitted can then be the difference between the measured data in this average, enabling the recipient to gain the required information with the transmission necessitating less bandwidth (fewer bits) then if the entire correction needs to be sent. The same approach can use a median value, a different angle than 45° or vertical, or any set value or amount as a basis for reducing the necessary transmission. In general, the concept is to remove from the transmitted data any value which can be computed by the rover or the recipient of the data based on its own observations. This enables only the correction between that value and the measured value to be sent.

Compression Algorithm

Because of the various compression options, compression modes, and the number of satellites per epoch, the size of the Observation Block will vary. It is also difficult to describe the complete compression of observation data in a single algorithm. Therefore, we will show algorithmic elements (and expect the reader to be able to extrapolate to more complicated/combined algorithms). Before beginning however, we will provide a more detailed description of Compression Levels, as they are assumed knowledge in the algorithms provided shortly thereafter.

Compression Levels

Compression levels are essentially indexes into tables that produce the size of, and values associated with, elements used in creating on the Encoder side the values packed in the CMRx messages as well as the elements used to reconstruct the original data on the decoder side. These compression levels are considered in the context of the three compression modes—Standard, Extended, and Iono/Tropo Optimized Extended—the interrelationships of which are explained via the tables and descriptions within this section.

In each of the tables that follow, RC implies the reference code observation and Rx means all other code observations. The elements having Car within their descriptive names are related to carrier observables. Notations with an initial w, such as wRC and wRx, are associated with the Iono/Tropo Optimized Extended compression Mode.

For Standard Mode Code Compression Levels:

| Compression Level | RC Bits (bit count) | RC Scale (m) | Rx Bits (bit count) | Rx Scale (m) |
|---|---|---|---|---|
| 0 | 31 | 0.00375 | 15 | 0.00375 |
| 1 | 30 | 0.0075 | 14 | 0.0075 |
| 2 | 29 | 0.015 | 13 | 0.015 |
| 3 | 28 | 0.030 | 12 | 0.030 |
| 4 | 27 | 0.060 | 11 | 0.060 |
| 5 | 26 | 0.120 | 10 | 0.120 |
| 6 | 25 | 0.240 | 9 | 0.240 |
| 7 | 24 | 0.480 | 8 | 0.480 |

For Extended Compression Mode Code Compression Levels:

| Compression Level | RC Bits (bit count) | RC Scale (m) | Rx Bits (bit count) | Rx Scale (m) |
|---|---|---|---|---|
| 0 | 17 | 0.00375 | 15 | 0.00375 |
| 1 | 16 | 0.0075 | 14 | 0.0075 |
| 2 | 15 | 0.015 | 13 | 0.015 |
| 3 | 14 | 0.030 | 12 | 0.030 |
| 4 | 13 | 0.060 | 11 | 0.060 |
| 5 | 12 | 0.120 | 10 | 0.120 |
| 6 | 11 | 0.240 | 9 | 0.240 |
| 7 | 10 | 0.480 | 8 | 0.480 |

The above tables provide the bit sizes and precisions used to create CMRx Code observations for all Compression Levels of two of the three compression modes—Standard and Extended, but not for Iono/Tropo Optimized Extended modes. For Extended Compression Mode we compute the ambiguity size of the code window used for each compression level as:

dRCAmbiguitySize=pow(2.0,RCBits)*RCScale;

The above two tables also allow us to compute minimum and maximum code values that can be stored in a CMRx message based upon the available bits for these elements):

```
#define CMRxV1_RXmRC_LOWEND    -40.95//  (meters) The lowest value        //
                                     //  accepted by the compression      //
                                     //  algorithm for a non-Reference    //
                                     //  codephase (RX) minus the         //
                                     //  Reference codephase value (RC):  //
                                     //  i.e., the lowest value for the   //
                                     //  expression RX - RC.              //
// Compute the min and Max code values for the reference code phase.
//  NOTE:    Compute the min/max code values: i.e., they must be even
//           multiples of the reference code scale. Note: we round the low
//           scale but not the high scale (as rounding the high scale
```

```
//              could permit values that are not supported by the available
//              bits).
dMinRCVal    = CMRxV1_RC_LOWEND / dRCScale;
dMinRCVal    = floor (dMinRCVal + 0.5);
dMinRCVal   *= dRCScale;
dMinRCVal    = floor (dMinRCVal * 10000.0 + 0.5) / 10000.0;
dMaxRCVal    = dRCScale * pow (2.0, (DEL) uSRCBits) - 1);
dMaxRCVal   += dMinRCVal;
// Compute the min/max values of the expression dRx-dRC in bit packed
// Form.        NOTE: we round the low scale but not the high scale (as
//              rounding the high scale could permit values that are not
//              supported by the available bits).
dMinRXVal  = CMRxV1_RXmRC_LOWEND / dRXScale;
dMinRXVal  = (S32) (dMinRXVal - 0.5);
dMaxRXVal  = dMinRXVal + pow (2.0, (DBL) u8RXBits);
dMaxRXVal  = (S32) dMaxRXVal;
```

Now consider the Iono/Tropo Optimized Extended Compression mode. In the table that follows, we define the four windows for each satellite code frequency/track type. When referencing an element from the table, we use T.

| Window Index | wRC Bits (bit count) | wRx Bits (bit count) |
|---|---|---|
| 0 | (T RC Bits) | (T Rw Bits) |
| 1 | (T RC Bits) − 1 | (T Rw Bits) − 1 |
| 2 | (T RC Bits) − 2 | (T Rw Bits) − 2 |
| 3 | (T RC Bits) − 3 | (T Rw Bits) − 3 |

The above table provides the bit sizes and precisions used to create CMRx Code observations for Iono/Tropo Optimized Window Mode. For this mode the ambiguity size of the code window used for each window of a given compression level is:

dRCAmbiguitySize=pow(2.0,wRCBits)*TRCScale;

This allows computing minimum and maximum values for each of the four windows, of a given compression level, using the following for each window:

```
dLowRCWinM   = -(pow (2.0, wRCBits - 1)       * TRCScale);
dHighRCWinM  =  (pow (2.0, wRCBits - 1 ) - 1.0) * TRCScale;
dLowRXWinM   = -(pow (2.0, wRxBits - 1)       * TRxScale);
dHighRXWinM  =  (pow (2.0, wRxBits - 1) - 1.0)  * TRxScale;
```

For both the Standard Mode and Extended Mode Carrier Compression Levels:

| Compression Level | Car Bits (bit count) | CarCycWin (cycles) |
|---|---|---|
| 0 | 20 | 4000.0 |
| 1 | 19 | 4000.0 |
| 2 | 18 | 4000.0 |
| 3 | 17 | 4000.0 |
| 4 | 16 | 4000.0 |
| 5 | 15 | 4000.0 |
| 6 | 14 | 4000.0 |
| 7 | 13 | 4000.0 |

From the above, a scale used to convert the CMRx Carrier observation to an integer form is:

```
// Compute the value used to compute the Carrier scale
factor.
dCarRange = pow (2.0, CarBits); // Cycles.
```

A similar Window-based table for the Carrier in the Iono/Tropo Optimized Extended Compression mode is as follows. When referencing a Table 2.2.8.5.1-4 element we will use the notation T.

| Window Index | wCar Bits (bit count) | wCarCycWin (cycles) |
|---|---|---|
| 0 | (T Car Bits) | (T CarCycWin) |
| 1 | (T Car Bits) − 1 | (T CarCycWin)/2 |
| 2 | (T Car Bits) − 2 | (T CarCycWin)/4 |
| 3 | (T Car Bits) − 3 | (T CarCycWin)/8 |

The above tables provide the bit sizes used to create CMRx Carrier observations for all Compression Levels and all windows within for the Iono/Tropo Optimized Extended Mode. The scale used to convert the CMRx Carrier observation to an integer form is:

```
// Compute the value used to compute the Carrier
scale factor.
dWinCarRange = pow (2.0, wCarCycWin); // Cycles.
```

Windowing

This section describes the windowing within CMRx. To understand windowing, the receiver code phase is first described. When a satellite transmits its coded information the time each bit leaves the satellite is known. Assume that the receiver clock is perfectly timed with the satellite clock and that the signal is propagating through a perfect vacuum. Corrections for each of these assumptions are discussed below. Assume also, that the linear distance of a single bit is 300 meters, and the bit rate is about 1,000,000 bits per second.

The receiver cannot measure the exact rise/fall of a bit in its signal processing. But assume that it is close and can get within about 3 meters or so (i.e., one one-hundredth of a code cycle). Because we know when the bit left the satellite and we know when it was received, we can compute a range. This range locates the receiver on the surface of a sphere at that distance from the satellite. Remember that the satellite, in its message, provides us with information allowing us to precisely compute its position, called the broadcast orbit. Tracking three satellites gives us the intersection of three spheres, yielding one point on the earth's surface.

Earlier, we ignored the fact that the receiver's clock, which is crucial to measuring this range, drifts with respect to the GPS satellite time. Thus, the receiver's clock will be off with respect to GPS. This error is called the receiver clock offset. To solve for this, data from a fourth satellite is used, allowing determination of the error in the receiver clock with respect to GPS time.

Above for simplicity we ignored the fact that the signal goes through several environmental elements that make the signal appear to be longer or shorter. The ionosphere and troposphere effect the signal propagation rate, generally delaying arrival of the signal, making the distance to the satellite appear longer. In addition other effects may further delay the signal. For example the receiver antenna(s) may be located near structures which reflect the signals from the satellites. These signal bounces, often referred to as multi-path, result in multiple inputs at the same antenna location. Each input making the satellite appear to have a different apparent range due to the added distance from the signal reflection.

In addition these multi-inputs make it harder to detect the rise/fall of each bit. This alters the receiver's determination of when the signal arrived, and thus corrupts the range measurement. All of these factors affect the signals from all satellites, thus affecting the ability of the receiver to determine ranges and clock-offset precisely. This is the reason for the terminology—pseudo-range (or false range).

Code-Windowing

To begin, the basic question is "when sending a code observable (i.e., a pseudo-range observable), from a CMRx sender to a CMRx recipient, why not compress by sending a delta between a computed range and the actual range"? That is, if you know where the satellite is (because the broadcast message from the satellite is available to both the sender and the recipient of a message), and you know where the receiver is (because the coordinates of the sending station are known) then both the sender and recipient can compute the actual range. Thus, why not just send the difference between the computed range and the pseudo-range? The primary answer is the IODE (Issue of Data Ephemeris).

Earlier we stated that the satellite broadcasts its orbital data allowing one to precisely compute the position of the satellite at any moment. Although generally true, the broadcast orbit (which is what the satellite broadcasts as part of its signal) is not perfect. It is formulated by a series of ground tracking systems that "predict" the orbit and then upload these orbits to the satellites for their broadcast. These predictions are very good around a central point, but decay as one moves away from that central point. This central point is indicated by an orbit reference time known as the Time of Ephemeris (Toe), and is illustrated in FIG. 31.

When one looks at two successive broadcast orbits over the same period, the orbital arcs are not the same. This is because the orbit is predicted and optimized around the Toe. Thus one cannot just simply send the computed range minus the pseudo-range in a message because it would require that the recipient see the exact same orbital message. In addition because of blockages (short or long) in the sky, such as tree branches and bridges, one cannot assume that the recipient sees the exact same orbit as the sender.

When a new orbit is uploaded to the satellite its Toe changes and an 8-bit number indicating its orbit (called the IODE) also changes. The IODE is defined to uniquely identify orbits from an individual satellite over a given period of time. The computed range minus pseudo-range can be sent if the IODE is also sent. This allows the recipient to know the orbit that was used to compute the value. In essence, this is what RTCM corrections do—they send a code correction term and an IODE. This approach, however, has two disadvantages: (1) it requires 8 additional bits per SV per message (the 8-bit IODE must be sent with every message), and (2) the sender can receive an IODE that the recipient does not yet have, for example, due to a rising satellite and the spatial separation between sender and recipient, or because the recipient is a rover having momentary blockages on that satellite.

To avoid these issues, in CMRx, the sender formulates and sends an ambiguous code range. It does this by sending a value that is the remainder of a division:

CMRxRange = fmod (Pseudo-Range, WindowSize)
where,
WindowSize is the size of the ambiguity window (described below);
Pseudo-Range is the range observable provided by the GPS Receiver; and
CMRxRange is the value packed and stored in the CMRx message The recipient receives this CMRxRange and then reconstructs the missing ambiguities. It does this by computing the range to the satellite using the broadcast orbit and the time associated with the CMRxRange it received from the CMRx Message (i.e., the time of the data is contained in the message). It can then reconstruct the full range using the following approach:

1. Compute the number of "windows" in the geometric range (i.e., dRho, the geometric range, is computed using the broadcast orbit and the coordinates of the sender).
   dRcN=(dRho−CMRxRange)/WindowSize;
2. Get an integer number of missing windows (by rounding).
   dRcN=Round(dRcN);
3. Reconstruct the full range
   Pseudo-Range=CMRxRange+(dRcN*WindowSize);

It is important to have the size of WindowSize small. One approach to that would be to do what typical GPS receivers do (because of the 1 millisecond PRN code length), and send a number that is ambiguous to 1 millisecond. To get, however, 1 millisecond code sent, we need a number reaching 300,000 meters. With millimeter resolution, and sending an integer number, this means we need to send a number that is at least 300000000 mm (which is about 29 bits).

Instead in CMRx the WindowSize is chosen to account for many factors. These include, ionosphere, troposphere, multipath, general noise, and IODE changes. For a case where CMRx is not attempting to model tropo or remove any ionosphere, we set this number to approximately 500 meters, which is considerably smaller and requires many fewer bits. CMRx chooses the ambiguity size to account for twice all of these factors in a nominal-worst case sense, and requires fewer bits than the 1 millisecond approach described above.

Carrier-Windowing

To understand the carrier within CMRx, we first describe how the carrier is measured by the GPS receiver: i.e., what the quantities mean. At the first sampling (t=0) of the carrier phase, the receiver obtains a fractional phase measurement (i.e., a number smaller than 1, but greater or equal to zero). It is clear that this is only a portion of the true range to the satellite. This measurement is missing a quantity that is a whole number of carrier cycles (we will call it N). As each successive measurement is made, the receiver tracks the change in range to the satellite as part of the carrier: i.e., the next sample is missing the same initial N value. Thus, the pseudo-carrier range to the satellite can be expressed as:

$$\Theta_a^j(t) = P_a^j(t) + N + \epsilon_a^j(t)$$

where,
a indicates the receiver
j indicates the satellite
t Time
P The actual range to the satellite (called Rho)
ε Errors (such as multipath, iono, tropo)
Q Observed/measured carrier phase.

This equation in effect shows that the carrier measured by the receiver, between a receiver and a satellite, at any time, is missing a constant term. If that constant term (N) were known, then the carrier range at each sampling is known. This is the primary basis of carrier phase processing whereby once N (called the ambiguity) is solved, precise carrier ranges to the satellite are known. The value of N is an integer, i.e., the number of carrier cycles.

Consider the following change to the above equation:

$$\Theta_a^j(t) + N^* = P_a^j(t) + N' + \epsilon_a^j(t)$$

A constant value (i.e. N*) has been added to both sides of the equation. Because the carrier processing task is to solve N in the first equation, we can add a whole number of cycles to the observed carrier phase (N*). Ultimately, as shown below, N' will be determined which will then give a fully constructed range to the satellite.

N* is used when formulating the CMRx carrier data. We use the psuedo-range to derive a value for N* as follows:

$$N^* = R_a^j(t_k) - \Theta_a^j(t_k)$$

where, a indicates the receiver
j indicates the satellite
$t_k$ Time at which we want to determine range
R The receiver pseudo-range measurement N*.
Q Observed/measured carrier phase.

Thus, we can now formulate a sort of carrier range to the satellite:

$$\Theta'^j_a(t) = \Theta_a^j(t) + N^*$$

where,
a indicates the receiver, and
Q' Constructed Carrier Range.

This "Constructed Carrier Range" is not a true range as it was constructed using a psuedo-range observation. It is therefore less accurate than the carrier range, and some of the psuedo-range error sources behave differently than those in the carrier. The value, however, does provide an approximate range to the satellite in carrier cycles. Additionally, because this value of N* is constant from message to message, the net affect is that we have added the constant value N' to all measurements to that satellite.

CMRx creates the value sent, at each message for each satellite for each carrier observation, using the following equation:

$$CMRxCarrier = R_a^j(t) - \Theta'^j_a(t)$$

That is, the CMRxCarrier stored in the CMRx message is the measured pseudo-range minus this "Constructed Carrier Phase." This technique works because the recipient is able to reconstruct the sender's pseudo-range as earlier described.

Care must be taken as the value of $R_a^j(t)$ at the CMRx message construction end must be exactly equal to the value reconstructed by the CMRx Decoder. Thus the CMRx Encoder creates its $R_a^j(t)$ that is packed and that is then used for the generations of all other CMRx message observables.

Iono/Tropo Windowing

Iono and Tropo Windowing allows reducing the value of the aforementioned WindowSize. In essence, code observables are used to compute the ionosphere. An average vertical ionosphere is established by mapping each independently computed ionosphere to the vertical and then formulating an average:

$$I'_j = \frac{R_{L2} - R_{L1}}{\left(\frac{77^2}{60^2} - 1\right)} * \left(1 + 2 * \left(\frac{96 - SvEl}{90}\right)^3\right)$$

$$\bar{I} = \frac{1}{NumSvs} \sum_{j=1}^{NumSvs} I'_j$$

In the first equation, the left-side of the multiply is an industry known equation for computing the ionosphere from the code phase. The right-hand side is a mapping function to map the ionosphere, based upon satellite elevations, to a vertical value.

For the troposphere, we use a computation algorithm that closely matches the Modified Hopfield module, a model generally used in GPS processing. Unlike Hopfield, which accepts a variety of environmental inputs (such as temperature, pressure, and relative humidity), the technique here provides calculations based upon standard values for temperature, pressure, and relative humidity. This is not as undesirable as one might think because most GPS receivers do not have environmental sensors. Thus they use standard values when applying the Hopfield model. Furthermore, even if they did, the true atmosphere is not a linearly regressing troposhere as modeled in Hopfield. That is, these are models that assume a consistent atmosphere, while the true atmosphere has layers of varying temperatures and water content. Thus, even having sensors in the GPS receiver is, at best, only a local ground measurement.

The CMRx Encoder does the Iono/Tropo Windowing by computing, and then removing, the Ionosphere and Troposphere as described above. Note that the CMRx Encoder sends to the rover, as part of the message, the average vertical ionosphere. The Encoder re-maps to the elevation of the satellite and then removes that value from the code and carrier data. This entire process reduces the uncertainty of the observables, and thus can reduce the size of WindowSize.

CMRx looks at the residuals and adjusts the window size so as to account for the residuals and other factors, such as IODE differences between the encoder and decoder). An adjustment in the WindowSize results in a change in the number of bits sent: i.e., the smaller the residuals, the fewer bits required to send the data. The CMRx Encoder sends the WindowSize on a frequency/tracking-type basis as part of the message. Using this technique, the WindowSize per frequency/track-type requires 2 bits which is amortized over the number of satellites in the message with a potential to reduce the size of each observable for that frequency/track-type by 3 bits each. On average, this results in a reduction of about 2.5 bits per frequency/track-type. For example, with 9 satellites reporting both Code and Carrier for L1 C/A, L2E, and L5 results in 6 additional bits (i.e., storing 2-bit values for WindowSize, one for L1 C/A, one for L2E, and one for L5 ) with a reduction of 162 bits for observables (i.e., 3 bits reduced for carrier and code on each of L1, L2, and L5 [i.e., 18 bits per satellite]). The net gain is 156 bits (i.e., 162−6).

Compression Algorithm

Because of the modes, options, and the number of satellites per epoch, the size of the Observation Block varies. A description of the compression process is set forth below.

The Pseudo-Range of the Reference Frequency/Track Type is packed into the message. This is because this observation (referred to as "RC" below) is used as a basis in packing all other observations stored in the CMRx Message. The packing of the Reference Pseudo-Range observation requires that the source RC observation be in the range of 19000000.005 m to 27053063.670 m. If the Receiver Clock Offset cause the RC values to fall outside of these limits, the compression process generates an error to indicate the RC value is out-of-bounds.

a. Standard Compression of RC (Code Compression Level 2)

Initial Algorithm:

| | |
|---|---|
| 1) | Set RC = raw receiver code-phase observation designated as reference. |
| 2) | RCt = Round RC to the nearest 1.5 cm. |
| 3) | Save RCt for use in packing other observables. |

Algorithm for Creating RC to be Packed:

| | |
|---|---|
| 1) | RCp = RCt * 100.0 |
| 1) | RCp = RCp−1900000000.500 |
| 2) | RCp = RCp/1.5 |
| 3) | RCp = Round RCp to nearest integer. |
| | -- Now 0 <= RCp <= 536,870,911 (i.e., $2^{29} - 1$) | b. Standard Compression of RC (Code Compression Level 7)

The algorithm above assumes Compression Level 2. The observable scale factor and the number of bits packed are different for each Compression Level. For example, if the Compression Level bits contain the value 7, then RC would be stored using 24 bits and have a scale of 0.480 meters. The following shows the algorithm when a Compression Level of 7 is used.

Initial Algorithm:

| | |
|---|---|
| 1) | Set RC = raw receiver code-phase observation designated as reference. |
| 2) | RCt = Round RC to the nearest 0.480 cm. |
| 3) | Save RCt for use in packing other observables. |

Algorithm for Creating RC to be Packed:

| | |
|---|---|
| 1) | RCp = RCt * 100.0 |
| 2) | RCp = RCp − 18999999.840 |
| 3) | RCp = RCp/48.0 |
| 4) | RCp = Round RCp to nearest integer. |
| | -- Now 0 <= RCp <= 16,777,215 (i.e., $2^{24} - 1$) |

In comparing the algorithm when the compression Level is 7 with that of Level 2, notice that:
 a) The scale of the reference code phase is 0.480 meters;
 b) The number of bits available for the reference code phase is 24.
 c) The lowest value permitted for the reference code phase is now 18999999.840 meters (i.e., the closest multiple of 0.480 to the original 19000000.005 meters); and
 d) The largest value permitted is based upon the value $2^{24}-1$.

c. Extended Compression of RC (Code Compression Level 2)

The above two algorithms assume that the Extended Compression Mode is not used. When the Extended Compression Mode is enabled, an ambiguous form of the RC observations are packed. The algorithm that follows shows the compression process when the ambiguous forms of RC are used.

Algorithm for Creating the Ambiguous Form of RC to be packed:

| | |
|---|---|
| 1) | Set the size of the ambiguity window to some multiple of 1.5 centimeters (i.e., the lowest granularity of our compression). AmbigSize = 0.015 * $2^{15}$ |
| 2) | Set RCScale to represent the value of each bit to be packed. For example, RCScale for code compression level 2 is 0.015 meters, while RCScale for Level 7 is 0.480 meters. |
| 3) | Compute the ambiguous RC value (i.e., remove all whole windows from the range). FracRC = RC/AmbigSize; FracRC = FracRC − (long) (FracRC); FracRC = FracRC * AmbigSize; |
| 4) | Put the fractional part (i.e., the ambiguous RC) into compressible form. RCp = (long)(FracRC/RCScale + 0.5); |

When the Iono/Tropo Optimized Extended Compression Mode is enabled, as shown by FIG. 21, the Iono/Tropo Optimized Window Block is added just before the observation data. This block describes the averaged ionosphere removed from the observation data and the size of the data windows for each observation type stored in the message. These "windows" constitutes the size of the ambiguities removed from these raw observation that are packed, i.e., what is packed is the floating point modulo [fmod] of the observation data by the window size. In this way, the decompression side can determine the number of whole windows removed from the data and add that back to the unpacked data, thus, reconstructing the original raw data.

The basic algorithm for determining the bits that describe the Iono/Tropo Extended Window Compression depend upon knowing (i) the Sender Station Position (to within 50 meters), (ii) the Broadcast Orbits of each participating satellite; (iii) at least dual frequency code data; (iv) the nominal expected and expected worse case ionosphere and troposphere; and (v) the nominal expected and worse case expected multi-path.

Because these values are known and/or computable by both the compression algorithm and the decompression algorithm, both the sender and the receiver of the data can compute these values. This is true even when the stations are widely separated. That is, there are times when the broadcast orbits used by the compression are slightly different than the decompression algorithm: such as when one side receives an orbit change (i.e., a new IODE) before the other.

The first step is to determine the sizes of the Iono/Tropo optimized windows. These size values are what will be stored as part of the bits of the Iono/Tropo Optimized Window Block. As part of this process, the computed values of ionosphere and troposphere are removed from the raw observation data. Removing these values from the raw observation data, enables the size of the windows to be significantly reduced, thus reducing the overall bits per satellite packed. In this process, an independent window size is determined for each observation type in the message. The window size selected for an observation type is then used for all satellites at that epoch. This window information will be stored as part of the Iono/Tropo Optimized Window Block.

To determine the sizes of the ambiguity windows, computable elements of the observation data are removed from the raw observations. Using the raw dual-frequency code observations from all satellites, an averaged observed vertical ionosphere value is calculated. This is rounded to the nearest even number, and the rounded value stored as part of the Iono/Tropo Optimized Window Block. The rounded value is removed from the raw code and carrier observations for each satellite. Then w2 (that is, the averaged vertical ionosphere value is mapped to the elevation angle associated with each satellite, and that mapped value is removed from the observations). We then remove a troposphere computation from all of the observations from each satellite.

To determine the window sizes for the code-phase data we use given known values for items (i) and (ii) above to construct a model of the observed data. This model accounts for the satellite clocks and receiver clock. Code Residuals for each code-phase type are formed by differencing the modeled data and newly formed Iono/Tropo-free code data. These residuals account for the single receiver non-computable part of the code observation data. Since the decompression process uses these same known values, it can compute the same troposphere model, satellite clocks, and receiver clock. The decompression process is also given the ionosphere value removed for each observation. Thus, with these computed values, the decompression side can reconstruct the original data. Therefore, on the compression side, these computed code residuals tell how big the code-phase windows need to be. For example, the L1 C/A residuals, when L1 C/A is to be present in the message, for all satellites of the epoch are then compared to the window bounds of 4 possible L1 C/A windows (the sizes of which will be shown shortly) to determine the maximum window for L1 C/A. Likewise, the L2c residuals, when L2c is to be present in the message, for all satellites of the epoch are then compared to the window bounds of 4 possible L2c windows (the sizes of which will be shown shortly) to determine the maximum window for L2c. Similarly, this is done for each code-phase observation in the message.

The sizes of the code-phase windows are computed depending upon the Compression Level. The code-phase window bounds and ambiguity sizes of the code windows are computed as shown bellow. The number of bits and scale factors are provided in the C/C++ like algorithms that follow in later sections. The notation RC implies the Reference Code-phase for the message and RX implies all other Non-Reference Code-phases for the epoch.

Window 1 (index 0):

```
LowEnd_RC [0] = -(pow (2.0, Bits_for_Ambiguous_RC -
1) * RC_Scale_Factor)
HighEnd_RC [0] = (pow (2.0, Bits_for_Ambiguous_RC -
1) - 1.0) * RC_Scale_Factor
LowEnd_RX [0] = -(pow (2.0, Number_of_Bits_for_RX -
1) * RX_Scale_Factor)
HighEnd_RX [0] = (pow (2.0, Number_of_Bits_for_RX -
1) - 1.0) * RX_Scale_Factor
```

Window 2 (index 1):

```
LowEnd_RC [1] = -(pow (2.0, Bits_for_Ambiguous_RC -
2) * RC_Scale_Factor)
HighEnd_RC [1] = (pow (2.0, Bits_for_Ambiguous_RC -
2) - 1.0) * RC_Scale_Factor
LowEnd_RX [1] = -(pow (2.0, Number_of_Bits_for_RX -
2) * RX_Scale_Factor)
HighEnd_RX [1] = (pow (2.0, Number_of_Bits_for_RX -
2) - 1.0) * RX_Scale_Factor
```

Window 3 (index 2):

```
LowEnd_RC [2] = -(pow (2.0, Bits_for_Ambiguous_RC -
3) * RC_Scale_Factor)
HighEnd_RC [2] = (pow (2.0, Bits_for_Ambiguous_RC - 3) -
1.0) * RC_Scale_Factor
LowEnd_RX [2] = -(pow (2.0, Number_of_Bits_for_RX -
3) * RX_Scale_Factor)
HighEnd_RX [2] = (pow (2.0, Number_of_Bits_for_RX -
3) - 1.0) * RX_Scale_Factor
```

Window 4 (index 3):

```
LowEnd_RC [3] = -(pow (2.0, Bits_for_Ambiguous_RC -
4) * RC_Scale_Factor)
HighEnd_RC [3] = (pow (2.0, Bits_for_Ambiguous_RC -
4) - 1.0) * RC_Scale_Factor
LowEnd_RX [3] = -(pow (2.0, Number_of_Bits_for_RX -
4) * RX_Scale_Factor)
HighEnd_RX [3] = (pow (2.0, Number_of_Bits_for_RX -
4) - 1.0) * RX_Scale_Factor
```

Thus at compression level 3, the following window sizes would result:

Window 1 (index 0):

```
LowEnd_RC [0] = -245.76 m
HighEnd_RC [0] = 245.64 m
LowEnd_RX [0] = -61.44 m
HighEnd_RX [0] = 61.32 m
```

Window 2 (index 1):

```
LowEnd_RC [1] = -122.88 m
HighEnd_RC [1] = 122.76 m
LowEnd_RX [1]= -30.72 m
HighEnd_RX [1] = 30.60 m
```

Window 3 (index 2):

```
LowEnd_RC [2]= -61.44 m
HighEnd_RC [2] = 61.32 m
LowEnd_RX [2]= -15.36 m
HighEnd_RX [2] = 15.24 m
```

Window 4 (index 3):

```
LowEnd_RC [3] = -30.72 m
HighEnd_RC [3] = 30.60 m
LowEnd_RX [3] = -7.68 m
HighEnd_RX [3] = 7.56 m
```

Given the current compression level, the compression algorithm can compute the minimum and maximum window sizes for the windows at each index. The RC residuals for all satellites of the epoch are then compared to the window bounds of 4 possible RC windows to determine the smallest window that can hold these residuals (i.e., for all reference code phase observations). Likewise, the RX residuals for all satellites of the epoch are then compared to the window bounds of 4 possible RX windows to determine the smallest window that can hold these residuals (i.e., for all non-reference code phase observations). These residuals, for this comparison process, are scaled to a slightly larger value.

The actual compression of the RC data follows that described, but with two exceptions. The first is that the newly formed Iono/Tropo-free observations described above is packed. The second is a change to the computation of the window ambiguity size value. That is, we use:

AmbigSize=RC_Scale_Factor*2^(Bits_for_Window)

For example, if the Compression Level were set to Level 3 and the RC window index selected were 2, then AmbigSize would be computed as follows:

AmbigSize=0.120*2^(12-2)

The Pseudo-Range on the non-reference code phase ("RX") is packed when the Observation Suite indicates to pack the RX observable.

d. Standard Compression of RX (Compression Level 2)

In the algorithm that follows, Compression Level two was selected. That is the number of bits used for the non-reference code phase is 13 bits, the value being packed is RC−RX, the value being has a lowest value of −40.95 meters.

Algorithm for Creating RX to be packed:

| | |
|---|---|
| 1) | Set RXt = Round RX to the nearest 1.5 cm. |
| 2) | RXp = (RXt − RCt)/0.015 |
| 3) | RXp = Round RXp to the nearest integer. |
| 4) | Validate that −2730 <= RXp <= 5461 |
| 5) | RXp = RXp − (−2730) |
| -- Now 0 <= RXp <= 8191 (i.e., $2^{13}$ − 1) | |
| 6) | IF (RXp == 0) THEN |
| 6.1) | RXp = 1 as zero has the special meaning of not present. | e. Standard Compression of RX (Compression Level 6)

The algorithm assumed the default Compression Level (i.e., Level 2). In particular, the observable scale factor and the number of bits packed are different for each Compression Level. For example, if the Compression Level bits contain the value 6, then RX would be stored using 9 bits and have a scale of 0.240 meters. When a Compression Level of 6 is used:

Algorithm for Creating RX to be Packed:

| | |
|---|---|
| 1) | Set RXt = Round RX to the nearest 24.0 cm. |
| 2) | RXp = (RXt − RCt)/0.240 |
| 3) | RXp = Round RXp to the nearest integer. |
| 4) | Validate that −171 <= RXp <= 340 |
| 5) | RXp = RXp − (−171) |
| -- Now 0 <= RXp <= 511 (i.e., $2^9$ − 1) | |
| 6) | IF (RXp == 0) THEN |
| 6.1) | RXp = 1 as zero has the special meaning of not present. | f. Iono/Tropo Optimized Extended Compression of RX

To compute the ambiguity windows size for RC. For RX, the computation is as follows:

AmbigSize=RX_Scale_Factor*2^(Bits_for_Window)

For example, if the Compression Level were set to Level 3 and the RC window index selected were 2, then AmbigSize would be computed as follows:

g. Carrier Phase Data

The Carrier Phase for a given frequency/tracking type ("Lf") is packed when the Observation Suite indicates to pack that observable. The Lf observable that is packed is based upon the value "RCt".

h. Standard Compression of Carrier Data (Compression Level 2)

In the algorithm that follows, Compression Level two has been selected. In this mode, the number of bits for carrier is 18 and the size of the carrier ambiguity window is 4000 cycles.

Before Packing Begins On the First Epoch of Data:

1) Set Nf [sat]=999,999,999 for all "sat" [1 . . . 32]

Algorithm for Creating Lf to be packed:

Let bYf = The wavelength of Lf data (in meters/cycle).
| | |
|---|---|
| 1) | Set Lf = carrier observation from frequency/tracking type "f". |
| 2) | IF (fabs (RCt − bYf*(Nf[sat] + Lf)) > 2000*bYf) THEN |
| 2.1) | Nf[sat] = (long) ((RCt − bYf*Lf)/bYf) − 1000 cycles. |
| 3) | Lf = Lf + Nf[sat] |
| 4) | Lf = fmod (Lf, 4000) |
| 5) | Lfp = Lf/(4000/$2^{18}$) |
| 6) | Lfp = Round Lfp to nearest integer |
| 7) | IF (Lfp == 0) THEN |
| 7.1) | Lfp = 1 as zero has the special meaning of not present. |

Note the computation of Steps 5 and 6 are slightly different to allow a range of 1 to $2^{18}$−1: i.e., leaving the zero value to mean bad data. These are as follows:

| | |
|---|---|
| 5') | Lfp = Lf/(4000/($2^{18}$ − 1) ) |
| 6') | Lfp = Round Lfp to nearest integer |
| 6") | Lfp += 1 | i. Standard Compression of Carrier Data (Compression Level 5)

The algorithm above assumed a compression level of 2, but the observable scale factor and the number of bits packed are different for each Compression Level. For example, if the Compression Level bits contain value 5, then the Lf carrier is stored using 15 bits (with a carrier window size of 4000 cycles). The following shows the algorithm when a Compression Level of 5 is used.

Before Packing Begins on the First Epoch of Data:

| | |
|---|---|
| 1) | Set Nf[sat] = 999,999,999 for all "sat" [1 . . . 32] |
| 2) | |

Algorithm for Creating Lf to be Packed:

Let bYf = The wavelength of Lf data (in meters/cycle).
| | |
|---|---|
| 1) | Set Lf = carrier observation from frequency/tracking type "f". |
| 2) | IF (fabs (RCt − bYf*(Nf[sat] + Lf)) > 2000*bYf) THEN |
| -- NOTE: In this mode we remove ¼ of the window | |
| size (i.e., 1000 cycles) as to keep the value away from the edge | |
| of the window (as we have not accounted for Iono/Tropo). | |
| 2.1) | Nf[sat] = (long) ( (RCt − bYf*Lf)/bYf) − 1000 cycles. |
| 3) | Lf = Lf + Nf[sat] |
| 4) | Lf = fmod (Lf, 4000) |
| 5) | Lfp = Lf/(4000/$2^{15}$) |
| 6) | Lfp = Round Lfp to nearest integer |
| 7) | IF (Lfp == 0) THEN |
| 7.1) | Lfp = 1 as zero has the special meaning of not present. |

Note: In reality however, the computation of Steps 5 and 6 are slightly different to allow a range of 1 to $2^{18-1}$: i.e., leaving the zero value to mean bad data. These are as follows:

| | |
|---|---|
| 5') | Lfp = Lf/(4000/($2^{15}$ − 1)) |
| 6') | Lfp = Round Lfp to nearest integer |
| 6") | Lfp += 1 |

In comparing the algorithm when the compression Level is 5 with that of Level 2, notice that:
a) The number of bits available for the Lf carrier phase is 15; and
b) The scale factor used to get the Lf carrier into its bit representation is now "Lf/((4000/215)−1)".

In this implementation, we have generalized these values based upon look-up tables indexed by the Compression Level mode specified.

j. Iono/Tropo Optimized Extended Compression of Carrier Data

On the first pass, we seek to make the carrier align with the code observation by computing the integer ambiguity for each satellite and carrier frequency with respect to the reference code data (RC). We continue with the same ambiguity value for the epochs to follow until a cycle-slip occurs (or there is a violation whereby the combination of N and the carrier, minus the code observation, causes us to exceed the bounds of the window).

To determine the window sizes for the carrier phase data (i.e., only the windows for each carrier observation type for a satellite) we use the reference code-phase (RC). Carrier Residuals are formed by differencing the RC observable data and newly formed Iono/Tropo-free carrier observables (combined with the ambiguity determined for that satellite and frequency/tracking type). Since the decompression process uses these same known values (i.e., reference position and orbital data), it can compute the same troposphere model and satellite clocks. The decompression process is also given the ionosphere value removed for each observation. Thus, with these computed values, the decompression side can reconstruct the original data. Therefore, on the compression side, these carrier residuals tell how big the windows need to be. The Lf residuals for all satellites of the epoch are then compared to the window bounds of 4 possible Lf windows (the sizes of which will be shown shortly) to determine the maximum window for Lf. Likewise, the data from all other carrier observations (i.e., frequency/tracking types for each satellite) are run through this process to determine which of the 4 possible windows for each type represents the maximum.

The carrier window size is based upon the Standard Compression mode carrier window size (i.e., 4000 cycles). Under the Iono/Tropo Optimized Extended Compression approach, there are four windows:

```
dCarAmbWin [0] = 4000;
dCarAmbWin [1] = dCarAmbWin [0]/2.0;
dCarAmbWin [2] = dCarAmbWin [0]/4.0;
dCarAmbWin [3] = dCarAmbWin [0]/8.0;
```

Thus, the algorithm for compressing the Lf carrier phase under the Iono/Tropo Optimized Extended Compression is:
Before Packing Begins On the First Epoch of Data:
 1) Set Nf[sat]=999,999,999 for all "sat" [1 . . . 32]
Algorithm for Creating Lf to be packed:

```
Let bY1 = The wavelength on Lf (in meters/cycle).
1)     Set Lf = Iono/Tropo – free Lf
2)     Set dCarCycLfWin = dCarAmbWin [selected Lf window]
3)     Set lNumLfBits = number of bits for Lf window
4)     Set dLfScale = pow (2.0, lNumLfBits – 1);
5)     IF (fabs (RCt – bYf*(Nf[sat] + Lf)) > (dCarCycLfWin/2.0)*bf1)
       THEN
-- NOTE: In this mode we do not remove ¼ of the window
size as We have accounted for Iono/Tropo
5.1)   Nf[sat] = (long) ((RCt – bYf*Lf)/bYf)
6)     Lf = Lf + Nf[sat]
7)     Lf = fmod (Lf, dCarCycLfWin)
8)     Lfp = Lf/(dCarCycLfWin/dLfScale)
9)     Lfp = Round Lfp to nearest integer
10)    IF (Lfp == 0) THEN
10.1)  Lfp = 1 as zero has the special meaning of not present.
``` k. Text Message Block

When the value the Text Block Present (TBP) of the CMRx GPS Observation Header Block (FIG. 7) indicates that a text message is present, this block will be present in the CMRx GPS Observation Data Message. Special encoding is used to distinguish between text messages targeted at the end user and messages that are targeted for processing by the end user system.

The general form of the Text Message Block is shown in FIG. 32. It is divided into three sections:
1) Message Length (6 bits)
   These bits define the length of the Message Body portion of the block. The value is expressed in units of 4 bytes with 000000 meaning 4 bytes and 111111 meaning 256 bytes.
2) Msg Code (4 bits)
   The Msg Code is used to differentiate special messages from general user text messages. When set to 0000, the Message Body contains the set of ASCII characters to be displayed on the recipients display. When the code is set to any other value it is intended to be a message of a special purpose defined by the implementer of the CMRx message encoder/decoder. For example, a Msg Code value of 0005 can mean that the Message Body contains GIS barcode information, etc.
3) Message Body
   Interpretation of the message body is defined by the Message Length portion of the message body.

CMRx Ambiguity Windowing

As thus far described herein, CMRx provides methods to reduce the size of information sent over a communication link. Viewed from this perspective, CMRx is a form of data compression because it encodes data to reduce the bandwidth required for transmission of the data, as well as reduce the amount of storage required for the data. This allows one to send more data over already existing links (such as UHF and VHF frequencies already used by surveyors for GNSS RTK applications) or to use data links which otherwise may have been cost prohibitive. Reducing the bandwidth requirement for satellite data links, for example, reduces the cost to transmit data.

There are many potential approaches to data compression and CMRx employs a variety of techniques. CMRx gains significant reduction in the mount of data needed to be transmitted (i.e., data compression) by removing information that the recipient can calculate and add back on its own by using other information already known to the recipient. Ambiguity windowing is one of these quantities which the recipient can calculate and add to the received data to restore the original data intended to be communicated by the sender.

Herein, we will describe the ambiguity windowing concept as it relates to GNSS code phase observables. This technique, however, can be applied to communication of numerous other GNSS data entities. For example, this approach is also used in CMRx to send carrier observables, precise orbits, and precise clock data.

From a GNSS observation processing perspective, accurate determination of its position requires a GNSS station to know where a satellite was when it transmitted its signal. This allows the ground station to calculate the range to that satellite; i.e., (Time of Signal Receipt–Time of Transmit)*Speed of Light=Range to Satellite.

To enable this, GNSS satellites transmit orbital components (herein referred to as a "broadcast orbit") in its data messages. The recipient of this message can use this broadcast orbit to compute where a particular satellite is at a given time. Furthermore, while the clocks on board the satellites are very accurate, they are not perfect. The broadcast orbit information contains information that reasonably predicts the variations in the satellite clocks. Because of variations in the earth's gravity field, solar radiation pressure, and many other factors, satellite orbits are not perfectly predictable. Ground tracking stations throughout the globe constantly monitor GNSS satellites. Based on the tracking data, the ground control stations are able to formulate orbital parameters for the GNSS satellites. The orbital parameters have a limited validity period, beyond which the accuracy of the orbital prediction is compromised. As a result, ground control stations frequently uplink new broadcast orbit parameters. These new parameters are then rebroadcast by these satellites to users (i.e., these are the above mentioned "broadcast orbits").

The GPS broadcast orbit information contains two elements: Issue Of Data Ephemeris (IODE) and Time Of Ephemeris (TOE), that respectively identify the parameter sets and define the validity time of the orbital parameters. (Other GNSS use similar schemes in their orbit definitions.) The TOE is the reference time associated with all of the orbital parameters in the message. For nearly all GPS data processing, the orbital parameters are generally considered acceptable as long as they are used within +/−2 hours of the time associated with the observable data being processed. Of course, other orbital parameters also signal the health validity of these orbital parameters.

The IODE helps the receiver identify if there has been a change in the GPS orbital parameters. Each time the orbital parameters are updated, a new IODE number is assigned and broadcast to users. The IODE is a number designed so as to require few bits to communicate, but enough to enable a unique identification of the parameters over a short period. For example, IODE values in GPS require only 8 bits. It is known that a particular IODE value for a given GPS satellite will not repeat within the same day. (The publicly available GPS interface control and signal in space documents provide the exact time of uniqueness.) Herein we use phrases like "a change of IODE" to mean that for a given satellite, a new set of orbital parameters has been received by a GNSS receiver (and/or its processing software). Because there was a change in IODE, there is a change in the broadcast orbital parameters. In CMRx a new IODE signals a different set of orbital parameters.

As mentioned above, there are forces which tend to perturb the intended satellite orbit, and as such the broadcast orbit is intended to very closely represent the actual orbit only over a short period of time. This means that two adjacent (in time) broadcast orbits for a single satellite typically do not exactly predict the path (and other orbital elements such as clock variations). This effect is illustrated in an exaggerated depiction in FIG. 34.

Figure 34:
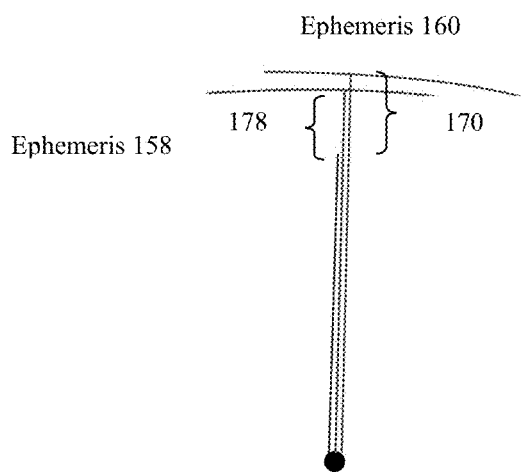
FIG. 34 depicts two broadcast orbits with arcs representing position and validity period.

When the broadcast orbit data changes, this range error will change. FIG. 34 illustrates two different broadcast orbits transmitted from a given satellite at two different times. The arcs shown illustrate the satellite positions which are calculated for a given satellite over its valid broadcast orbit period (∼+/−2 hours). Notice that the arcs are not aligned. This illustrates a potential problem when transitioning in processing from one set of broadcast orbits to another. Specifically, when one transitions from using one broadcast orbit to the next, there can be a jump in the position of the satellite, as illustrated in FIG. 34, discussed further below.

The Differential GNSS (DGNSS) technique is based on the concept of using one or more reference stations to generate corrections for satellite and atmospheric errors for a geographic region. The satellite and atmospheric DGNSS corrections are used by one or more rovers working within the vicinity of the reference station(s). The accuracy of the rover position solution is greatly improved by the application of the DGNSS corrections. Nearly all existing DGNSS "correction" services send out a correction based upon a certain satellite orbit, and therefore must specifically identify the ephemeris that was used.

Figure 33:
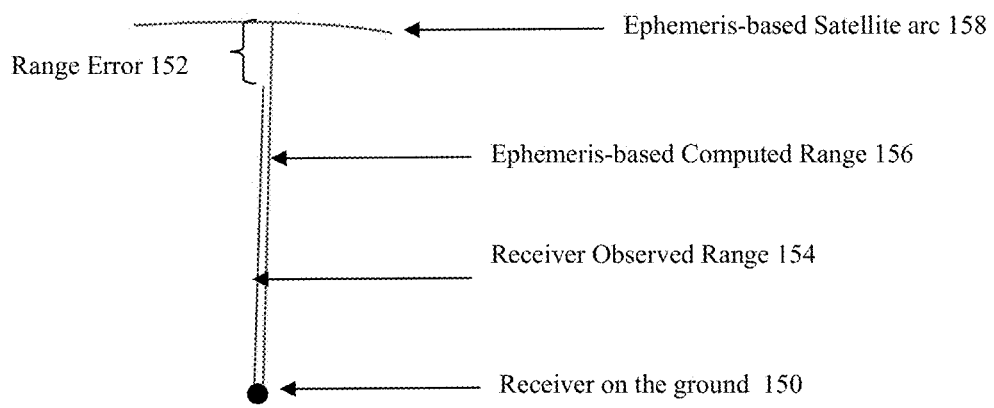
FIG. 33 illustrates code phase correction and range error.

Consider the code phase correction drawing illustrated in FIG. 33. The illustration in FIG. 33 is not to scale, but illustrates that a receiver on the ground 150 will have a range error 152 (greatly exaggerated) between the receiver observed range 154 and the ephemeris-based computed range 156. In a code phase correction, one knows the reference receiver position on the ground 150, knows the satellite position at any time based upon the ephemeris 158, and performs a range measurement 154. Because the reference receiver (i.e., the one sending the corrections) knows its position and it knows what time it was when it made a code phase observation, it then knows what the range to the satellite should have been (of course, accurate to the accuracies of the orbit, the accuracy of its own clock, and other such factors). We refer to this range as the ephemeris-based computed range 156. The difference between the computed range and the observed code phase is the "range error" 152. The range error can be transmitted to another receiver (or to processing software) which then uses the range error in the form of a correction, thereby removing a systematic error in the observations and thus improving the accuracy of the rover position estimates.

As shown by FIG. 34, it is possible for there to be more than one valid ephemeris at any given time. In FIG. 34, ephemeris 158 and ephemeris 160 are shown. The overlap between the two illustrates the point that different ephemeris can be valid at the same time. One cannot assume, for example, that because of blockages of the sky or other signal tracking issues that the sender and the recipient of DGNSS corrections will have the same broadcast orbit. This is important because if the recipient uses a different broadcast orbit than the sender of DGNSS corrections, then the corrected range measurements 170 and 178 will be in error by the difference between the two broadcast orbits. The only way for the recipient to use this type of correction is to know which ephemeris the sender used.

The IODE uniquely identifies orbits for a given period, and therefore the IODE is typically sent with the DGNSS correction values. The original reference station code phase observations can be completely reconstructed based on the DGNSS corrections plus:
  Knowledge of the reference station location;
  Ephemeris parameters for respective satellite(s); identified by a given IODE number.

The CMRx Ambiguity Window techniques described here enables GNSS data to be compressed and reconstructed, irrespective of the broadcast orbit IODE. To illustrate, consider FIG. 35.

Figure 35:
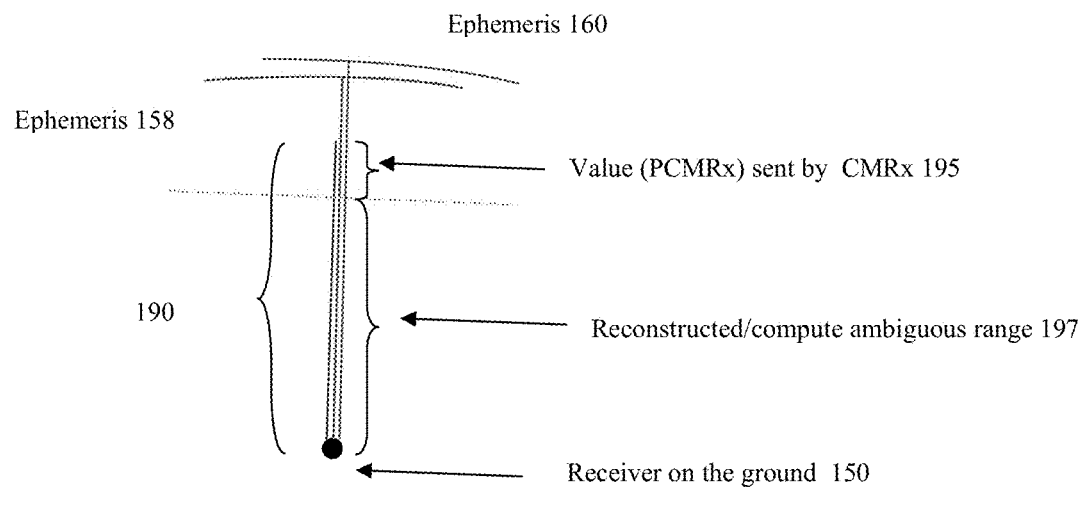
FIG. 35 illustrates range ambiguity.

FIG. 35, which also greatly exaggerates the errors, illustrates a receiver on the ground 150, which observes code phase measurement 190. With the CMRx ambiguity windowing method, both the sender and recipient compute the ambiguous range 197. This ambiguous range 197 will be the same even for different broadcast orbit parameters (e.g. arcs 158 and 160). The parameter 195 sent in CMRx is the receiver observed code phase 190 modulo "Ambiguity_Size" (described later).

The following example illustrates the formulation of the compressed code phase parameter (PCMRx) 195 that is sent in CMRx:
  PCMRx=PObs MOD Ambiguity_Size where:
  PCMRx is the value sent in the message;

PObs is the code phase observed by the GNSS receiver sending the message; and

Ambiguity_Size is a number described below.

There are various phenomenon that affect the receiver observed code phase (PObs). These include the ionosphere, troposphere, multipath, receiver noise, broadcast orbit inaccuracies and other environmental noise. Therefore, the Ambiguity_Size is chosen to include the worst case effects that the system is expected to operate under. As an example, below we assume an Ambiguity_Size of 500 meters is large enough to account for the sum of the worst case effects under which the system is still expected to operate.

To illustrate both the sending and recipient reconstruction under this technique assume there are three possible valid broadcast orbits for satellite #5 at a given instant and we have a sender desiring to send the code phase observable (assume the receiver observed a code phase value of 23192313.621 meters) for that satellite using this ambiguity window technique. Further assume that if the recipient were to compute the range from the receiver observing the code phase to each of the satellites (using these broadcast orbits) would result in the following (Note: we can do this because the sender and recipient know the position of the antenna of the receiver observing the data, what time it is, and the recipient has at least one of the broadcast orbits valid during this period):

SV #5 Ephemeris w/IODE #21: Predicted Range to SV is 23192281.421

SV #5 Ephemeris w/IODE #44: Predicted Range to SV is 23192279.872

SV #5 Ephemeris w/IODE #17: Predicted Range to SV is 23192383.121

The sender computes PCMRx as follows:

$$PCMRx = 23192313.621 \text{ MOD } 500.0$$
$$= 313.621$$

If the recipient only has SV #5 Ephemeris w/IODE #21 above, the recipient reconstructs the original code phase as follows:

Step 1: The predicted range to SV is 23192281.421
Step 2: Construct/compute ambiguous range
23192281.421/500.0 meters=46384.562842
Truncate 46384.562842=46384.0
46384.0*500.0=23192000
Step 3: Add received value (PCMRx) to reconstructed ambiguous range
23192000+313.621→23192313.621

If the recipient only has SV #5 Ephemeris w/IODE #44, the recipient reconstructs the original code phase as follows:

Step 1: Predicted Range to SV is 23192279.872
Step 2: Construct/compute ambiguous range
23192279.872/500.0 meters=46384.559744
Truncate 46384.559744=46384.0
46384.0*500.0=23192000
Step 3: Add received value (PCMRx) to reconstructed ambiguous range
23192000+313.621→23192313.621

Finally, if the recipient only has SV #5 Ephemeris w/IODE #17, the recipient reconstructs the original code phase as follows:

Step 1: Predicted Range to SV is 23192383.121
Step 2: Construct/compute ambiguous range
23192383.121/500.0 meters=46384.766242
Truncate 46384.766242=46384.0
46384.0*500.0=23192000
Step 3: Add received value (PCMRx) to reconstructed ambiguous range
23192000+313.621→23192313.621

As demonstrated, the CMRx ambiguity window method allows sending code phase information in a compressed manner and without the need for an accompanying IODE. Therefore, the data recipient is able to reconstruct the original code phase observable using any currently valid broadcast orbit.

The ambiguity window method can not only be used to 'compress' code observables, it can also be used to compress carrier observables, precise orbits, precise clocks, and many other GNSS quantities communicated from a sender to a recipient. The method relies upon the ambiguity size selected for the quantity to be transmitted. For example, if one were to send precise orbit and clock information for the purposes of correcting a broadcast orbit computed position/clock, one need only send the worst case expected deviation between broadcast orbits/clocks and precise orbits/clocks. Furthermore, there can be variations on this method employed in CMRx to gain further compression (achieved by reducing the size of the ambiguous portion).

In the earlier example, a 500 meter Ambiguity_Size was assumed to account for worst case ionospheric and tropospheric effects, as well as other errors. CMRx can reduce this size even further by removing the average ionosphere. To achieve this CMRx computes a weighted average vertical ionospheric value by mapping the ionosphere for each SV to the vertical (using a simple mapping function), computing a weighted average, and then mapping that back down to each SV (using the inverse of the simple mapping function) individually to remove that value for each SV. The average vertical ionosphere value removed, in this case, is also sent in the message. In addition CMRx can remove a quantity of the troposphere computed using industry accepted models. This reduces the maximum size of the value sent because fewer bits are required. The remaining size accounts for the other factors not addressed (such as multipath, receiver noise, and other environmental noise). The recipient then performs equivalent opposite processing to restore the observation back to its original form.

CMRx can gain additional data compression by use of a variable ambiguity window size. This variable window size can be used whether or not the modeled environmental data such as ionosphere and troposphere is removed. Because both the sender and the recipient know the position of the sender, and both have at least one valid broadcast orbit for the satellites of interest, the sender can construct an internal model of the observable data. Such models are typically available in almost all GNSS processing algorithms. Therefore, the sender can determine, e.g. the noise level of the observed data by comparing the raw observed data with the 'model' constructed using the broadcast orbit. Subtraction of the modeled value from the raw observable value yields a residual amount per satellite. This value—which is actually 'the observed value minus the computed value' (OMC) is then used to determine the window size.

CMRx, however, does not use the largest OMC by itself. Rather, the value chosen needs to account for the fact that the recipient may not have the same broadcast orbit that was used by the sender to create the data. The broadcast orbits, however, are all within a known accuracy of the precise satellite orbit, and this potential difference is accounted for in the ambiguity size. Thus, on the sender side the window size is adjusted to account for a worst case broadcast orbit error (which can be different per constellation of satellites), given that the sender and recipient may not be using the same orbit data, with an added safety margin. This OMC adjusted for potential broadcast orbit error together with the safety margin is then used to determine the ambiguity window size (arbitrarily stated to be 500 meters in the examples above). It is not necessary to send the actual ambiguity windows size itself. Instead this value can be mapped to a few bits using a look-up table. This allows the sender and the recipient to use the look-up table to determine the ambiguity window size. Thus the transmitted data can be understood by the recipient.

The preceding has been a detailed description of a communication system for enabling faster, reduced bandwidth, communication among GNSS enabled processing elements and apparatus. Although numerous details have been provided with regard to the specific implementation of the system, it will be appreciated that the scope of the invention is defined by the appended claims.

What is claimed is:

1. A method of communicating satellite observable information from a global navigation satellite system (GNSS), the method comprising:
    at a first GNSS device, determining a first value of a satellite observable for a satellite;
    at the first GNSS device, dividing the first value by a window size to obtain a first quotient and a first remainder value, wherein the window size is dynamically determined by the first GNSS device according to an estimated error of the first value; and
    transmitting the first remainder value and data indicative of the window size from the first GNSS device to a second GNSS device without transmitting the first quotient;
    at the second GNSS device, determining a second value of the satellite observable for the satellite;
    at the second GNSS device, dividing the second value by the window size to obtain a second quotient and a second remainder value; and
    at the second GNSS device, multiplying the second quotient by the window size and adding the first remainder value received from the first GNSS device to obtain the first value determined by the first GNSS device.

2. A method as in claim 1 wherein the first value and the second value comprise orbit data from the satellite.

3. A method as in claim 1 wherein the first value and the second value comprise position data of the satellite.

4. A method as in claim 1 wherein the first value and the second value comprise clock data from the satellite.

5. A method as in claim 1 wherein the first value and the second value comprise carrier phase data.

6. A method as in claim 1 wherein the first value and the second value comprise code phase data.

7. A method as in claim 1 further comprising, at the second GNSS device prior to dividing the second value by the window size, determining the window size according to the data indicative of the window size using a look-up table.

8. A method as in claim 1 further comprising, at the first GNSS device prior to dividing the first value by the window size, removing data relating to at least one of ionospheric correction or tropospheric correction from the first value.

9. A method as in claim 1 wherein the first remainder value and the data indicative of the window size are included in a message, and the message also includes:
    a first bit indicative of whether satellite position data is present in the message;
    a second bit indicative of whether satellite clock data is present in the message; and
    wherein the data indicative of the window size comprises a first set of bits defining the window size.

10. A method as in claim 9 wherein the message also includes a second set of bits defining a precision for the first value.

11. A method of communicating satellite observable information from a global navigation satellite system (GNSS), the method comprising, at a rover receiver:
    receiving a first remainder value and data indicative of a window size from a reference receiver, wherein the first remainder value is obtained by the reference receiver by dividing a first value of a satellite observable for a satellite by the window size, the first value determined by the reference receiver;
    determining a second value of the satellite observable for the satellite;
    dividing the second value by the window size to obtain a quotient and a second remainder value; and
    multiplying the quotient by the window size and adding the first remainder value to obtain the first value determined by the reference receiver.

12. A method as in claim 11 wherein the first value and the second value comprise orbit data from the satellite.

13. A method as in claim 11 wherein the first value and the second value comprise position data of the satellite.

14. A method as in claim 11 wherein the first value and the second value comprise clock data from the satellite.

15. A method as in claim 11 wherein the first value and the second value comprise carrier phase data.

16. A method as in claim 11 wherein the first value and the second value comprise code phase data.

17. A method as in claim 11 further comprising, prior to dividing the second value by the window size, determining the window size according to the data indicative of the window size using a look-up table.

18. A method as in claim 11 wherein data relating to at least one of ionospheric correction or tropospheric correction is removed from the first value prior to being divided by the window size.

19. A method as in claim 11 wherein the first remainder value and the data indicative of the window size are included in a message, and the message also includes:
    a first bit indicative of whether satellite position data is present in the message;
    a second bit indicative of whether satellite clock data is present in the message; and
    wherein the data indicative of the window size comprises a first set of bits defining the window size.

20. A method as in claim 19 wherein the message also includes a second set of bits defining a precision for the first value.

21. A method as in claim 11, wherein the window size is dynamically determined by the reference receiver according to an estimated error of the first value.

* * * * *